United States Patent
Abe et al.

(10) Patent No.: US 8,339,488 B2
(45) Date of Patent: Dec. 25, 2012

(54) SOLID-STATE IMAGE PICKUP DEVICE HAVING LAMINATED COLOR FILTERS, MANUFACTURING METHOD THEREOF, AND ELECTRONIC APPARATUS INCORPORATING SAME

(75) Inventors: Takashi Abe, Kanagawa (JP); Tetsuya Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 322 days.

(21) Appl. No.: 12/778,298

(22) Filed: May 12, 2010

(65) Prior Publication Data
US 2010/0302417 A1 Dec. 2, 2010

(30) Foreign Application Priority Data
Jun. 2, 2009 (JP) ................... 2009-132743

(51) Int. Cl.
*H04N 9/083* (2006.01)
*H01L 21/00* (2006.01)
(52) U.S. Cl. .......................... 348/274; 438/70
(58) Field of Classification Search .................. 348/273, 348/274, 280, 281, 308; 438/70
See application file for complete search history.

(56) References Cited

U.S. PATENT DOCUMENTS

| | | | | |
|---|---|---|---|---|
| 6,008,843 A * | 12/1999 | Yu | | 348/274 |
| 6,590,239 B2 * | 7/2003 | Hsiung et al. | | 257/233 |
| 7,259,789 B1 * | 8/2007 | Endo et al. | | 348/274 |
| 7,295,235 B2 * | 11/2007 | Hirayama et al. | | 348/274 |
| 7,605,354 B2 * | 10/2009 | Koyama | | 250/208.1 |
| 7,675,024 B2 * | 3/2010 | Lenchenkov | | 250/226 |
| 7,777,795 B2 * | 8/2010 | Hirayama et al. | | 348/272 |
| 7,800,716 B2 * | 9/2010 | Ishibe | | 349/106 |
| 8,134,633 B2 * | 3/2012 | Watanabe | | 348/335 |
| 2004/0070039 A1 * | 4/2004 | Sekine et al. | | 257/428 |
| 2004/0105022 A1 * | 6/2004 | Hirayama et al. | | 348/272 |
| 2005/0285956 A1 * | 12/2005 | Wagner et al. | | 348/272 |
| 2006/0076591 A1 * | 4/2006 | Sekine et al. | | 257/294 |
| 2009/0230490 A1 * | 9/2009 | Yokozawa | | 257/432 |
| 2010/0066876 A1 * | 3/2010 | Kurihara | | 348/273 |
| 2011/0019041 A1 * | 1/2011 | Ishiwata et al. | | 348/280 |
| 2011/0058075 A1 * | 3/2011 | Yanagita et al. | | 348/273 |

FOREIGN PATENT DOCUMENTS

| | | | | |
|---|---|---|---|---|
| JP | 10209415 A | * | 8/1998 | |
| JP | 11150252 A | * | 6/1999 | |
| JP | 2000-156485 | | 6/2000 | |
| JP | 2003234186 A | * | 8/2003 | |
| JP | 2004-172950 | | 6/2004 | |
| JP | 2006-054276 | | 2/2006 | |
| JP | 2006-157953 | | 6/2006 | |
| JP | 2006-211630 | | 8/2006 | |
| JP | 2008-112944 | | 5/2008 | |
| JP | 2008-205940 | | 9/2008 | |
| JP | 2011029379 A | * | 2/2011 | |

* cited by examiner

*Primary Examiner* — John Villecco
(74) *Attorney, Agent, or Firm* — SNR Denton US LLP

(57) ABSTRACT

A solid-state image pickup device includes photoelectric conversion parts formed on an image pickup surface of a substrate, where each photoelectric conversion part generates a signal charge by receiving incident light on a light reception surface thereof, and color filters formed on an image-pickup surface of the substrate, where each color filter allows the incident light to be colored by passing through. The photoelectric conversion parts are aligned in first and second directions and include first to third color filters. A surface on which the first color filter and the second color filter are laminated in the first direction is larger than a surface on which the first color filter and the third color filter are laminated in the second direction.

16 Claims, 31 Drawing Sheets

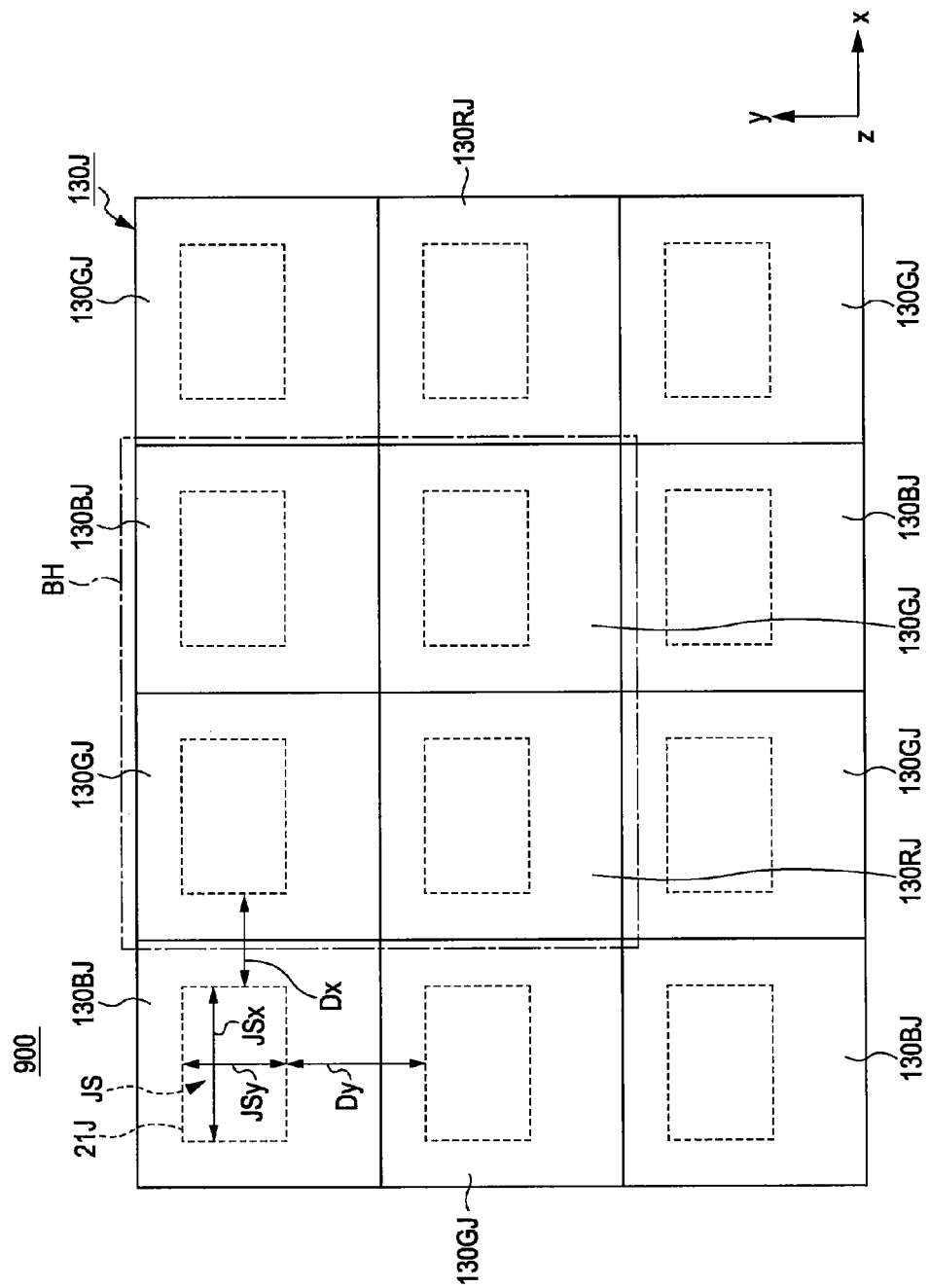
FIG. 33 - PRIOR ART

SOLID-STATE IMAGE PICKUP DEVICE HAVING LAMINATED COLOR FILTERS, MANUFACTURING METHOD THEREOF, AND ELECTRONIC APPARATUS INCORPORATING SAME

BACKGROUND OF THE INVENTION

1. Field of the Invention

The present invention relates to a solid-state image pickup device and a manufacturing method thereof, and an electronic apparatus.

2. Description of the Related Art

An electronic apparatus, such as a digital video camera or a digital still camera, contains a solid-state image pickup device. Examples of the solid-stage imaging device include a CMOS (Complementary Metal Oxide Semiconductor) type image sensor and a CCD (Charge Coupled Device) type image sensor.

In the solid-state image pickup device, an image-pickup region with pixels is formed on the surface of a semiconductor substrate. The pixels are provided with their respective photoelectric conversion parts. The photoelectric conversion part includes a photodiode or the like that receives light, which is incident via an external optical system, on its light reception surface and photoelectrically converts the light into a signal charge.

In the solid-state image pickup device, for example, an on-chip lens is arranged above the photoelectric conversion part. An arrangement of an inner-layer lens between the photoelectric conversion part and the on-chip lens has been proposed. The inner-layer lens is provided for efficiently irradiating the light incident via the on-chip lens to the photoelectric conversion part (see, for example, Japanese Published Patent Application No. 2008-112944).

The solid-state image pickup device is provided with a color filter for capturing a color image. The color filter includes, for example, filters of three primary colors in Bayer arrangement. Alternatively, in stead of a green filter in a Bayer arrangement, the arrangement of a transparent filter through which white light passes has been proposed to improve the sensitivity of the device. Also, the inclination of the Bayer arrangement at 45 degrees has been also proposed (see, for example, Japanese Published Patent Application Nos. 2000-156485, 2006-211630, and 2008-205940).

In the CMOS image sensor among the solid-state image pickup devices, a pixel is designed to include a plurality of transistors as well as a photoelectric conversion part. Such a plurality of transistors is configured as a pixel transistor group for reading a signal charge generated from the photoelectric conversion part and outputting it as an electric signal to a signal line. A plurality of lines is electrically connected to a plurality of transistors of the pixel transistor group. Thus, to reduce the size of each pixel, there is proposed a pixel configuration in which a plurality of photoelectric conversion parts shares the above pixel transistors. For example, a technology for allowing two or four photoelectric conversion parts to share one pixel transistor group (see, for example, Japanese Published Patent Application Nos. 2004-172950, 2006-157953, 2006-54276).

SUMMARY OF THE INVENTION

FIG. 33 is a top view of a CMOS image sensor 900. The COMS image sensor 900 includes red filters 130RG, green filters 130GJ, and blue filters 130BJ which are arranged in a Bayer arrangement BH as shown in FIG. 33. The filters of three primary colors, 130RJ, 130GJ, and 130BJ, are respectively formed in a square shape. In the CMOS image sensor 900, as shown in FIG. 33, photoelectric conversion parts 21J are formed below their respective filters of three primary colors, 130RJ, 130GJ, and 130BJ. In the above CMOS image sensor 900, incident light passes through any of the filters of three primary colors, 130RJ, 130GJ, and 130BJ, and the colored light is then received by the light reception surface JS of photoelectric conversion part 21J.

However, if the incident light is significantly inclined in the z direction perpendicular to the light reception surface JS of the photoelectric conversion part 21J, the light may not be incident on this light reception surface JS but on another light reception surface JS provided for the reception of light colored with different color.

Therefore, so-called "color mixing" may occur and result in a difference in color tones on the captured color image, resulting in a decrease in image quality. For example, such a disadvantage may occur due to variations in angle of a principal ray received by the pixel depending on the position of an image-pickup region.

In addition, when the distance from color filter 130J to acceptance surface JS of photoelectric conversion part 21J is long, the same fault as this may arise.

As described above, in the CMOS image sensor 900, the pixel also includes a plurality of transistors (not shown) in addition to the photoelectric conversion parts 21J and wiring lines (not shown) connected to the plurality of transistors. Therefore, as shown in FIG. 33, the light reception surface JS of the photoelectric conversion part 21J is formed on a region other than the regions on which the plurality of transistors and wiring lines are formed. Thus, the light reception surface JS of the photoelectric conversion part 21J has a surface area smaller than that of each of the three-primary color filters, 130RJ, 130GJ, and 130BJ and is formed in a rectangular shape. Then, as shown in FIG. 33, the distance Dx between the light reception surfaces JS aligned in the horizontal direction x is smaller than the distance Dy between the light reception surfaces JS aligned in the vertical direction y. In other words, the light reception surfaces JS are anisotropic in the vertical and horizontal directions and the distances between the light reception surfaces JS are also anisotropic in the vertical and horizontal directions.

Therefore, the generation of the above "color mixing" is also anisotropic in the vertical and horizontal directions, so that a disadvantage of a decrease in image quality due to the generation of color tone difference may be actualized.

As shown in FIG. 33, the distance Dx between the light reception surfaces JS aligned in the horizontal direction x is smaller than the distance Dy between the light reception surfaces JS aligned in the vertical direction Dy. In this case, therefore, the pixel tends to receive the incident light for another adjacent pixel in the horizontal direction x rather than the vertical direction y, so that "color mixing" can occur remarkably. Therefore, as described above, the generation of anisotropy of "color mixing" may lead to a decrease in image quality.

In the solid-state image pickup device, since the sensitivity difference occurs between the center portion and the peripheral portion of the image-pickup region, a decrease in image quality may occur.

Specifically, the angle of principal ray incident on the center portion of the image-pickup region via an external optical system is substantially vertical to the light reception surface but inclined with respect to the peripheral portion of the image-pickup region. Therefore, the captured image may become an image with a bright center portion and a dark peripheral portion. Thus, a decrease in image quality may occur. In other words, a shading phenomenon may occur and the image quality may decrease.

As described above, the solid-state image pickup device may be difficult in increase of color image quality.

Therefore, it has been desired to provide a solid-state image pickup device which can improve the imaging quality of a color image and a method for manufacturing the same, and an electronic apparatus using such a solid-state image pickup device.

An embodiment of the present invention is a solid-state image pickup device that includes: photoelectric conversion parts formed on an image pickup surface of a substrate, where each photoelectric conversion part generates a signal charge by receiving incident light on a light reception surface thereof; and color filters formed on the image-pickup surface of the substrate, where each color filter allows the incident light to be colored by passing through. The photoelectric conversion parts include a plurality of photoelectric conversion parts being arranged in a first direction on the image pickup surface and a plurality of photoelectric conversion parts being arranged in second direction opposite to the first direction on the image pickup surface. The distance between the light reception surfaces of the plurality of photoelectric conversion parts in the second direction is higher than that of the plurality of photoelectric conversion parts in the first direction. The color filter includes at least a first color filter, a second color filter, and a third color filter. The first color filter is formed above the light reception surface, and the optical transmittance thereof is high at a first wavelength range. The second color layer is formed above the light reception surface. The second color layer is placed next to the first color filter in the first direction, and the optical transmittance thereof is high at a second wavelength range which is different from that of the first wavelength range. The third color filter is formed above the light reception surface. The third color filter is placed next to the first color filter in the second direction. The optical transmittance of the third color filter is high at a third wavelength range which is different from that of each of the first and second wavelength ranges. A surface on which the first color filter and the second color filter are laminated is larger than a surface on which the first color filter and the third color filter are laminated.

An embodiment of the present invention is a solid-state image pickup device that includes: photoelectric conversion parts formed on an image pickup surface of a substrate, where each photoelectric conversion part generates a signal charge by receiving incident light on a light reception surface thereof; and color filters formed above the respective light reception surfaces on the image-pickup surface of the substrate, where each color filter allows the incident light to be colored by passing through. The photoelectric conversion parts include a plurality of photoelectric conversion parts being arranged in a first direction on the image pickup surface and a plurality of photoelectric conversion parts being arranged in second direction perpendicular to the first direction on the image pickup surface. The color filter includes at least a first color filter, a second color filter, and a third color filter. The first color filter is formed above the light reception surface, and the optical transmittance thereof is high at a first wavelength range. The second color filter is formed above the light reception surface and placed next to the first color filter in the first direction, and the optical transmittance thereof is high at a second wavelength range which is different from that of the first wavelength range. The third color filter is formed above the light reception surface and placed next to the first color filter in the second direction. The optical transmittance of the third color filter is high at a third wavelength range which is different from that of each of the first and second wavelength ranges. Each of the first to third color filters has a square portion on a surface facing to the light reception surface. A plurality of the first color filters is arranged in a checkered pattern in the diagonal direction inclined with respect to the first direction and the second direction on the image pickup surface. The plurality of the first color filters aligned in the diagonal direction is placed adjacent to the respective second or third color filters in the above first direction and in the above second direction. At the corners of the plurality of the first color filters, the plurality of the first color filters includes at least portions which can be overlapped and connected to at least one of the second color filter and the third color filter.

An embodiment of the present invention is an electronic apparatus that includes photoelectric conversion parts formed on an image pickup surface of a substrate, where each photoelectric conversion part generates a signal charge by receiving incident light on a light reception surface thereof; and color filters formed on the image-pickup surface of the substrate, where each color filter allows the incident light to be colored by passing through. The photoelectric conversion parts include a plurality of photoelectric conversion parts being arranged in a first direction on the image pickup surface and a plurality of photoelectric conversion parts being arranged in second direction opposite to the first direction on the image pickup surface. The distance between the light reception surfaces of the plurality of photoelectric conversion parts in the second direction is higher than that of the plurality of photoelectric conversion partition the first direction. The color filter includes at least a first color filter, a second color filter, and a third color filter. The first color filter is formed above the light reception surface, and the optical transmittance thereof is high at a first wavelength range. The second color filter is formed above the light reception surface and placed next to the first color filter in the first direction, and the optical transmittance thereof is high at a second wavelength range which is different from that of the first wavelength range. The third color filter is formed above the light reception surface and placed next to the first color filter in the second direction. The optical transmittance of the third color filter is high at a third wavelength range which is different from that of each of the first and second wavelength ranges. A surface on which the first color filter and the second color filter are laminated in the first direction is larger than a surface on which the first color filter and the third color filter are laminated in the second direction.

An embodiment of the present invention is a method of manufacturing a solid-state image pickup device that includes the steps of: forming a photoelectric conversion part, which generates a signal charge by receiving incident light on a light reception surface, on the image-pickup surface; and forming a color filter, which colors the incident light and passes the colored light to the light reception surface, on the image-pickup surface of the substrate. In the step of forming the photoelectric conversion part, the photoelectric conversion part is formed as follows: A plurality of photoelectric conversion parts is arranged in a first direction on the image pickup surface and a plurality of photoelectric conversion parts is arranged in second direction opposite to the first direction on the image pickup surface. The distance between the light reception surfaces of the plurality of photoelectric conversion parts in the second direction is higher than that of the plurality of photoelectric conversion parts in the first direction. The step of forming the color filter includes at least the sub-steps of: forming a first color filter having a high optical transmittance at a first wavelength range above the light reception surface; forming a second color filter having a high optical transmittance at a second wavelength range which is different from the first wavelength range above the light reception surface so that the first color filter is arranged adjacent to the first color filter in the first direction; and forming a third color filter having a high optical transmittance at a third wavelength range which is different from the first and second wavelength ranges so that the third color filter is arranged adjacent to the first color filter in the second direction.

The first, second, and third color filters are formed so that a surface on which the first color filter and the second color filter are laminated in the first direction is larger than a surface on which the first color filter and the third color filter are laminated in the second direction.

In any of the embodiments of the present invention, each part is formed so that a surface on which the first color filter and the second color filter are laminated is larger than a surface on which the first color filter and the third color filter are laminated. In addition, at the corners of the plurality of the first color filters, the plurality of the first color filters include at least portions which can be overlapped and connected to at least one of the second color filter and the third color filter.

According to any of the embodiments of the present invention, a solid-state image pickup device and a method for manufacturing the same, and an electronic apparatus using such a solid-state image pickup device, which can improve the imaging quality of a captured image, can be provided.

BRIEF DESCRIPTION OF THE DRAWINGS

FIG. 4 is a timing chart illustrating pulse signals to be supplied to the respective parts when a signal id read from pixel P, wherein FIG. 4A represents a selection signal, FIG. 4B represents a reset signal, and FIG. 4C represents a transfer signal;

FIG. 33 is a top view of a CMOS image sensor 900.

DESCRIPTION OF THE PREFERRED EMBODIMENTS

Hereafter, the embodiments of the present invention will be described with reference to the attached drawings.

The embodiments will be described in the following order:
1. Embodiment 1 (red and blue filters are square-shaped)
2. Embodiment 2 (green filter is square-shaped)
3. Embodiment 3 (red, green, and blue filters are square-shaped)
4. Embodiment 4 (green filter overlaps red and blue filters in an oblique direction)
5. Embodiment 5 (green filter overlaps red and blue filters in an oblique direction)
6. Embodiment 6 (different film shapes in center and peripheral portions of image-pickup region)
7. Others

1. Embodiment 1

(A) Configuration of Device (A1) Configuration of Main Part of Camera

Figure 1:
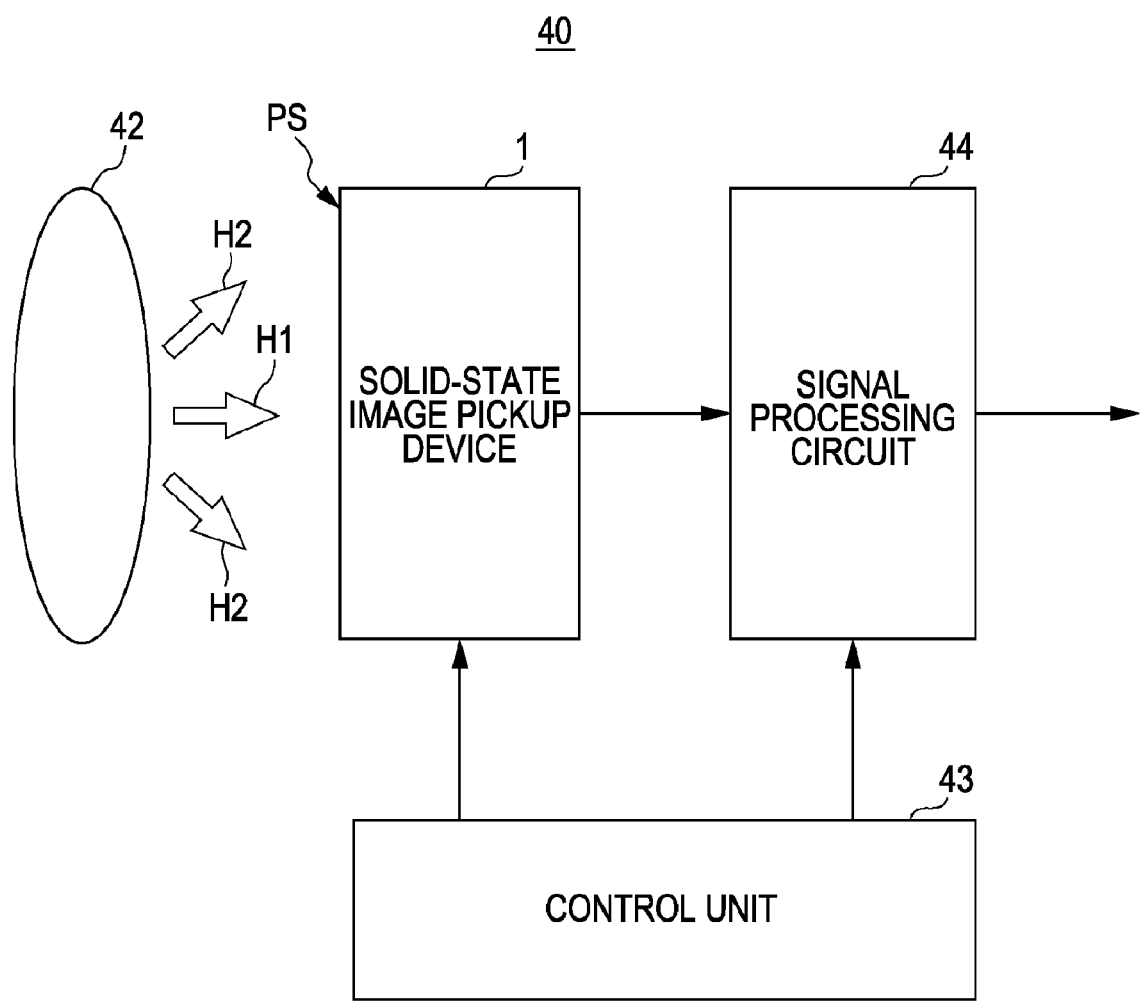
FIG. 1 is a diagram illustrating the configuration of a camera 40 according to a first embodiment of the present invention.

FIG. 1 is a diagram illustrating the configuration of a camera according to Embodiment 1 of the present invention.

As shown in FIG. 1, a camera 40 includes a solid-state image pickup device 1, an optical system 42, a control unit 43, and a signal-processing circuit 44. The structural components will be described in order.

The solid-state image pickup device 1 receives light (subject image), on its image-pickup surface PS and the received light is then photoelectrically converted into a signal charge. Here, the solid-state image pickup device 1 is driven based on a control signal outputted from control unit 43. Specifically, the solid-state imaging device 1 reads signal charge and outputs it as raw data. In the solid-state image pickup device 1 of the present invention, as shown in FIG. 1, principal ray H1 output from the optical system is incident at right angle to the center portion of the image-pickup surface PS. In contrast, on the peripheral portion of the image-pickup surface PS, principal ray H2 is incident at a certain angle of inclination with respect to the direction perpendicular to the image-pickup surface PS of the solid-state image pickup device 1.

The optical system 42 includes optical members, such as an imaging lens and an aperture, and is arranged so that light H from a subject image to be incident can be condensed to the image-pickup surface PS of the solid-state image pickup device 1.

In this embodiment, the optical system 42 is arranged so that the optical axis thereof can correspond to the center of the image pickup surface PS. Thus, to the center portion of the image-pickup surface PS of the solid-state image pickup device 1, the optical system 42 outputs the principal ray H1 at right angle with respect to the image-pickup surface as shown in FIG. 1. In contrast, on the peripheral portion of the image-pickup surface PS, the optical system 42 outputs principal rays H2 at a certain angle of inclination with respect to the direction perpendicular to the image-pickup surface PS of the solid-state image pickup device 1. Such a phenomenon is due to the finite exit pupil distance formed by the aperture.

The control unit 43 is provided for outputting various kinds of control signals to the solid-state image pickup device 1 and the signal processing circuit 44, thereby controlling and driving them.

The control processing circuit 44 performs signal processing on raw data output from the solid-state image pickup device 1 and generates a digital image with respect to the subject image.

(A2) Main Part Configuration of Solid-State Image Pickup Apparatus

The entire configuration of the solid-state image pickup apparatus will be described.

Figure 2:
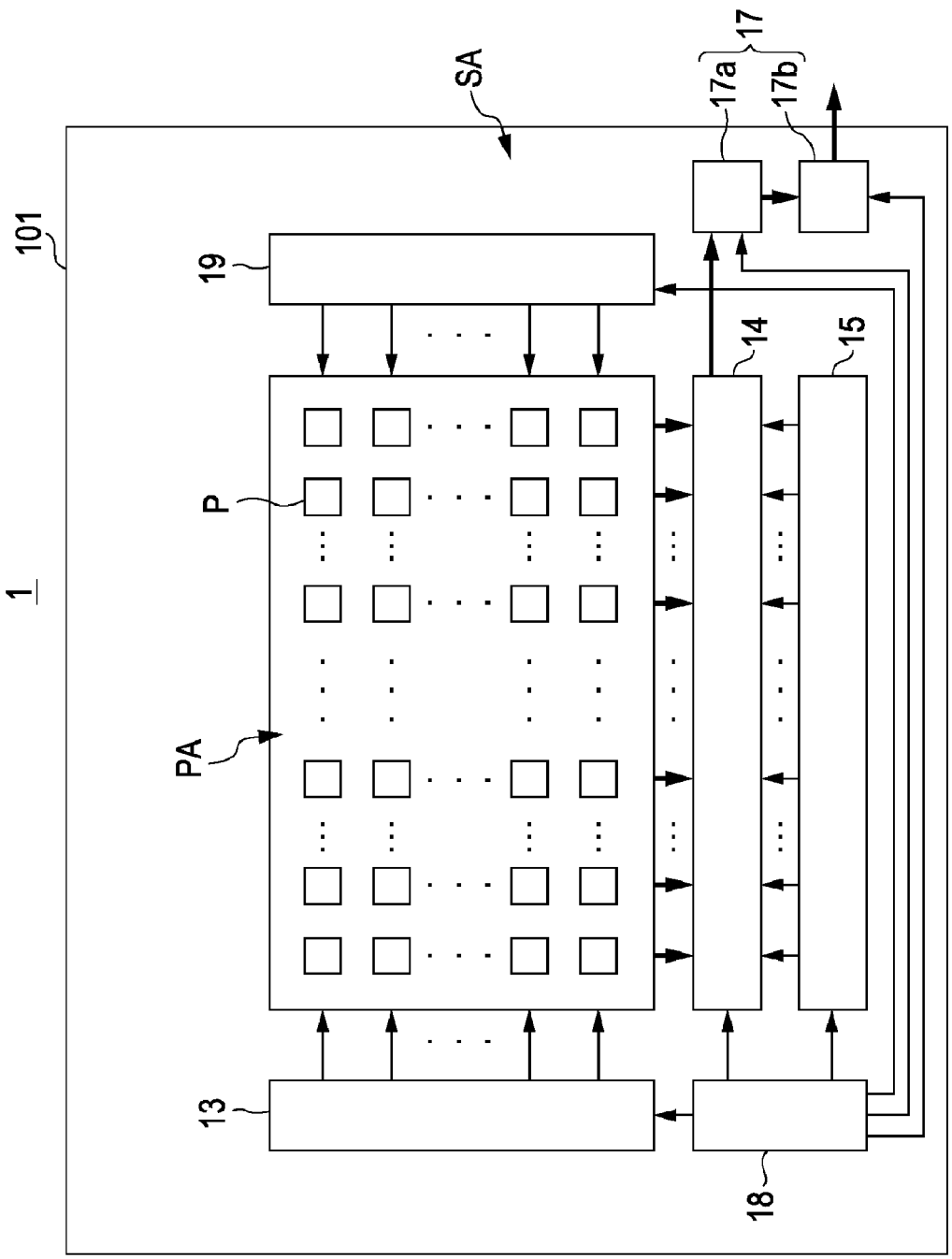
FIG. 2 is a block diagram illustrating the entire configuration of a solid-state imaging device 1 according to the first embodiment of the present invention.
Figure 3:
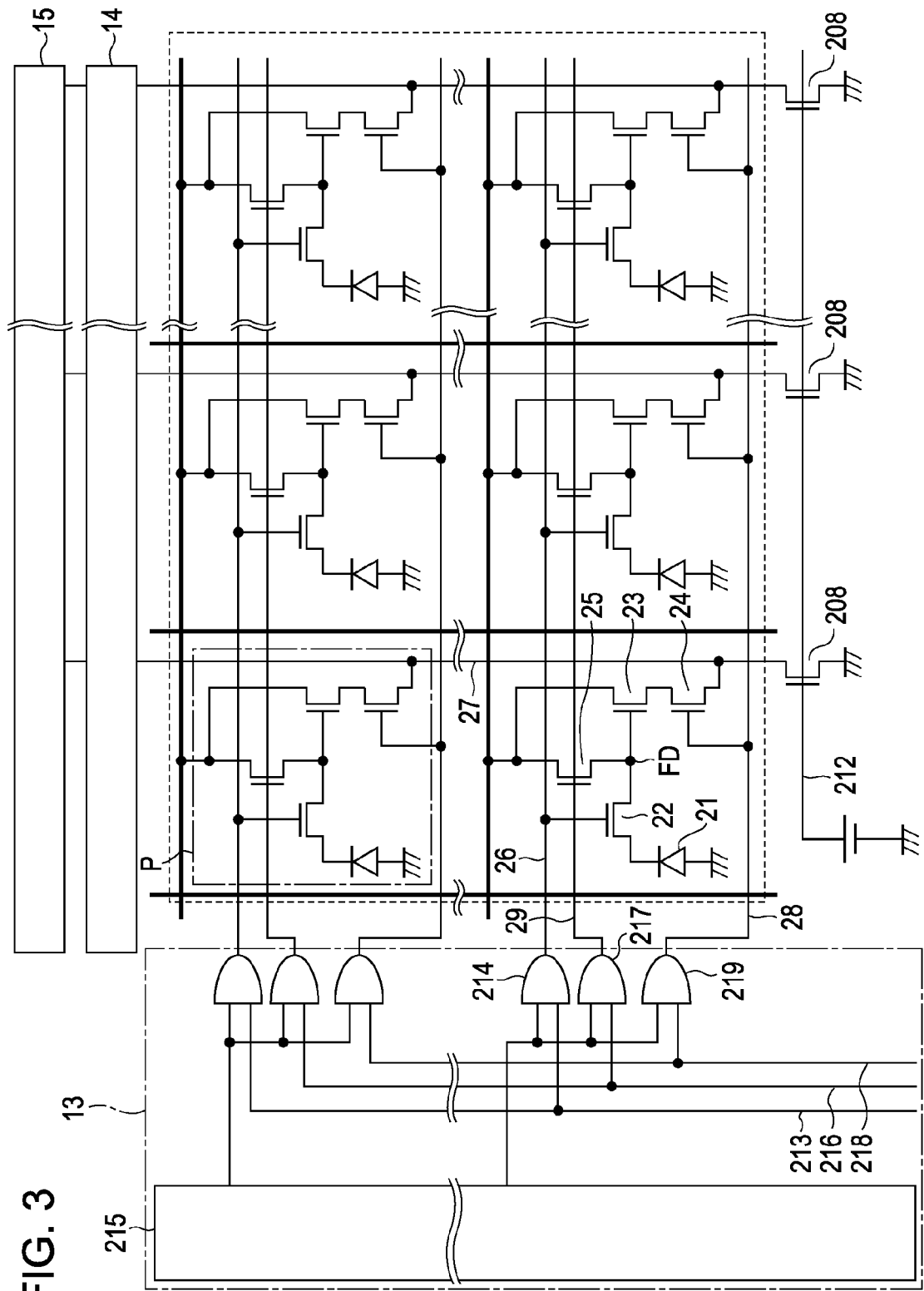
FIG. 3 is a diagram illustrating the main part of the circuit configuration of the solid-state image pickup device 1 according to the first embodiment of the present invention.

FIG. 2 is a block diagram illustrating the entire configuration of a solid-state imaging device 1 according to the first embodiment of the present invention. FIG. 3 is a diagram illustrating the main part of the circuit configuration of the solid-state image pickup device 1 according to the first embodiment of the present invention. The solid-state image pickup device 1 of the present embodiment is a CMOS image sensor having a substrate 101 as shown in FIG. 2. For example, the substrate 101 is a semiconductor substrate made of silicon. As shown in FIG. 2, an image-pickup region PA and a peripheral region SA are formed on the surface of the substrate 101.

As shown FIG. 2, the image-pickup region PA is of a rectangular shape and a plurality of pixels P is arranged in the horizontal direction x and the vertical direction y. In other words, the pixels P are arranged in matrix form. In the image pickup area PA, the center thereof is arranged so as to correspond to the optical axis of the optical system 42 shown in FIG. 1.

This image-pickup region PA is equivalent to the image-pickup surface PS shown in FIG. 1. Thus, as described above, the principal ray (H1 in FIG. 1) is incident on the pixels P arranged on the center portion of the image-pickup region PA at right angle to the surface of the image-pickup region PA. On the other hand, the principal ray (H2 in FIG. 1) is incident on the pixels P arranged on the center portion of the image-pickup region PA at a certain angle of inclination with respect to the surface of the image-pickup region PA.

The pixel P on the image-pickup region PA includes, as shown in FIG. 3, a photodiode 21, a transfer transistor 22, an amplification transistor 23, a selection transistor 24, and a reset transistor 25. In other words, the pixel P includes the photodiode 21 and the pixel transistors for reading out a signal charge from the photodiode 21. In the pixel P, the photodiode 21 receives light from the subject image and the received light is then photoelectrically converted to generate and accumulate signal charges. As shown in FIG. 3, the photodiode 21 is connected to the gate of the amplification transistor 23 via the transfer transistor 22. Then, the transfer transistor 22 transmits the signal charges accumulated in the photodiode 21 as output signals to a floating diffusion FD connected to the gate of the amplification transistor 23.

In other words, in the pixel P, the transfer transistor 22 outputs a signal charge generated from the photodiode 21 as an electric signal to the gate of the amplification transistor 23. Specifically, as shown in FIG. 3, the transfer transistor 22 is arranged between the photodiode 21 and the floating diffusion FD. Then, the transfer transistor 22 receives a transfer signal from a transfer line 26 on its gate and then transfers a signal charge accumulated in the photodiode 21 as an output signal to the floating fusion FD.

In the pixel P, the amplification transistor 23 amplifies an electric signal output from the transfer transistor 22 and then outputs the amplified signal therefrom. Specifically, as shown in FIG. 3, the gate of the amplification transistor 23 is connected to the floating diffusion FD. In addition, the drain of the amplification transistor 23 is connected to a voltage power supply line Vdd and the source thereof is connected to the selection transistor 24. If the selection transistor 24 is selected so as to become an ON state, then the amplifier transistor 23 receives the supply of constant current from a constant current source (not shown) installed in a region other than the image-pickup region PA and acts as a source follower. Therefore, the amplification transistor 23 amplifies an output signal from the floating diffusion FD in response to the supply of the selection signal to the selection transistor 24.

In the pixel P, the selection transistor 24 outputs the electric signal received from the amplification transistor 23 to a vertical signal line 27 when the selection signal is input into the selection transistor 24. Specifically, as shown in FIG. 3, the gate of the selection transistor 24 is connected to an address line 28 to which the election signal is supplied. The selection transistor 24 becomes an ON state when the selection signal is supplied and then outputs the output signal amplified by the amplification transistor 23 to the vertical signal line 27 as described above.

In the pixel P, the reset transistor 25 resets the gate potential of the amplification transistor 23. Specifically, as shown in FIG. 3, the gate of the reset transistor 25 is connected to a reset line 29 to which a reset signal is supplied. Furthermore, the drain of the reset transistor 25 is connected to the voltage power supply line Vdd and the source thereof is connected to the floating diffusion FD. Then, when the reset signal is supplied to the gate of the reset transistor 25 from the reset line 29, the gate potential of the amplification transistor 23 is reset to the power source supply via the floating diffusion FD.

As shown in FIG. 2, the peripheral region SA is located around the image-pickup region PA. In addition, a peripheral circuit is formed on the peripheral region SA.

Specifically, as shown in FIG. 2, the peripheral circuit includes a vertical drive circuit 13, a column circuit 14, a horizontal drive circuit 15, an external output circuit 17, a timing generator (TG) 18, and a shutter driving circuit 19.

The vertical drive circuit 13, as shown in FIG. 2, is formed on the peripheral region SA adjacent to the side of the image-pickup region PA and selectively drives the pixels P of the image-pickup region PA on the basis of line. Specifically, as shown in FIG. 3, the vertical drive circuit 13 includes a vertical selection device 215. In addition, a first line selection AND terminal 214, a second line selection AND terminal 217, and a third line selection AND terminal 219 are formed in plural so as to correspond to the lines of the pixels P.

In the vertical drive circuit 13, for example, the vertical selection device 215 includes a shift register and is electrically connected to the first line selection AND terminal 214, the second line selection AND terminal 217, and the third line selection AND terminal 219. The vertical selection device 215 outputs control signals to the first line selection AND terminal 214, the second line selection AND terminal 217, and the third line selection AND terminal 219 to selectively drive the respective lines of the pixels P in a successive manner.

In the vertical drive circuit 13, as shown in FIG. 3, one input end of the first line selection AND terminal 214 is connected to the vertical selection device 215. Then, the other input end of the first line selection AND terminal 214 is connected to the pulse terminal 213 that supplies a transfer signal. Then, the output end of the first line selection AND terminal 214 is connected to the transfer line 26.

In the vertical drive circuit 13, as shown in FIG. 3, one input terminal of the second line selection AND terminal 217 is connected to the vertical selection device 215. Then, the other input terminal of the second line selection AND terminal 217 is connected to the pulse terminal 216 that supplies a reset signal. Then, the output terminal of the second line selection AND terminal 217 is connected to the reset line 29.

In the vertical drive circuit 13, as shown in FIG. 3, one input end of the third line selection AND terminal 219 is connected to the vertical selection device 215. Then, the other input end of the third line selection AND terminal 219 is connected to the pulse terminal 218 that supplies a selection signal. Then, the output end of the third line selection AND terminal 219 is connected to the address line 28.

The column drive circuit 14, as shown in FIG. 2, is formed on the peripheral region SA adjacent to the lower end of the image-pickup region PA and performs signal processing with respect to signals from the pixels P on the basis of column. The column drive circuit 14, as shown in FIG. 3, is electrically connected to the vertical signal line 27 and performs signal processing with respect to signals output from the pixels P via the vertical signal line 27. Here, the column circuit 14 includes a CDS (Correlated Double Sampling; correlation double sampling) circuit (not shown) ad performs signal processing of removing a fixed pattern noise.

For example, the horizontal drive circuit 15 is electrically connected to the column circuit 14. The horizontal drive circuit 15 includes, for example, a shift resister to output signals retained every column of the pixels P in the column circuit 14 to the external output circuit 17.

The external output circuit 17, as shown in FIG. 2, is electrically connected to the column circuit 14 and performs signal processing on the signal output from the column circuit 14, followed by outputting to the outside. The eternal output circuit 17 includes an AGC (Automatic Gain Control) circuit 17a and an ADC circuit 17b. In the external output circuit 17, after the AGC circuit 17a applies a gain to a signal, the ADC circuit 17b converts a digital signal from an analog signal and then outputs the signal to the outside.

The timing generator 18, as shown in FIG. 2, is electrically connected to a vertical drive circuit 13, a column circuit 14, a horizontal drive circuit 15, an external output circuit 17, and a shutter driving circuit 19, respectively. The timing generator 18 outputs various kinds of timing signal to the vertical drive circuit 13, the column circuit 14, the horizontal drive circuit 15, the external output circuit 17, and the shutter driving circuit 19 to control the driving operation of each of these components. The shutter drive circuit 19 selects the pixels P per line and adjusts the exposure time in the pixels P.

In addition to the above, to correspond to a plurality of vertical signal lines 27, the peripheral region SA includes a plurality of transistors 208 for supplying constant current to the vertical signal lines 27. The gate of the transistor 208 is connected to a constant-voltage supply line 212 and a constant potential is then applied to the gate thereof from the constant-voltage supply line 212, thereby being operated to supply a constant current. The transistor 208 supplies a constant current to the amplification transistor 23 of the selected pixel and acts it as a source follower. Therefore, the vertical signal line 27 represents a potential with a certain voltage difference with the potential of the amplification transistor 23.

Figure 4:
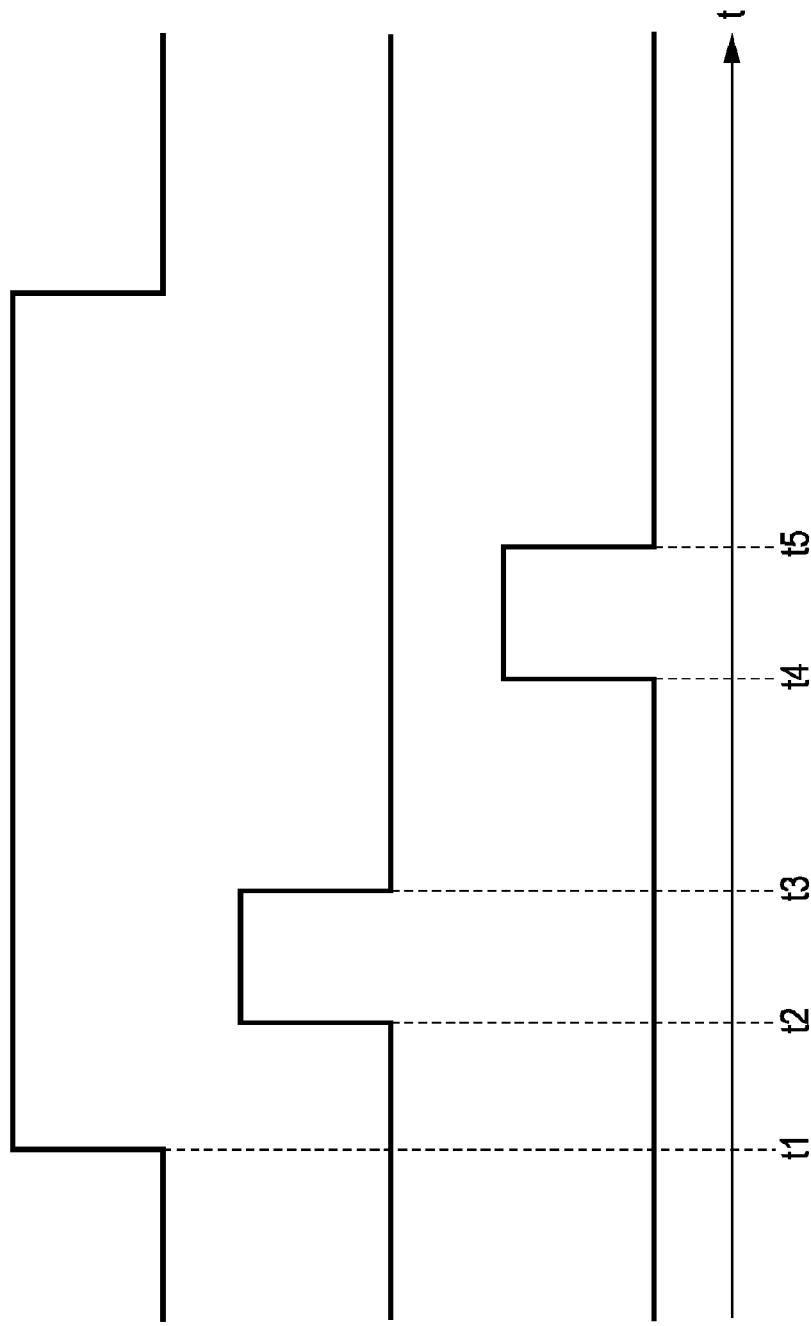

FIG. 4 is a timing chart illustrating pulse signals to be supplied to the respective parts when a signal is read from pixel P. FIG. 4A represents a selection signal, FIG. B represents are set signal, and FIG. 4C represents a transfer signal.

First, as shown in FIG. 4, the selection transistor 24 is brought into a conduction state at the first time point t1. Next, the reset transistor 25 is brought into a conduction state at the second time point t2. Therefore, the gate potential of the amplification transistor 23 is reset.

Subsequently, the reset transistor 25 is brought into a non-conduction state at the third time point t3. After that, a voltage corresponding to a reset level is read out to the column circuit 14.

Next, at the fourth time point t4, the transfer transistor 22 is brought into a conduction state and signal charges accumulated in the photodiode 21 is then transmitted to the gate of the amplification transistor 23.

Next, at the fifth time point t5, the transfer transistor 22 is brought into a non-conduction state. Subsequently, the voltage of signal level corresponding to the amount of the accumulated signal charges is read out to the column circuit 14.

In the column circuit 14, a difference between a reset level voltage readout before read-outing signal level voltage reset level and a signal level voltage readout after read-outing reset level voltage is processed and the signals are then accumulated. Therefore, fixed pattern noises generated by variations in Vth of each transistor provided for every pixel P is cancelled.

The operations for driving the pixels as described above are simultaneously carried out on a plural pixels being aligned every line because every line of a plurality of pixels aligned in the horizontal direction x is connected to the gates of the respective transistors 22, 24, and 25. Specifically, the above vertical drive circuit 13 supplies selection signals to sequentially select the pixels every horizontal line (pixel line) in the vertical direction. Then, the transistors of each pixel are controlled by various kinds of timing signals output from the timing generator 18. Therefore, an output signal in each pixel is read out to the column circuit 14 for every pixel column through the vertical signal line 27. Then, the signals accumulated in the column circuit 14 are selected by the horizontal drive circuit 15 and then sequentially output to the external output circuit 17.

(A3) Detailed Configuration of Solid-State Image Pickup device

The detailed configuration of the solid-state image pickup device 1 will be described.

Figure 5:
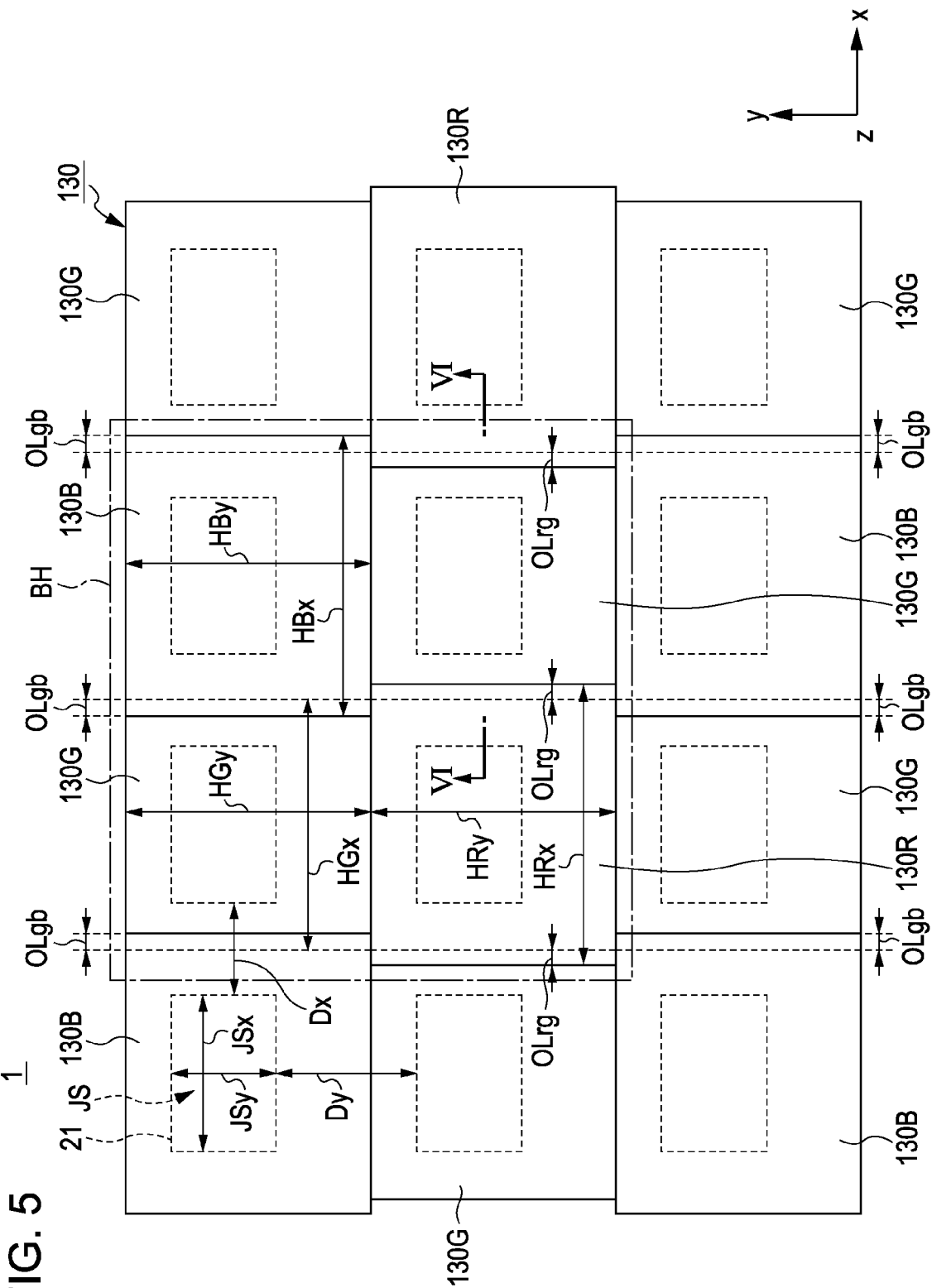
FIG. 5 is a diagram illustrating the main part of the solid-state image pickup device 1 according to the first embodiment of the present invention.
Figure 6:
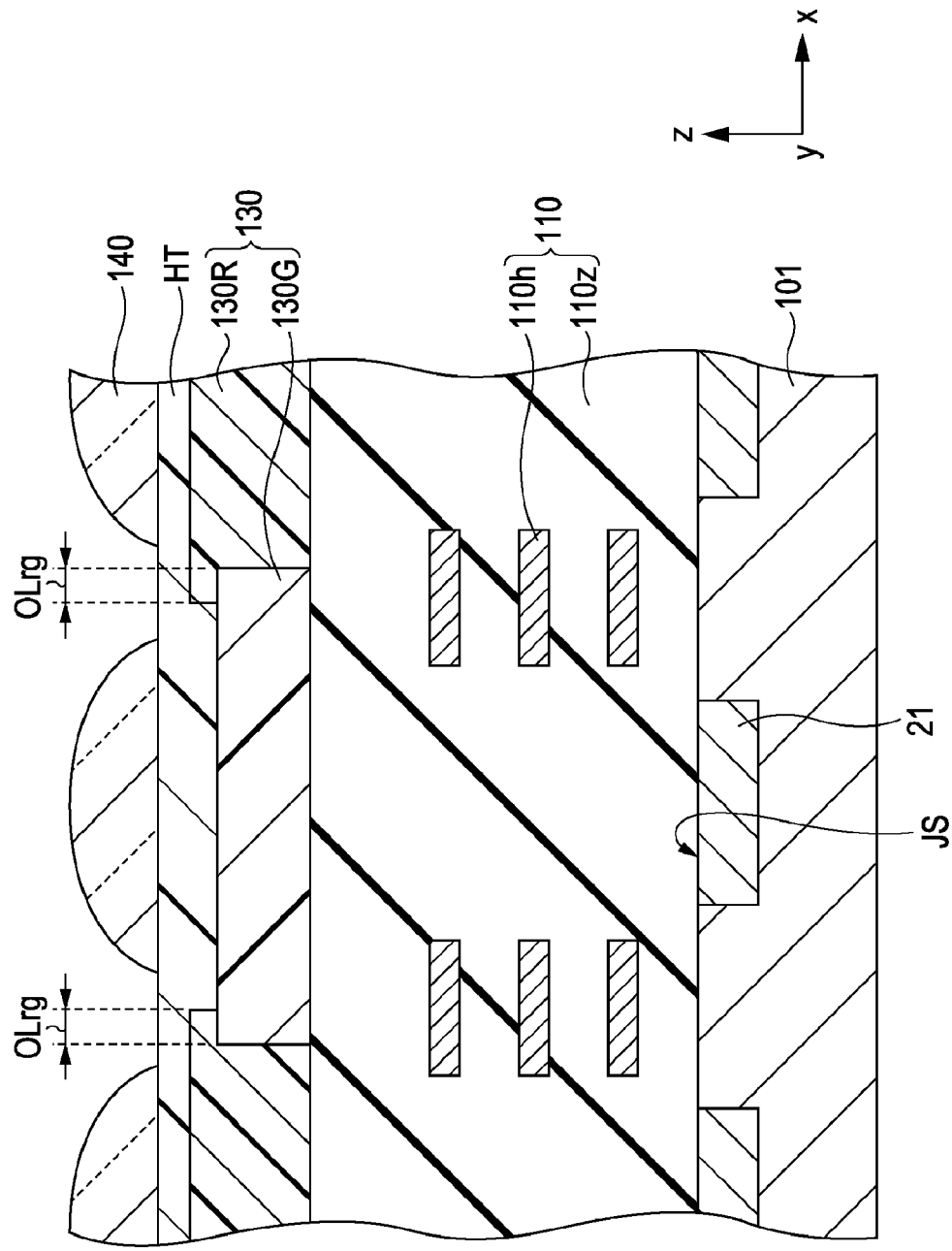
FIG. 6 is a diagram illustrating the main part of the solid-state image pickup device 1 according to the first embodiment of the present invention.
Figure 7:
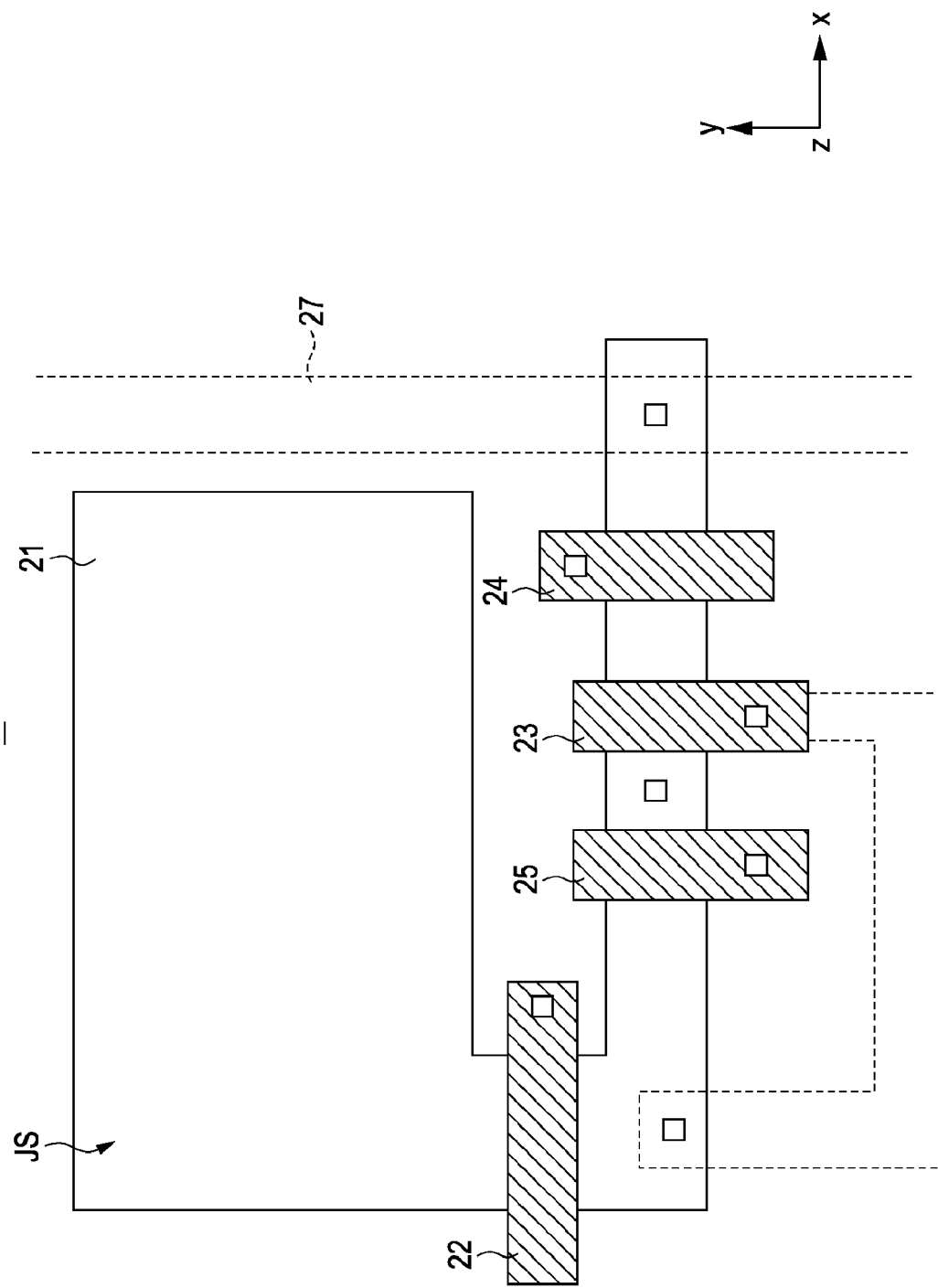
FIG. 7 is a diagram illustrating the main part of the solid-state image pickup device 1 according to the first embodiment of the present invention.

Each of FIGS. 5, 6, and 7 illustrates the main part of the solid-state image pickup device 1 according to the first embodiment of the present invention.

Here, FIG. 5 illustrates the upper side of the image-pickup region PA. In addition, FIG. 6 illustrates a cross-sectional view of the image-pickup region PA along the line VI-VI in FIG. 5. In addition, FIG. 7 illustrates the upper side of the pixel P formed on the image-pickup region PA.

As shown in FIG. 5 to FIG. 7, the solid-state image pickup device 1 includes a photodiode 21, a transfer transistor 22, an amplification transistor 23, a selection transistor, 24, a reset transistor 25, a color filter 130, and an on-chip lens 140. Here, as shown in FIG. 5 and FIG. 6, the color filter 130 includes a red filter layer 130R, a green filter layer 130G, and a blue filter layer 130B.

The structural components will be described in order.

In the solid-state image pickup device 1, the photodiode 21 is formed on the image-pickup surface (xy side) of a substrate 101, as shown in FIG. 5 to FIG. 7. The photodiode 21 receives incident light on its light reception surface and photoelectrically converts the light into a signal charge. A plurality of the photodiodes 21 is arranged on the surface of the substrate 101 so as to correspond to a plurality of pixels shown in FIG. 2.

In the solid-state image pickup device 1 of the present embodiment, as shown in FIG. 5, the photodiodes 21 are formed on the image-pickup surface (xy side) of a substrate 101 so that a plurality of the photodiodes 21 is arranged in the horizontal direction x and a plurality of the photodiodes 21 is arranged in the vertical direction y perpendicular to the horizontal direction x.

Here, the light reception surface JS of the photodiode 21 is formed in a rectangular shape. Specifically, the light reception surface JS is of a rectangular shape in which the width JSx in the horizontal direction x is longer than the width JSy in the vertical direction y.

Then, the photodiodes 21 are formed so that the light reception surfaces JS are aligned at equal intervals in the horizontal direction x. In other words, a plurality of the photodiodes 21 is arranged so that the distance Dx between the light reception surfaces JS in the horizontal direction x can be constant.

In addition, the photodiodes 21 are formed so that the light reception surfaces JS thereof can be aligned at equal intervals in the vertical direction y. In other words, a plurality of the photodiodes 21 is arranged so that the distance Dy between the light reception surfaces JS in the vertical direction y can be constant.

Furthermore, in a plurality of photodiodes 21, as shown in FIG. 5, the distance between the light reception surfaces JS in the vertical direction y is longer than one in the horizontal direction x. In other words, the photodiodes 21 are formed so that the distance Dx between the light reception surfaces JS aligned in horizontal direction x is smaller than the distance Dy between the light reception surfaces JS aligned in the horizontal direction y.

Furthermore, as shown in FIG. 5, the color filter 130 is located above each light reception surface JS. The surface of one of the red filter layer 130R, the green filter layer 130G, and the blue filter layer 130B is smaller than that of the others.

Then, as shown in FIG. 6, a wiring layer 110 is formed above the substrate 101 on which the photodiode 21 is formed. In the wiring layer 110, a wiring line 110h which is electrically connected to the respective element is formed in an insulating layer 110z. The insulating layer 110z is made of an optically transparent material through which light passes. For example, the insulating layer 110z is formed of a silicon oxide film (reflective index n=1.43). In addition, the wiring line 110h is formed of a conductive material such as metal. Each wiring line 110h is shown in FIG. 3 and functioned as any of transfer line 26, the address line 28, the vertical signal line 27, the reset line 29, and so on. As shown in FIG. 6, each wiring line 110h is located above the surface of the substrate 101 other than the portion located above the light reception surface JS. The wiring line 110h has an opened portion corresponding to the light reception surface JS, thereby being functioned as a shading portion. Besides, as shown in FIG. 6, both the color filter 130 and the on-chip lens 140 are arranged above the photodiode 21. Therefore, the light reception surface JS of the photodiode 21 receives incident light sequentially passed through the on-chip lens 140 and the color filter 130.

In the solid-state image pickup device 1, pixel transistors including the transfer transistor 22, the amplification transistor 23, the selection transistor 24, and the reset transistor 25, are formed below the photodiode 21 on the xy plane in FIG. 7. As for the pixel transistor, an active region is formed in the substrate 101 and each gate electrode is made of, for example, polysilicon. The pixel transistors are included in the circuit illustrated in FIG. 3. Furthermore, graphical representations of the transfer line 26, the address line 28, and the reset line 29 shown in FIG. 2 are omitted in FIG. 7. However, these wiring lines 26, 28, and 29 are present among a plurality of the light reception surfaces JS and extend in the horizontal direction x.

In the solid-state image pickup device 1, as shown in FIG. 6, the color filter 130 is formed above the surface of the substrate 101 so that it can be located above the wiring layer 110. The color filter 130 colors incident light from a subject image and then transmits the light to the surface of the substrate 101. For example, the color filter 130 is formed by applying a coating solution containing a color pigment and a photoresist resin to the substrate using a coating method such as a spin coat method and then forming patterns on the resulting coat by the lithographic technology.

As shown in FIG. 5, the color filter 130 includes the red filter layer 130R, the green filter layer 130G, and the blue filter layer 130B. In other words, the color filter 130 including the red filter layer 130R, the green filter layer 130G, and the blue filter layer 130B is provided for each of the pixels P.

Here, as shown in FIG. 5, each of the red filter layer 130R, the green filter layer 130G, and the blue filter layer 130B is arranged in a Bayer arrangement BH so as to correspond to each pixel P. In other words, a plurality of green filter layers 130G is sequentially arranged in a checkered pattern in the diagonal direction. In addition, the red filter layer 130R and the blue filter layer 130B are alternatively arranged in a plurality of green filter layers 130G in the diagonal direction.

Specifically, in the color filter 130, the red filter layer 130R is arranged above the light reception surface JS as shown in FIG. 5. In the xy plane, the red filter layer 130R is arranged so that it can be sandwiched between two green filter layers 130G in the horizontal direction x. In addition, the red filter layer 130R is arranged so that it can be sandwiched between two green filters 130G in the direction y. Furthermore, the red filter 130R is arranged so that it can be sandwiched between two blue filter layers 130B in a diagonal direction at an angle of 45 degrees of inclination with respect to the horizontal direction x and the vertical direction y on the xy plane. The red filter layer 130R shows a high optical transmittance at a wavelength range (for example 625 to 540 mm) corresponding red and allows the incident light to be colored red, followed by transmitting the light to the light reception surface JS.

In the present embodiment, the red filter layer 130R has a quadrilateral surface facing to the light reception surface JS. Here, the red filter layer 130R is formed so that it is of a rectangular shape in which the width HRx in the horizontal direction x is longer than the width HRy in the vertical direction. Then, the red filter layer 130R is formed so that it partially overlaps the green filter layer 130G in the horizontal direction X, thereby forming an overlapped region OLrg.

In the color filter 130, as shown in FIG. 5, the green filter layer 130G is arranged above the light reception surface JS. In the xy plane, the green filter layer 130G is arranged so that it can be sandwiched between two red filter layers 130R or two blue filter layers 130B in the horizontal direction x. In addition, the green filter layer 130G is arranged so that it can be sandwiched between two red filter layers 130R or two blue filter layers 130B in the vertical direction y. Furthermore, a plurality of the green filter layers 130G is arranged in a diagonal direction at an angle of 45 degrees of inclination with respect to the horizontal direction x and the vertical direction y. This green filter layer 130G has a high optical transmittance at a wavelength range (for example, 500 to 565 nm) corresponding to green color. The green filter layer 130G colors the incident light and transmits the light to the light reception surface JS.

In the present embodiment, the green filter layer 130G has a quadrilateral surface facing to the light reception surface JS. Here, the green filter layer 130G is formed so that the width HGx thereof in the horizontal direction x and the width HGy thereof in the vertical direction y can be equal to each other. In other words, the green filter layer 130G is formed in a square shape. Then, the green filter layer 130G is formed so that it partially overlaps the red filter layer 130R or the blue filter layer 130B in the horizontal direction X, thereby forming overlapped regions OLrg and OLgb.

In the color filter 130, as shown in FIG. 5, the blue filter layer 130B is arranged above the light reception surface JS. The blue filter layer 130B shows a high optical transmittance at a wavelength range (for example 450 to 485 mm) corresponding blue color and allows the incident light to be colored blue, followed by transmitting the light to the light reception surface JS. In the xy plane, the blue filter layer 130R is arranged so that it can be sandwiched between two green filter layers 130G in the horizontal direction x. In addition, the blue filter layer 130B is arranged so that it can be sandwiched between two green filters 130G in the direction y. Furthermore, the blue filter 130B is arranged so that it can be sandwiched between two red filter layers 130R in a diagonal direction at an angle of 45 degrees of inclination with respect to the horizontal direction (direction x) and the vertical direction y on the xy plane.

In the present embodiment, the blue filter layer 130B has a quadrilateral surface facing to the light reception surface JS. Here, the blue filter layer 130B is formed so that it is of a rectangular shape in which the width HBx in the horizontal direction x is longer than the width HBy in the vertical direction. Then, the blue filter layer 130B is formed so that it partially overlaps the green filter layer 130G in the horizontal direction X, thereby forming an overlapped region OLgb.

As described above, in the horizontal direction x, the overlapped region OLrg is formed as shown in FIG. 5. In this overlapped region OLrg, the red filter layer 130R and the green filter layer 130G are laminated together. Here, each of the red filter layers 130R and each of the green filter layers 130G are partially overlapped to each other between the light reception surfaces JS aligned in the horizontal direction x, thereby forming the overlapped region OLrg. In this overlapped region OLrg, as shown in FIG. 6, the red filter layer 130R is laminated on part of the upper surface of the green filter layer 130G.

In the horizontal direction x, as shown in FIG. 5, the overlapped region OLgb on which the green filter layer 130G and the blue filter layer 130B are laminated is also formed. Here, each of the green filter layers 130G and each of the blue filter layers 130B are partially overlapped to each other between the light reception surfaces JS aligned in the horizontal direction x, thereby forming the overlapped region OLrb. In this overlapped region OLrb, but the cross-sectional view thereof is not shown in the figure, the blue filter layer 130B is laminated on part of the upper surface of the green filter layer 130G just as in the case with the overlapped region OLrg.

Therefore, in the horizontal direction x, overlapped regions OLrg and OLgb where different color filter layers are overlapped (130R and 130G or 130G and 130B) are formed.

In the vertical direction y, on the other hand, there is no overlapped portion between the different color filter layers (130R and 130G or 130G and 130B). The lateral sides of neighboring layers touch to each other.

In other words, in the present embodiment, the surface on which the green filter layers 130G and other filter layers 130R and 130B are laminated in the horizontal direction x is larger than the surface on which the green filter layer 130G and other filter layers 130R and 130B are laminated in the vertical direction y.

Then, as shown in FIG. 6, the upper surface of the color filter 130 is covered with a planarizing film HT.

In the solid-state image pickup device 1, an on-chip lens 140 is formed on the planarizing film HT that covers the color filter 130 above the surface of the substrate 101 as shown in FIG. 6. This on-chip lens 140 converges the incident light on the light reception surface JS of the photodiode 21. Specifically, the center of the on-chip lens 140 is thicker than the periphery thereof in the direction toward the light reception surface JS of the photodiode 21.

(B) Manufacturing Method

Hereinafter, a method of manufacturing the main part of the above solid-state image pickup device 1 will be described. Here, the process of forming the color filter 130 in the solid-state image pickup device 1 will be described in detail.

Figure 8:
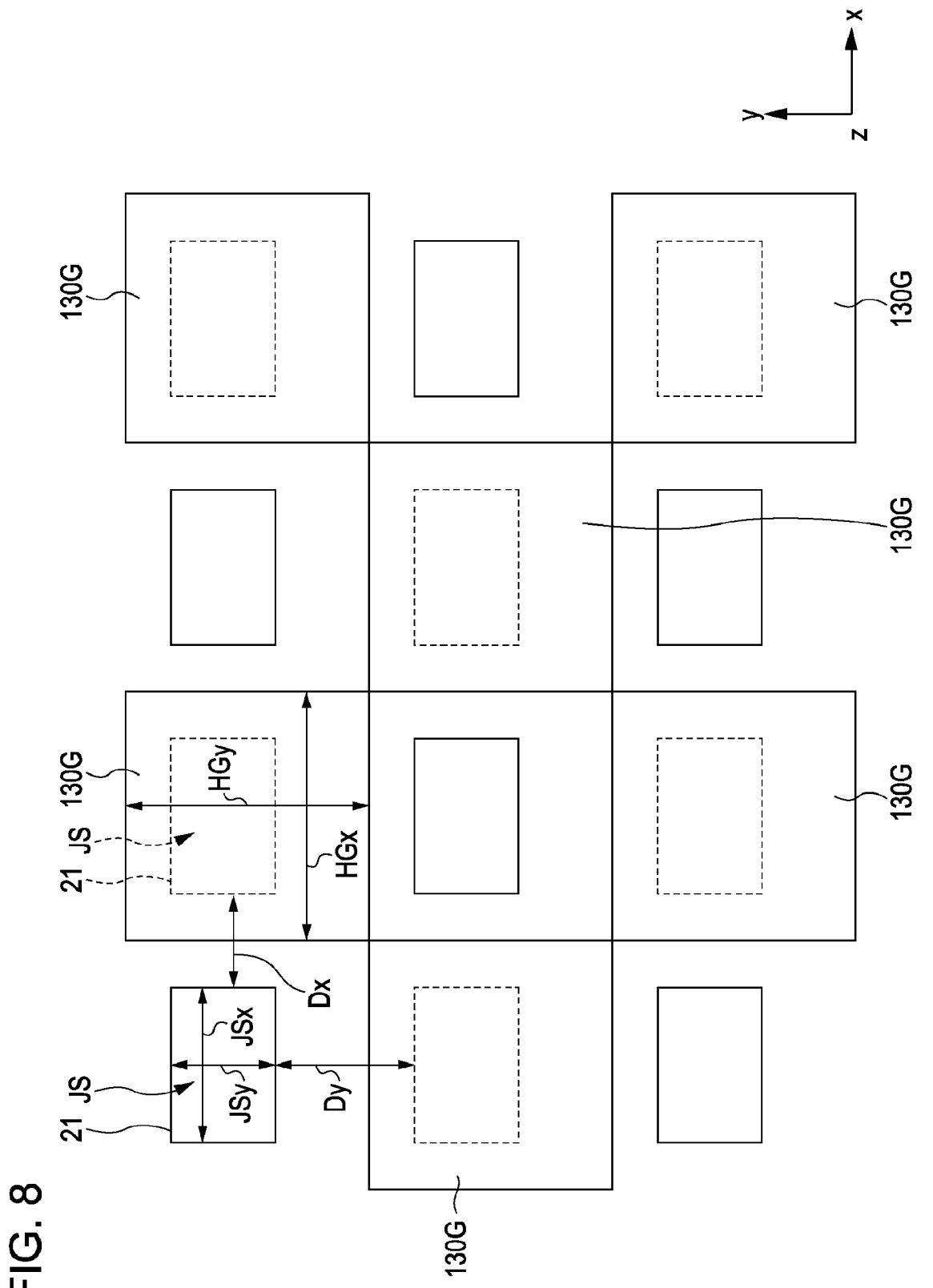
FIG. 8 is a diagram illustrating the main part formed in each step of a method of manufacturing the solid state image pickup device 1 according to the first embodiment of the present invention.
Figure 9:
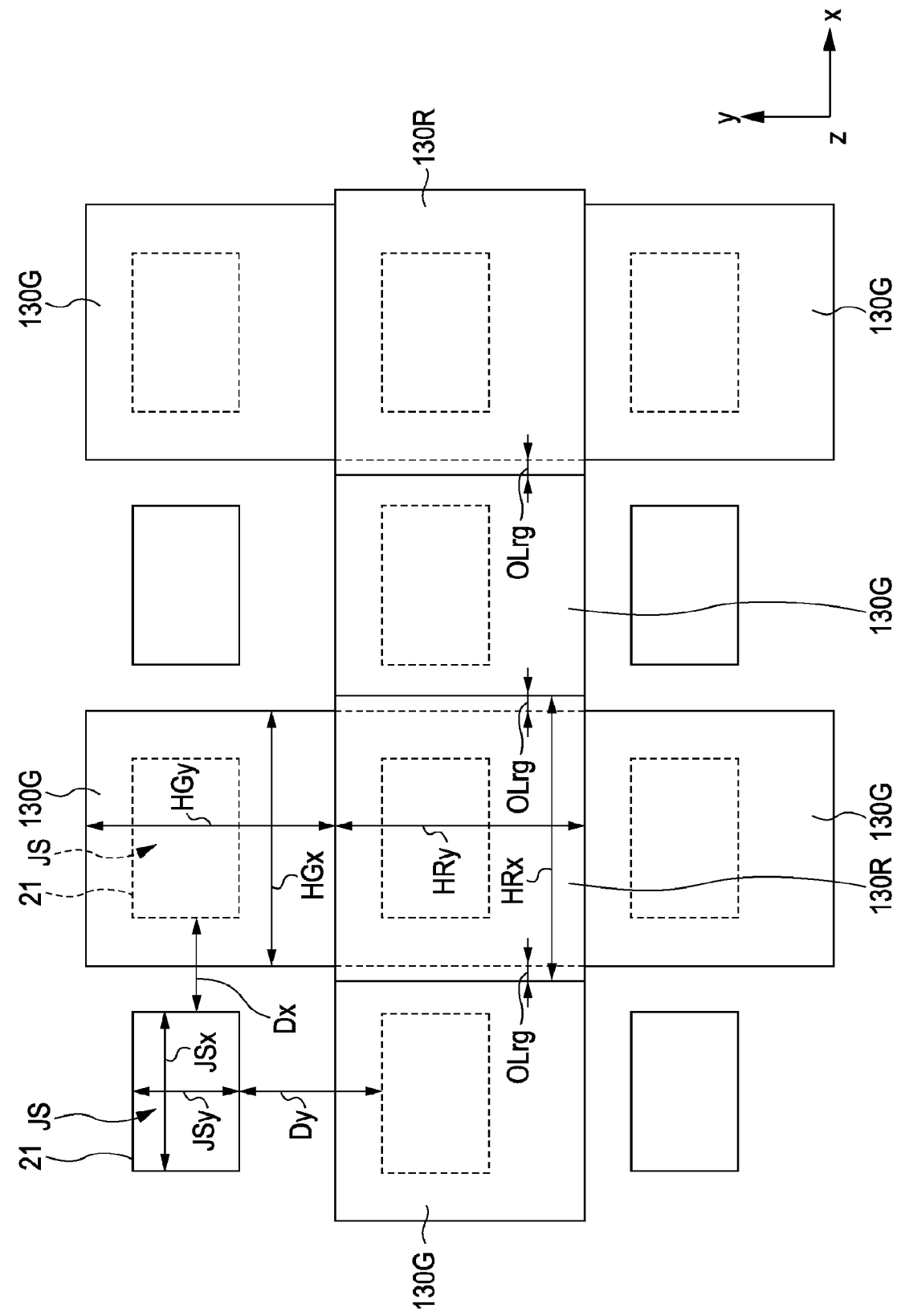
FIG. 9 is a diagram illustrating the main part formed in each step of a method of manufacturing the solid state image pickup device 1 according to the first embodiment of the present invention.

Each of FIG. 8 and FIG. 9 is a diagram illustrating the main part formed in each step of the method of manufacturing the solid state image pickup device 1 according to the first embodiment of the present invention. Each of FIG. 8 and FIG. 9 illustrates the upper surface of the image-pickup region PA just as FIG. 5.

(B1) Formation of Green Filter Layers 130G

First, as shown in FIG. 8, the green filter layers 130G are formed.

Here, in advance of the formation of the green filter layers 130G, the structural components to be located on the layer below the green filter layer 130G are formed on the substrate 101. That is, as shown in FIG. 5 and so on, on the image-pickup region, a photodiode 21, a transfer transistor 22, an amplification transistor 23, a selection transistor 24, and a reset transistor 25 are formed. In addition on the peripheral region SA, peripheral circuit elements that form a peripheral circuit are formed. Then, as shown in FIG. 6, a wiring layer 110 is formed so that it can cover each of structural components formed on the surface of the substrate 101.

The photodiodes 21 are formed so that a plurality of the photodiodes 21 can be aligned in both the horizontal direction x and the vertical direction y, respectively.

In this case, as shown in FIG. 8, the photodiodes 21 are formed so that the light reception surface JS can be of a quadrilateral shape in which the width JSx in the horizontal direction x is longer than the width JSy in the vertical direction. In addition, the photodiodes 21 are formed so that the light reception surfaces JS thereof can be aligned at equal intervals in both the horizontal direction x and the vertical direction y. In other words, a plurality of the photodiodes 21 is arranged so that the distance Dx between the light reception surfaces JS in the horizontal direction x can be constant. In addition, a plurality of the photodiodes 21 is arranged so that the distance Dy between the light reception surfaces JS in the vertical direction y can be constant.

Furthermore, as shown in FIG. 8, the formation of a plurality of photodiodes 21 is performed so that the distance between the light reception surfaces JS in the vertical direction y is longer than one in the horizontal direction x. In other words, the photodiodes 21 are formed so that the distance Dx between the light reception surfaces JS aligned in horizontal direction x is smaller than the distance Dy between the light reception surfaces JS aligned.

After that, the formation of green filter layers 130G is performed.

Next, as shown in FIG. 8, green filter layers 130G are formed above the corresponding reception surfaces JS, respectively.

In the present embodiment, the green filter layer 130G is formed so that it can have a quadrilateral surface facing to the light reception surface JS. Specifically, the green filter layer 130G is formed so that the width HGx thereof in the horizontal direction x and the width HGy thereof in the vertical direction y can be of the same square shape.

Furthermore, in the xy plane of the substrate 101, a plurality of the green filters 130G is arranged so that they can be aligned in a diagonal direction at an angle of 45 degrees of inclination with respect to the horizontal direction x and the vertical direction y on the xy plane. In other words, a plurality of green filter layers 130G is formed so that they can be arranged in a checkered pattern.

The formation of green filter layers 130G may be performed using a photolithographic technique or the like. First, for example, a coating solution containing a green pigment and a acrylic photosensitive resin is applied to the upper surface of the wiring layer 110 by a spin coat method and then subjected to a pre-bake treatment, thereby forming a photosensitive resin film (not shown) (see FIG. 6). Next, the photosensitive resin film is subjected to an exposure treatment. The exposure treatment is performed such that a pattern image, such as one of green filter layers 130G as shown in FIG. 8, is exposed to the photosensitive resin film. Subsequently, the photosensitive resin film subjected to the exposure treatment is then subjected to a development treatment. Therefore, as shown in FIG. 8, the photosensitive resin film is pattern-processed, thereby forming green filter layers 130G.

(B-2) Formation of Red Filter Layers 130R

Next, as shown in FIG. 9, red filter layers 130R are formed.

Here, as shown in FIG. 9, red filter layers 130R are formed above the corresponding reception surfaces JS, respectively. Specifically, the red filter layer 130R is formed so that it can be sandwiched between the green filter layers 130G in both the horizontal direction x and the vertical direction y.

In the present embodiment, as shown in FIG. 9, the red filter layer 130R is formed so that it can have a quadrilateral surface facing to the light reception surface JS. Specifically, the red filter layer 130R is formed so that it is of a rectangular shape in which the width HRx in the horizontal direction x is longer than the width HRy in the vertical direction (HRx>HRy). In addition, the red filter layer 130R is formed so that it partially overlaps the green filter layer 130G in the horizontal direction X. Thus, as shown in FIG. 9, the overlapped region OLrg on which the red filter layer 130R and the green filter layer 130G are laminated is also formed.

The formation of red filter layers 130R may be performed using a photolithographic technique or the like just as in the case with the formation of green filter layers 130G. First, for example, a coating solution containing a red pigment and a acrylic photosensitive resin is applied to the upper surface of the wiring layer 110 by a spin coat method and then subjected to a pre-bake treatment, thereby forming a photosensitive resin film (not shown) (see FIG. 6). Next, the photosensitive resin film is subjected to an exposure treatment. The exposure treatment is performed such that a pattern image, such as one of red filter layers 130R as shown in FIG. 9, is exposed to the photosensitive resin film. Subsequently, the photosensitive resin film subjected to the exposure treatment is then subjected to a development treatment. Therefore, as shown in FIG. 9, the photosensitive resin film is pattern-processed, thereby forming green filter layers 130R.

(B3) Formation of Blue Filter Layers 130B

Next, as shown in FIG. 5, blue filter layers 130B are formed.

Here, as shown in FIG. 5, blue filter layers 130B are formed above the corresponding reception surfaces JS, respectively. Specifically, the blue filter layer 130B is formed so that it can be sandwiched between the green filter layers 130G in both the horizontal direction x and the vertical direction y. Furthermore, the blue filter 130B is formed so that it can be sandwiched between two red filter layers 130R at an angle of 45 degrees of inclination with respect to the horizontal direction (direction x) and the vertical direction y on the xy plane.

In the present embodiment, the blue filter layer 130B is formed so that it can have a quadrilateral surface facing to the light reception surface JS. Specifically, the blue filter layer 130B is formed so that it is of a rectangular shape in which the width HBx in the horizontal direction x is longer than the width HBy in the vertical direction. In addition, the blue filter layer 130B is formed so that it partially overlaps the green filter layer 130G in the horizontal direction X. Thus, as shown in FIG. 9, the overlapped region OLgb on which the blue filter layer 130B and the green filter layer 130G are laminated is also formed.

The formation of blue filter layers 130B may be performed using a photolithographic technique or the like. First, for example, a coating solution containing a blue pigment and a acrylic photosensitive resin is applied to the upper surface of the wiring layer 110 by a spin coat method and then subjected to a pre-bake treatment, thereby forming a photosensitive resin film (not shown) (see FIG. 6). Next, the photosensitive resin film is subjected to an exposure treatment. The exposure treatment is performed such that a pattern image, such as one of blue filter layers 130B as shown in FIG. 5, is exposed to the photosensitive resin film. Subsequently, the photosensitive resin film subjected to the exposure treatment is then subjected to a development treatment. Therefore, as shown in FIG. 5, the photosensitive resin film is pattern-processed, thereby forming blue filter layers 130B.

After that, as shown in FIG. 6 and so on, a planarizing film HT and an on-chip lens 140 are formed, thereby completing the solid-state image pickup device 1.

The formation of the planarizing film HT is performed by, for example, coating the surface of the color filter 130 with an acrylic thermosetting resin by a spin coat method. After that, the thermosetting resin is subjected to a heat treatment, thereby forming the planarizing film HT.

In the formation of the on-chip lens 140, for example, a photosensitive resin is applied to the upper surface of the planarizing film HT by a spin coat method and then subjected to a bake treatment, thereby forming a photosensitive resin film (not shown). Next, the photosensitive resin film is subjected to an exposure treatment and a development treatment in sequence to form a resist pattern of a rectangle in cross section (not shown).

Then, a heat reflow treatment is performed on the resulting resist pattern. Subsequently, the resist pattern is molten to form a hemispherical on-chip lens 140.

(C) Conclusion

As described above, in the case of a plurality of photodiodes 21 in the present embodiment, as shown in FIG. 5, the distance between the light reception surfaces JS in the horizontal direction x is longer than one in the vertical direction y. In this case, as described above with reference to FIG. 33, the pixel tends to receive the incident light for another adjacent pixel in the horizontal direction x rather than the vertical direction y, so that "color mixing" can occur remarkably. Therefore, as described above, the generation of anisotropy of "color mixing" may lead to a decrease in image quality.

However, in the present embodiment, as shown in FIG. 5, the overlapped region OLrg on which the red filter layer 130R and the green filter layer 130G are laminated is formed in the horizontal direction x. In the horizontal direction x, as shown in FIG. 5, the overlapped region OLgb on which the green filter layer 130G and the blue filter layer 130B are laminated is also formed. In the vertical direction y, on the other hand, there is no overlapped portion between the different color filter layers (130R and 130G or 130G and 130B). The lateral sides of neighboring layers touch to each other. In other words, the surface on which the green filter layers 130G and other filter layers 130R and 130B are laminated in the horizontal direction x is larger than the surface on which the green filter layer 130G and other filter layers 130R and 130B are laminated in the vertical direction y.

Therefore, the incident light being entered at a certain angle of inclination with respect to the horizontal direction x passes through a plurality of filter layers (130R and 130G or 130G and 130B) with different colors and is then incident on the light reception surface JS on the overlapped regions OLrg and OLgb.

In the present invention, therefore, a difference between the "color mixing" occurs in the pixels P aligned in the horizontal direction x and the "color mixing" occurs in the pixels P aligned in the vertical direction y can be reduced. Therefore, color shift in three primary colors can be prevented. In addition, the sensitivity difference to be occurred between the green pixel and the adjacent portion of the red pixel in the horizontal direction and between the green pixel and the adjacent portion of the blue pixel in the horizontal direction can be prevented. Thus, color reproductivity can be improved.

Therefore, the present embodiment can lead to an improvement in image quality.

In addition to such advantages, in the present embodiment, there are overlapped portions between the green filter 130G and the red filter layer 130R or the blue filter layer 130B. Thus, each of filter layers 130R, 130G, and 130B can be prevented from being peeled off.

In the present invention, furthermore, each of the red filter layers 130R and each of the green filter layers 130G are partially overlapped to each other between the light reception surfaces JS aligned in the horizontal direction x, forming their overlapped region. Similarly, each of the blue filter layers 130B and each of the green filter layers 130G are partially overlapped to each other between the light reception surfaces JS aligned in the horizontal direction x, forming their overlapped region. In other words, the present embodiment does not include any overlapped portion of different color filter layers above the light reception surface JS.

In the present embodiment, therefore, the generation of "color mixing" anisotropy as described above can be prevented without a loss of sensitivity, leading to an improvement in image quality.

Furthermore, the surface areas of the above overlapped regions OLrg and OLgb can be suitably defined in consideration of, but not particularly limited to, the sensitivity characteristics of each color.

2. Embodiment 2

(A) Configuration of Device and so on

Figure 10:
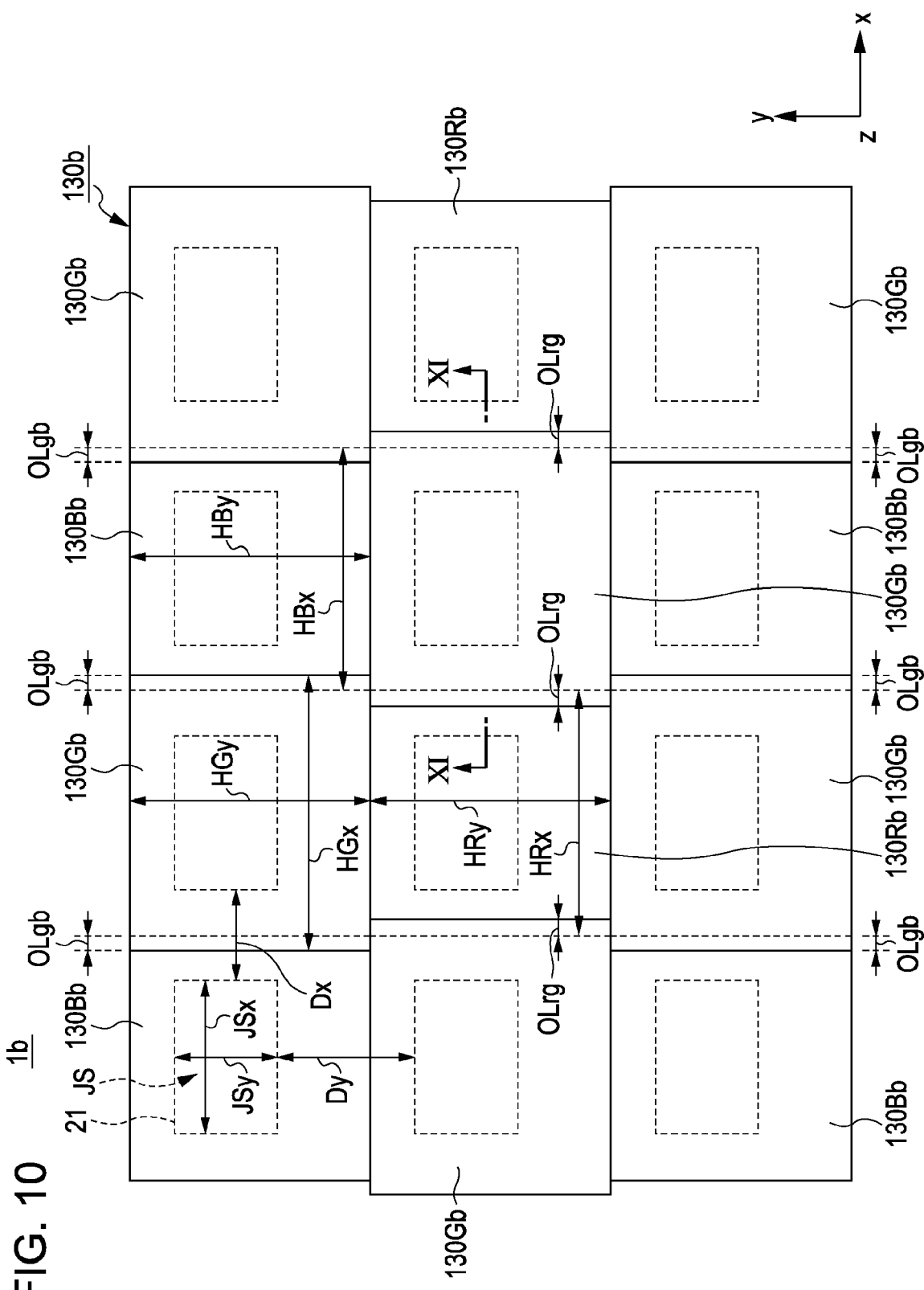
FIG. 10 is a diagram illustrating the main part of a solid-state image pickup device 1b according to a second embodiment of the present invention.
Figure 11:
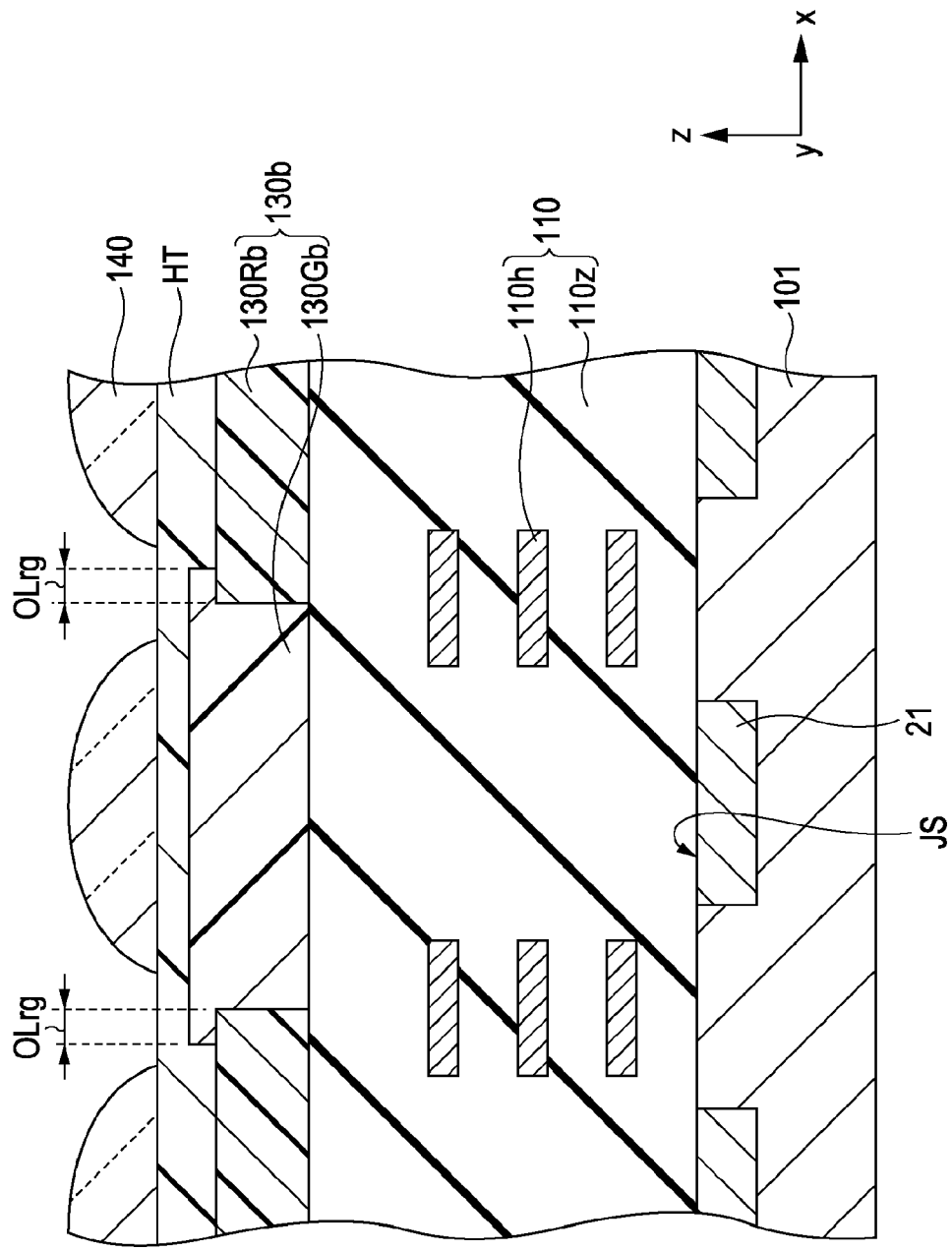
FIG. 11 is a diagram illustrating the main part of the solid-state image pickup device 1b according to the second embodiment of the present invention.

Each of FIG. 10 and FIG. 11 is a diagram illustrating the main part of a solid-state image pickup device 1b according to a second embodiment of the present invention;

Here, FIG. 10 illustrates the upper surface of the image-pickup region PA just as FIG. 5. Also, FIG. 11 illustrates a cross-sectional view of the image-pickup region PA just as FIG. 6. FIG. 11 illustrates a cross-sectional view of the image-pickup region PA along the line XI-XI in FIG. 10.

As shown in FIG. 10 and FIG. 11, the main part of a solid-state image pickup device 1b according to a second embodiment of the present invention is similar to that of the first embodiment except for a color filter 130*b*. Thus, the same structural elements as those of the first embodiment are designated by the same reference numerals and their detail description will be omitted.

As shown in FIG. 10, just as in the case with the first embodiment, the color filter 130*b* includes a red filter layer 130Rb, a green filter layer 130Gb, and a blue filter layer 130Bb. In addition, the red filter layer 130Rb, the green filter layer 130Gb, and the blue filter layer 130Bb are arranged in a Bayer arrangement.

Just as the first embodiment, as shown in FIG. 11, the color filter 130*b* is formed above the surface of the substrate 101 so that it can be located above the wiring layer 110.

Just as the first embodiment, specifically, in the color filter 130*b*, the red filter layer 130Rb is arranged above the light reception surface JS as shown in FIG. 10.

In the present embodiment, unlike the first embodiment, the red filter layer 130Rb is of a square shape in stead of a rectangular shape found in the first embodiment. Here, the red filter layer 130Rb is formed so that it is of a rectangular shape in which the width HRx in the horizontal direction x is equal to the width HRy in the vertical direction (HRx=HRy).

Then, the red filter layer 130Rb is formed so that it partially overlaps the green filter layer 130Gb in the horizontal direction X, thereby forming an overlapped region OLrg.

In the color filter 130*b*, as shown in FIG. 10, the green filter layer 130Gb is arranged above the light reception surface JS.

In the present embodiment, the green filter layer 130Gb is of a square shape in stead of a rectangular shape found in the first embodiment. Here, the green filter layer 130Gb is formed so that it is of a rectangular shape in which the width HGx in the horizontal direction x is longer than the width HGy in the vertical direction (HGx>HGy).

Then, the green filter layer 130Gb is formed so that it partially overlaps the red filter layer 130Rb or the blue filter layer 130Bb in the horizontal direction X, thereby forming overlapped regions OLrg and OLgb.

In the color filter 130*b*, as shown in FIG. 10, the blue filter layer 130B b is arranged above the light reception surface JS just as in the case with the first embodiment.

In the present embodiment, the blue filter layer 130Bb is of a square shape in stead of a rectangular shape found in the first embodiment. Here, the blue filter layer 130Bb is formed so that it is of a rectangular shape in which the width HBx in the horizontal direction x is equal to the width HBy in the vertical direction y (HBx=HBy).

Then, the blue filter layer 130Bb is formed so that it partially overlaps the green filter layer 130Gb in the horizontal direction X, thereby forming an overlapped region OLgb.

Just as the first embodiment, as shown in FIG. 10, the overlapped region OLrg on which the red filter layer 130Rb and the green filter layer 130Gb are laminated is formed in the horizontal direction x. Unlike the first embodiment, in this overlapped region OLrg, as shown in FIG. 11, the green filter layer 130Gb is laminated on part of the upper surface of the red filter layer 130Rb.

In the horizontal direction x, as shown in FIG. 10, the overlapped region OLgb on which the green filter layer 130Gb and the blue filter layer 130Bb are laminated is also formed. In this overlapped region OLrb, but the cross-sectional view thereof is not shown in the figure, the green filter layer 130Gb is laminated on part of the upper surface of the blue filter layer 130Bb just as in the case with the overlapped region OLrg.

Therefore, in the horizontal direction x, overlapped regions OLrg and OLgb where different color filter layers are overlapped (130Rb and 130Gb or 130Gb and 130Bb) are formed.

In the vertical direction y, on the other hand, there is no overlapped portion between the different color filter layers (130Rb and 130Gb or 130Gb and 130Bb). The lateral sides of neighboring layers touch to each other.

In other words, in the present embodiment, just as in the case with the first embodiment, the surface on which different color filter layers are laminated in the horizontal direction x is larger than the surface on which different color filters are laminated in the vertical direction y.

(B) Manufacturing Method

Hereinafter, a method of manufacturing the main part of the above solid-state image pickup device 1*b* will be described. Here, the process of forming the color filter 130*b* in the solid-state image pickup device 1*b* will be described in detail.

Figure 12:
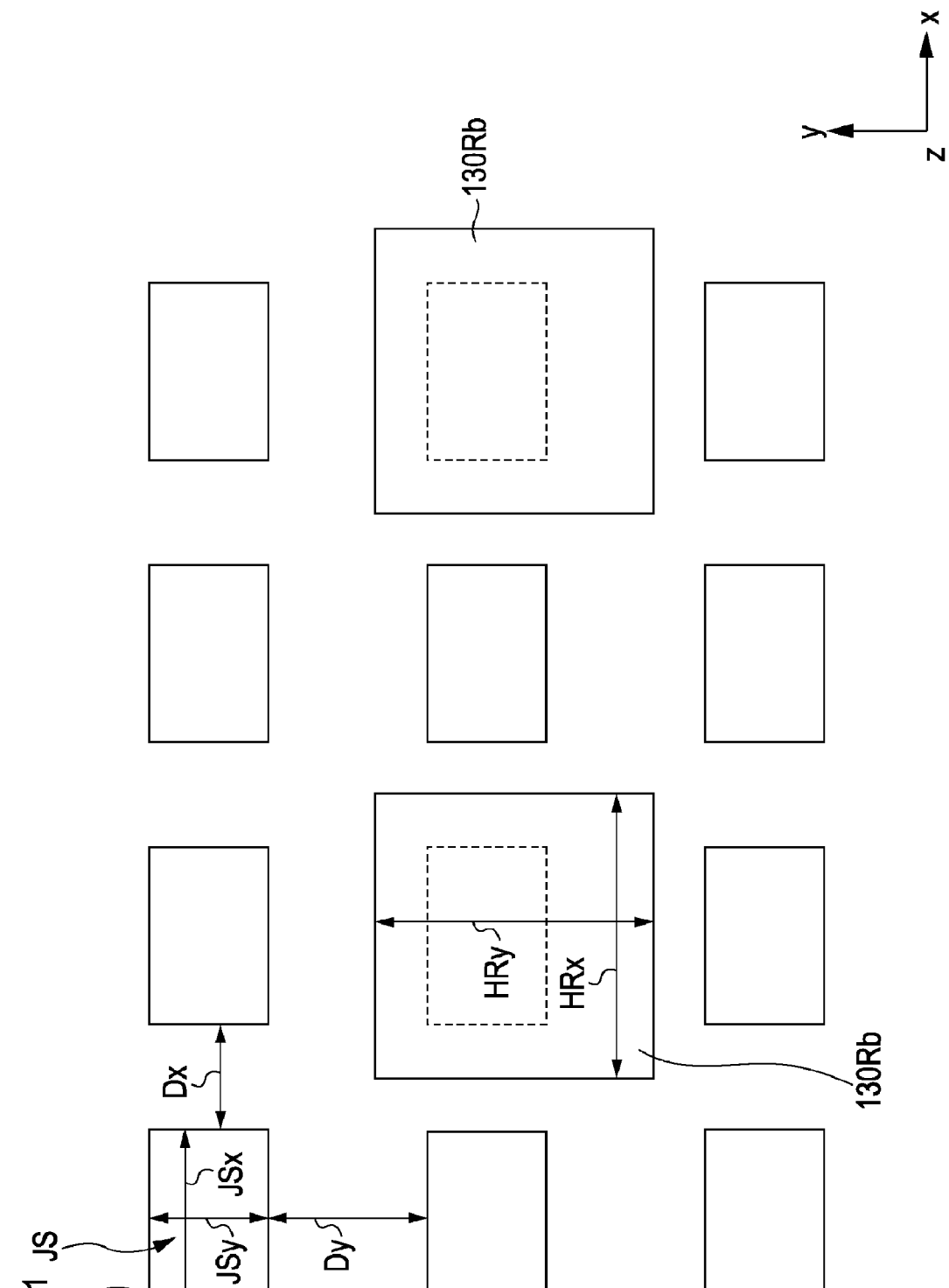
FIG. 12 is a diagram illustrating the main part formed in each step of a method of manufacturing the solid state image pickup device 1b according to the second embodiment of the present invention.
Figure 13:
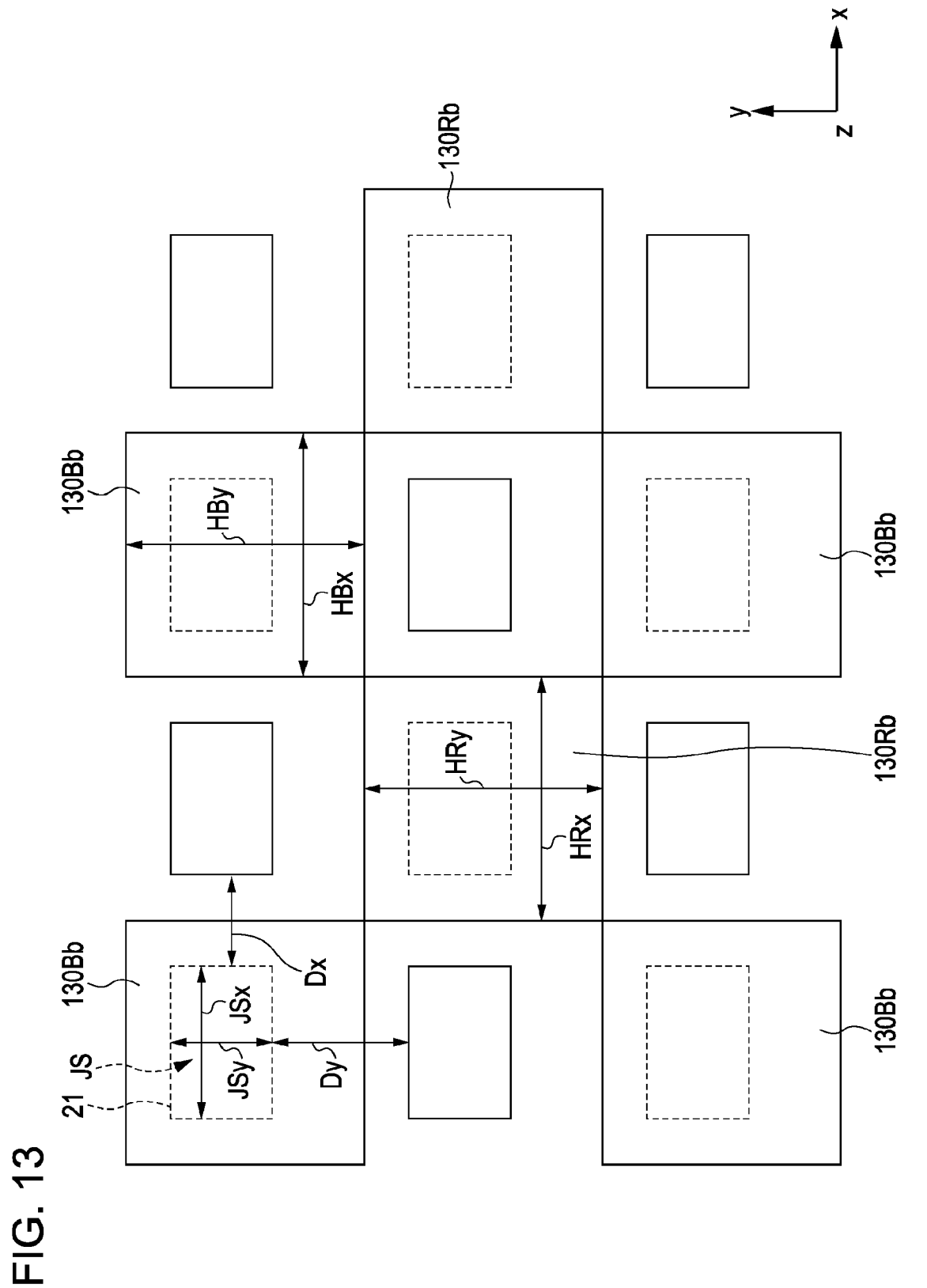
FIG. 13 is a diagram illustrating the main part formed in each step of a method of manufacturing the solid state image pickup device 1b according to the second embodiment of the present invention.

Each of FIG. 12 and FIG. 13 is a diagram illustrating the main part formed in each step of the method of manufacturing the solid state image pickup device 1*b* according to the second embodiment of the present invention. Each of FIG. 12 and FIG. 13 illustrates the upper surface of the image-pickup region PA just as FIG. 10.

(B1) Formation of Red Filter Layers 130Rb

First, as shown in FIG. 12, red filter layers 130Rb are formed.

Here, as shown in FIG. 12, red filter layers 130Rb are formed above the corresponding reception surfaces JS, respectively.

In the present invention, red filter layers 130Rb are formed so that it can be of a square shape (HRx=HRy). Just as the first embodiment, the formation of red filter layers 130R may be performed using a photolithographic technique or the like just as in the case with the formation of green filter layers 130G.

(B-2) Formation of Blue Filter Layers 130Bb

Next, as shown in FIG. 13, blue filter layers 130Bb are formed.

Here, as shown in FIG. 13, blue filter layers 130Bb are formed above the corresponding reception surfaces JS, respectively.

In the present embodiment, just as the red filter layer 130Rb, the blue filter layer 130Bb is formed so that it can have a square-shaped surface facing to the light reception surface JS (HBx=HBy). Just as the first embodiment, the formation of blue filter layers 130Bb may be performed using a photolithographic technique or the like.

(B3) Formation of Green Filter Layers 130Gb

Next, as shown in FIG. 10, green filter layers 130Gb are formed.

Here, as shown in FIG. 10, green filter layers 130Gb are formed above the corresponding reception surfaces JS, respectively.

In the present embodiment, the green filter layer 130Gb is of a rectangular shape. Specifically, the green filter layer 130Gb is formed so that it is of a rectangular shape in which the width HGx in the horizontal direction x is longer than the width HGy in the vertical direction (HGx>HGy).

In addition, the green filter layer 130Gb is formed so that it partially overlaps the red filter layer 130Rb or the blue filter layer 130Bb in the horizontal direction X. Therefore, overlapped regions OLrg and OLgb are formed. Just as the first embodiment, the formation of green filter layers 130Gb may be performed using a photolithographic technique or the like.

(C) Conclusion

As described above, just as the first embodiment, as shown in FIG. 10, the distance between the light reception surfaces JS in the horizontal direction x is longer than one in the horizontal direction x. In this case, as described above, the generation of anisotropy of "color mixing" between the horizontal direction x and the vertical direction y may lead to a decrease in image quality.

However, in the present embodiment, as shown in FIG. 10, the overlapped regions OLrg and OLgb are formed in the horizontal direction x. In contrast, in the vertical direction y, on the other hand, there is no overlapped portion between the different color filter layers (130Rb and 130Gb or 130Gb and 130Bb). Therefore, the incident light being entered at a certain angle of inclination with respect to the horizontal direction x passes through a plurality of filter layers (130Rb and 130Gb or 130Gb and 130Bb) with different colors and is then incident on the light reception surface JS on the overlapped regions OLrg and OLgb.

In the present invention, therefore, a difference between the "color mixing" occurs in the pixels P aligned in the horizontal direction x and the "color mixing" occurs in the pixels P aligned in the vertical direction can be reduced just as in the case with the first embodiment.

Just as the first embodiment, therefore, the present embodiment can prevent the generation of "color mixing" anisotropy and attain an improvement in image quality.

3. Embodiment 3

(A) Configuration of Device and so on

Figure 14:
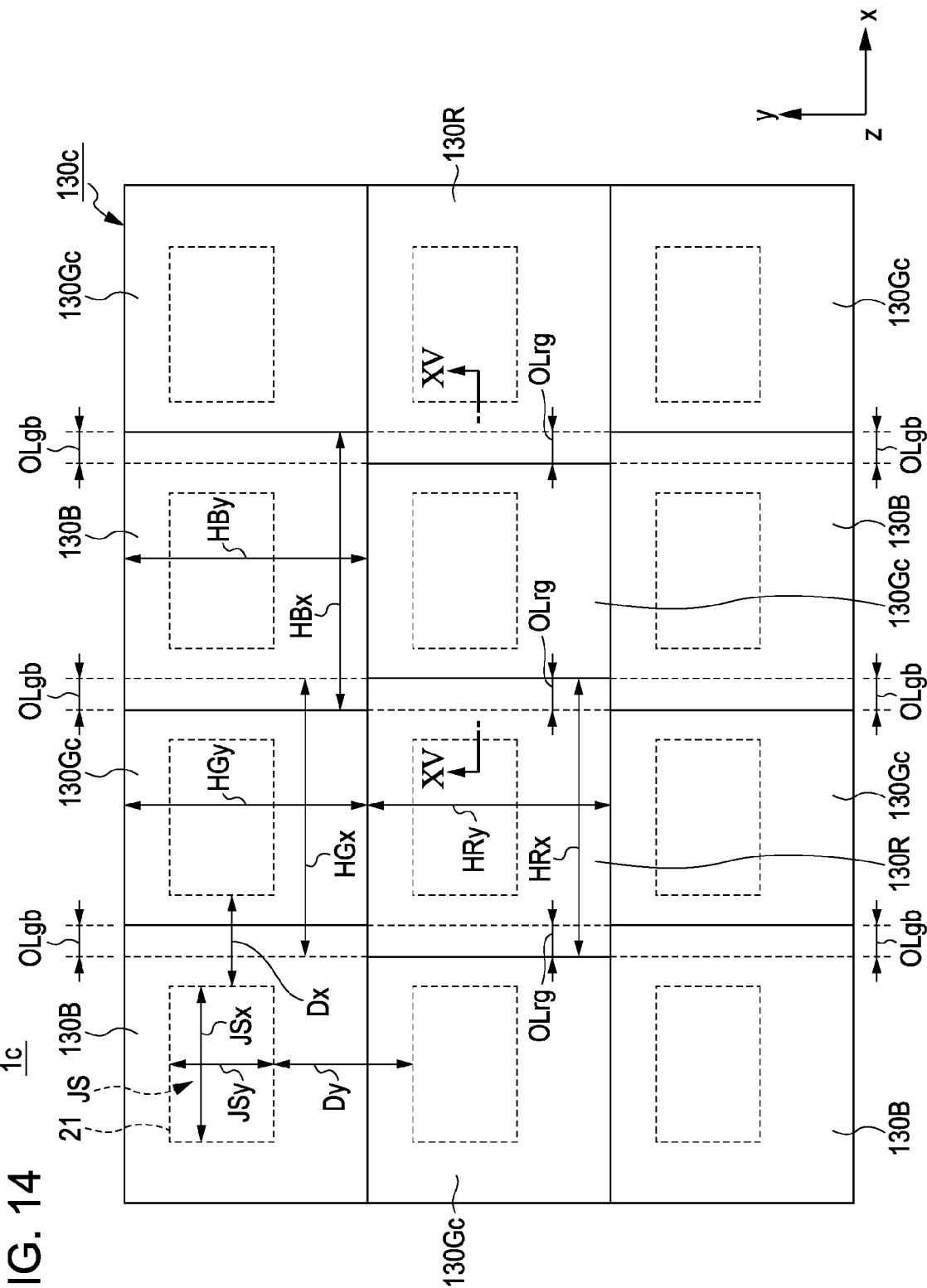
FIG. 14 is a diagram illustrating the main part of a solid-state image pickup device 1c according to the second embodiment of the present invention.
Figure 15:
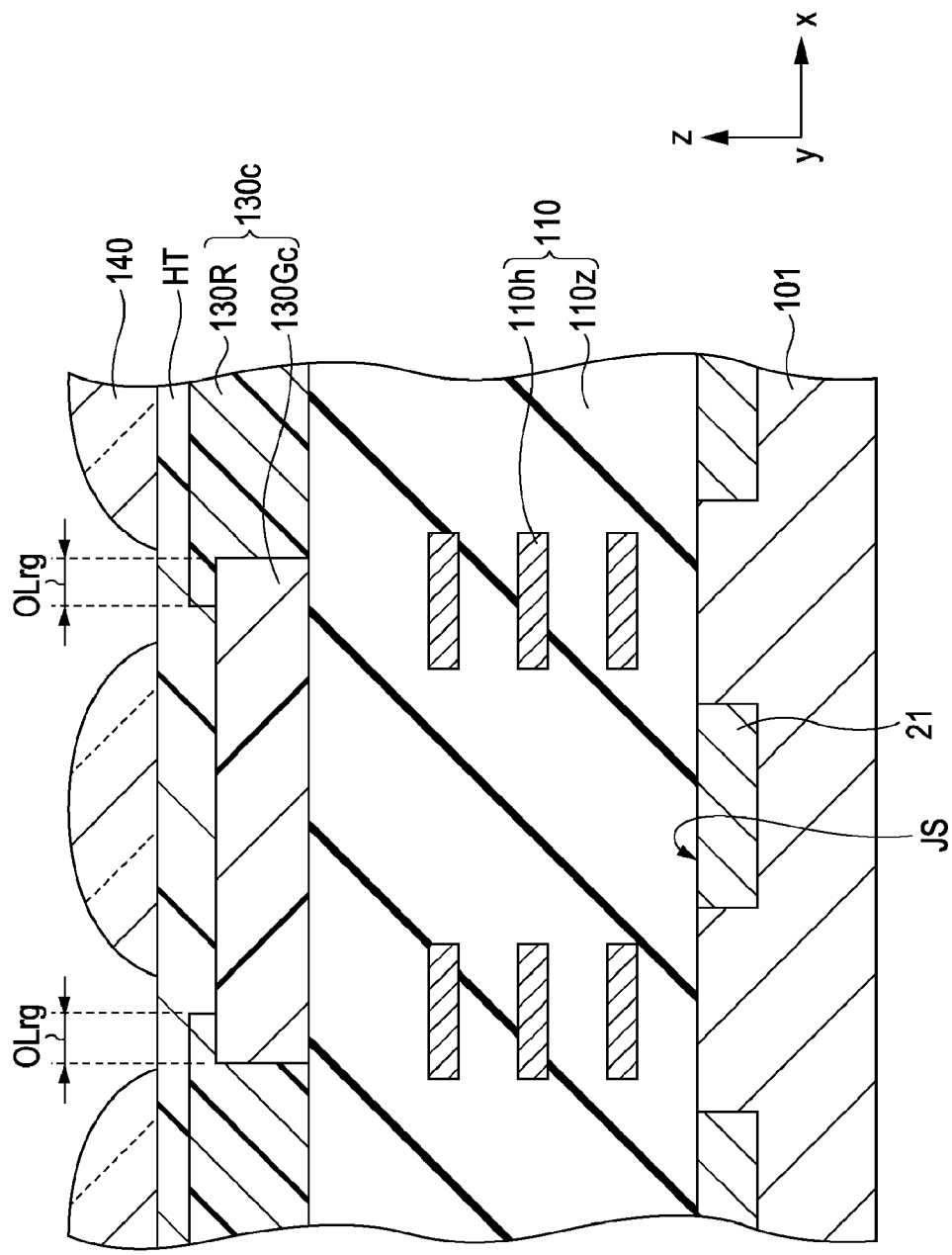
FIG. 15 is a diagram illustrating the main part of the solid-state image pickup device 1c according to the second embodiment of the present invention.

Each of FIG. 14 and FIG. 15 is a diagram illustrating the main part of a solid-state image pickup device 1c according to a second embodiment of the present invention;

Here, FIG. 14 illustrates the upper surface of the image-pickup region PA just as FIG. 5. Just as FIG. 6, FIG. 15 illustrates a cross-sectional view of the image-pickup region PA along the line XV-XV in FIG. 14.

As shown in FIG. 14 and FIG. 15, the main part of a solid-state image pickup device 1c according to the third embodiment of the present invention is similar to that of the first embodiment except for a color filter 130c. Thus, the same structural elements as those of the first embodiment are designated by the same reference numerals and their detail description will be omitted.

As shown in FIG. 14, just as in the case with the first embodiment, the color filter 130c includes a red filter layer 130R, a green filter layer 130Gc, and a blue filter layer 130B. In addition, the red filter layer 130R, the green filter layer 130Gc, and the blue filter layer 130B are arranged in a Bayer arrangement.

Just as the first embodiment, as shown in FIG. 15, the color filter 130c is formed above the surface of the substrate 101 so that it can be located above the wiring layer 110.

The color filter 130c includes the red filter layer 130R, the green filter layer 130G, which are the same as those in the first embodiment. However, the green filter layer 130Gc differs from one in the first embodiment.

In the color filter 130c, as shown in FIG. 10, the green filter layer 130Gc is arranged above the light reception surface JS just as in the case with the first embodiment.

In the present embodiment, the green filter layer 130Gc is of a rectangular shape just as the red filter layer 130R and the blue filter layer 130B. Here, the green filter layer 130Gc is formed so that it is of a rectangular shape in which the width HGx in the horizontal direction x is longer than the width HGy in the vertical direction (HGx>HGy).

Then, the green filter layer 130Gc is formed so that it partially overlaps the red filter layer 130R or the blue filter layer 130B in the horizontal direction X, thereby forming overlapped regions OLrg and OLgb.

Just as the first embodiment, as shown in FIG. 14, the overlapped region OLrg on which the red filter layer 130R and the green filter layer 130Gc are laminated is formed in the horizontal direction x. In this overlapped region OLrg, as shown in FIG. 15, the red filter layer 130R is laminated on part of the upper surface of the green filter layer 130Gc just as in the case with the first embodiment.

In the horizontal direction x, as shown in FIG. 14, the overlapped region OLgb on which the green filter layer 130Gc and the blue filter layer 130B are laminated is also formed.

In this overlapped region OLrb, but the cross-sectional view thereof is not shown in the figure, the blue filter layer 130B is laminated on part of the upper surface of the green filter layer 130Gc just as in the case with the overlapped region OLrg.

Therefore, in the horizontal direction x, overlapped regions OLrg and OLgb where different color filter layers are overlapped (130R and 130Gc or 130Gc and 130B) are formed.

In the vertical direction y, on the other hand, there is no overlapped portion between the different color filter layers (130R and 130Gc or 130Gc and 130B). The lateral sides of neighboring layers touch to each other.

In other words, in the present embodiment, just as in the case with the first embodiment, the surface on which different color filter layers are laminated in the horizontal direction x is larger than the surface on which different color filters are laminated in the vertical direction y.

(B) Manufacturing Method

Hereinafter, a method of manufacturing the main part of the above solid-state image pickup device 1c will be described. Here, the process of forming the color filter 130c in the solid-state image pickup device 1c will be described in detail.

Figure 16:
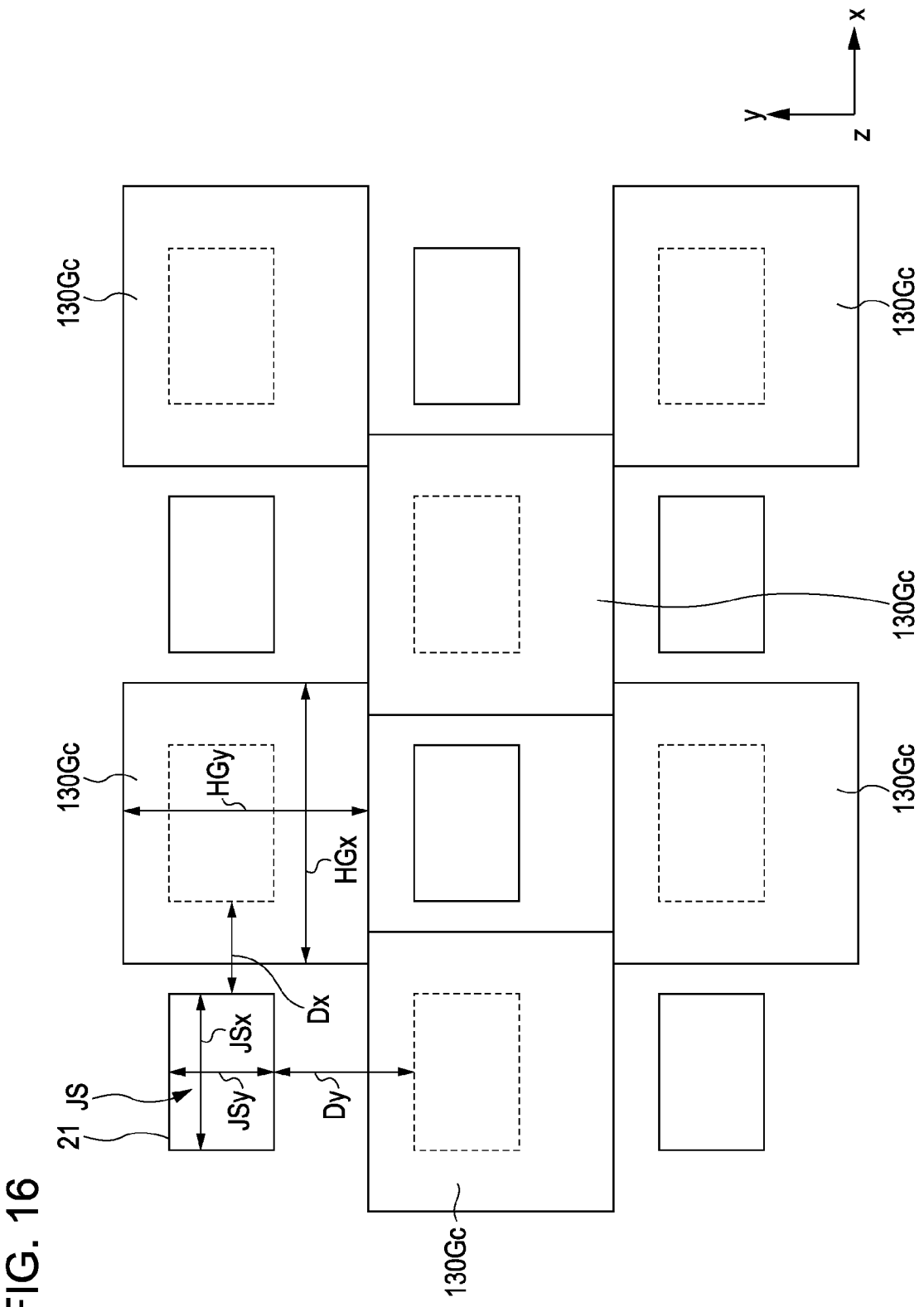
FIG. 16 is a diagram illustrating the main part formed in each step of a method of manufacturing the solid state image pickup device 1c according to a third embodiment of the present invention.
Figure 17:
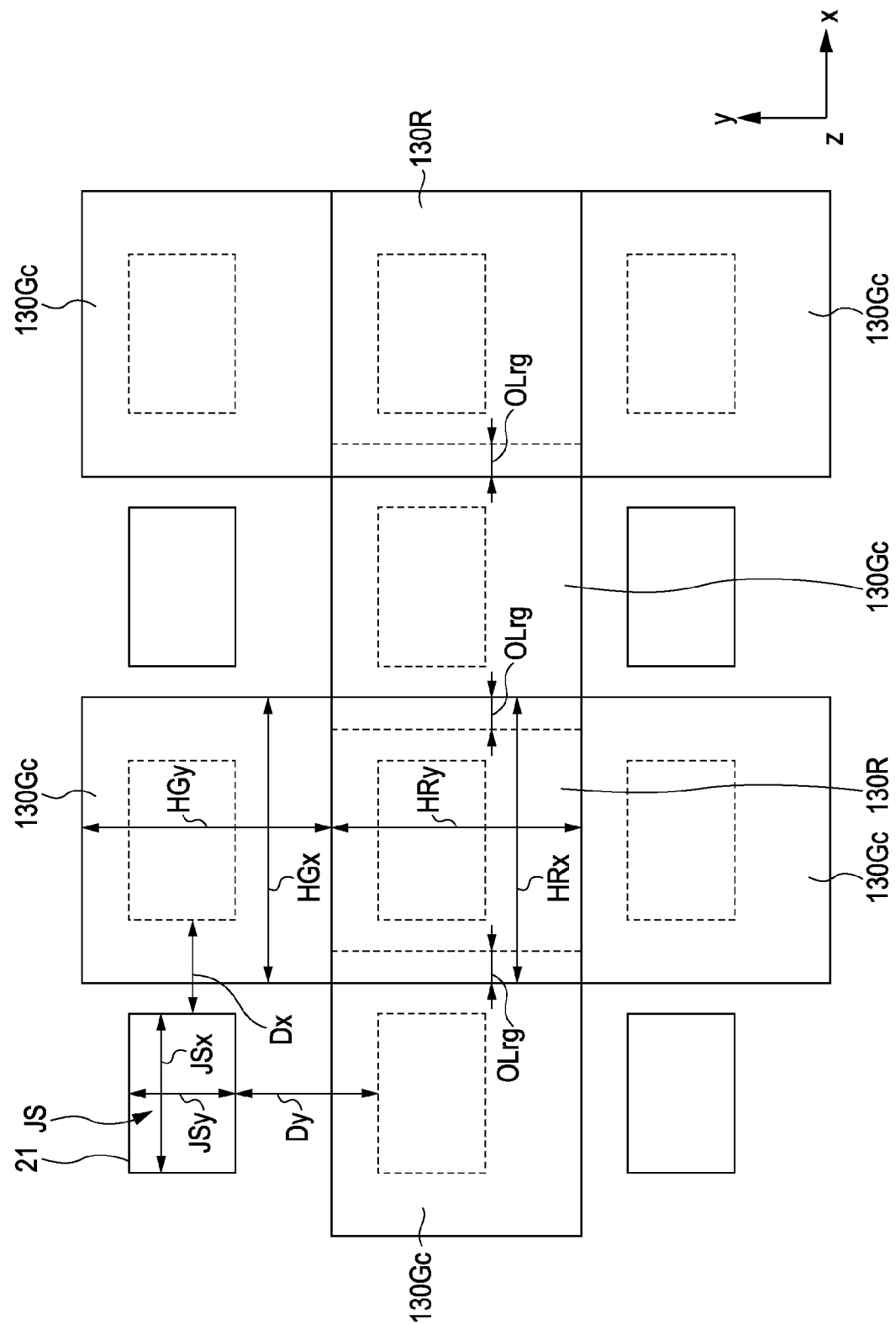
FIG. 17 is a diagram illustrating the main part formed in each step of a method of manufacturing the solid state image pickup device 1c according to the third embodiment of the present invention.

Each of FIG. 16 and FIG. 17 is a diagram illustrating the main part formed in each step of the method of manufacturing the solid state image pickup device 1c according to the third embodiment of the present invention. Each of FIG. 16 and FIG. 17 illustrates the upper surface of the image-pickup region PA just as FIG. 14.

(B1) Formation of Green Filter Layers 130G

First, as shown in FIG. 15, the green filter layers 130Gc are formed.

Next, as shown in FIG. 16, green filter layers 130G are formed above the corresponding reception surfaces JS, respectively.

In this embodiment, which is different from the first embodiment, the green filter layer 130Gc is formed so that it is of a rectangular shape in which the width HGx in the horizontal direction x is longer than the width HGy in the vertical direction. Just as the first embodiment, the formation of green filter layers 130Gc may be performed using a photolithographic technique or the like.

(B-2) Formation of Red Filter Layers 130R

Next, as shown in FIG. 17, red filter layers 130R are formed.

Here, as shown in FIG. 17, red filter layers 130R are formed above the corresponding reception surfaces JS, respectively.

In this embodiment as shown in FIG. 17 just as in the case with the first embodiment, Specifically, the red filter layer 130R is formed so that it is of a rectangular shape in which the width HRx in the horizontal direction x is longer than the width HRy in the vertical direction (HRx>HRy). In addition, the red filter layer 130R is formed so that it partially overlaps the green filter layer 130Gc in the horizontal direction X. Thus, as shown in FIG. 17, the overlapped region OLrg on which the red filter layer 130R and the green filter layer 130Gc are laminated is also formed. Just as the first embodiment, the formation of red filter layers 130R may be performed using a photolithographic technique or the like just as in the case with the first embodiment.

(B3) Formation of Blue Filter Layers 130b

Next, as shown in FIG. 14, blue filter layers 130B are formed.

Here, as shown in FIG. 14, blue filter layers 130B are formed above the corresponding reception surfaces JS, respectively.

In the present embodiment, the blue filter layer 130B is formed so that it is of a rectangular shape in which the width HBx in the horizontal direction x is longer than the width HBy in the vertical direction. In addition, the blue filter layer 130B is formed so that it partially overlaps the green filter layer 130G in the horizontal direction X. Thus, as shown in FIG. 14, the overlapped region OLgb on which the blue filter layer 130B and the green filter layer 130G are laminated is also formed. Just as the first embodiment, the formation of blue filter layers 130B may be performed using a photolithographic technique or the like.

(C) Conclusion

As described above, just as the first embodiment, as shown in FIG. 14, the distance between the light reception surfaces JS in the horizontal direction x is longer than one in the horizontal direction x. In this case, as described above, the generation of anisotropy of "color mixing" between the horizontal direction x and the vertical direction y may lead to a decrease in image quality.

However, in the present embodiment, as shown in FIG. 14, the overlapped regions OLrg and OLgb are formed in the horizontal direction x. In contrast, in the vertical direction y, on the other hand, there is no overlapped portion between the different color filter layers (130Rb and 130Gc or 130Gc and 130Bb).

Therefore, the incident light being entered at a certain angle of inclination with respect to the horizontal direction x passes through a plurality of filter layers (130R and 130Gc or 130Gc and 130B) with different colors and is then incident on the light reception surface JS on the overlapped regions OLrg and OLgb.

In the present invention, therefore, a difference between the "color mixing" occurs in the pixels P aligned in the horizontal direction x and the "color mixing" occurs in the pixels P aligned in the vertical direction can be reduced just as in the case with the first embodiment.

In the present embodiment, each of the red filter layer 130R, the green filter layer 130Gc, and the blue filter 130B is of a rectangular shape. In addition, part of the green filter layer 130Gb and part of the red filter layer 130R or the blue filter layer 130B are formed so that it partially overlaps the red filter layer 130R or the blue filter layer 130B in the horizontal direction X. The overlapped regions OLrg and OLgb in this embodiment have larger surface areas, compared with those of the first embodiment.

Therefore, the present embodiment can prevent the generation of "color mixing" anisotropy and attain an improvement in image quality.

4. Embodiment 4

(A) Configuration of Device and so on

Figure 18:
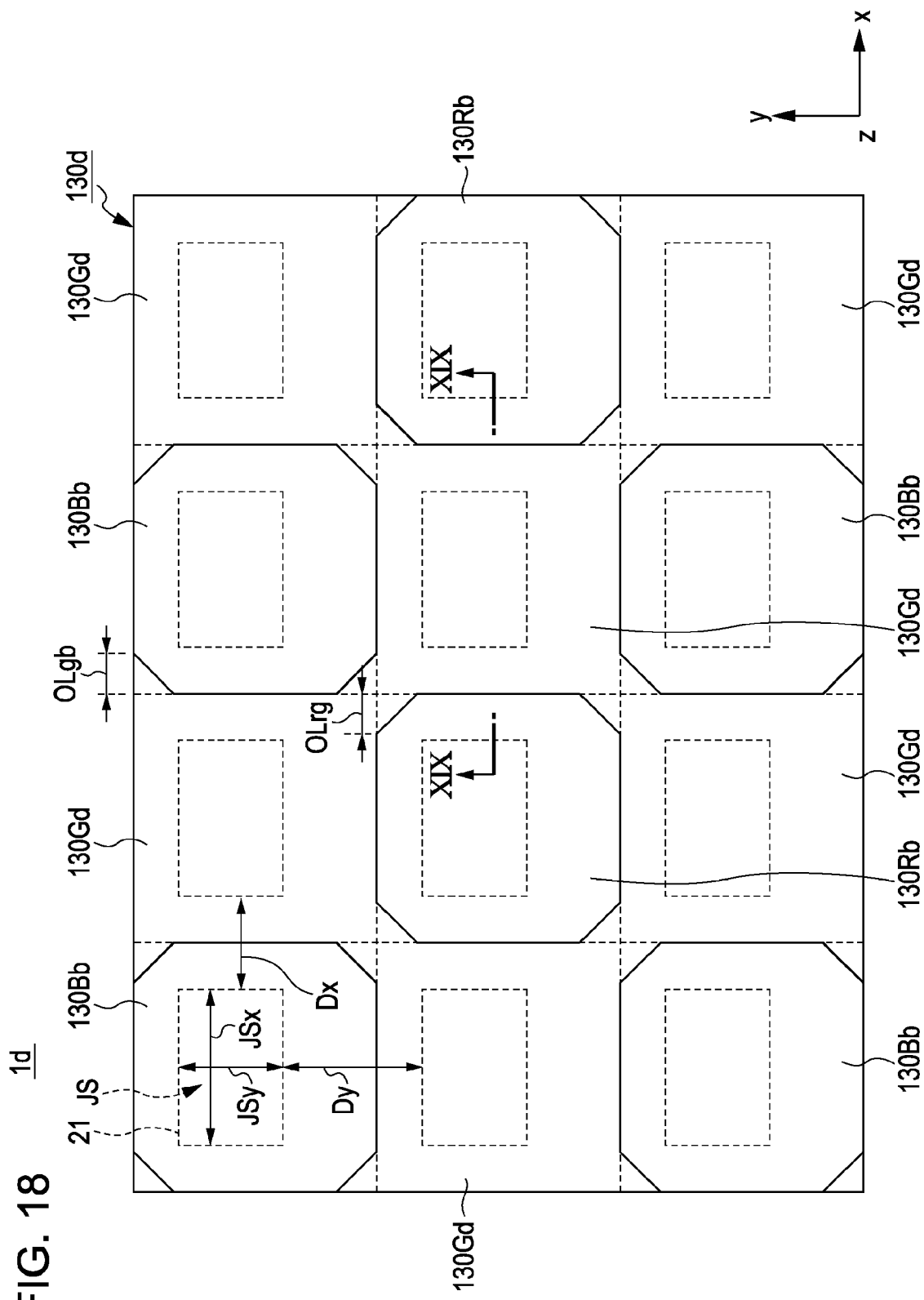
FIG. 18 is a diagram illustrating the main part of a solid-state image pickup device 1d according to a fourth embodiment of the present invention.
Figure 19:
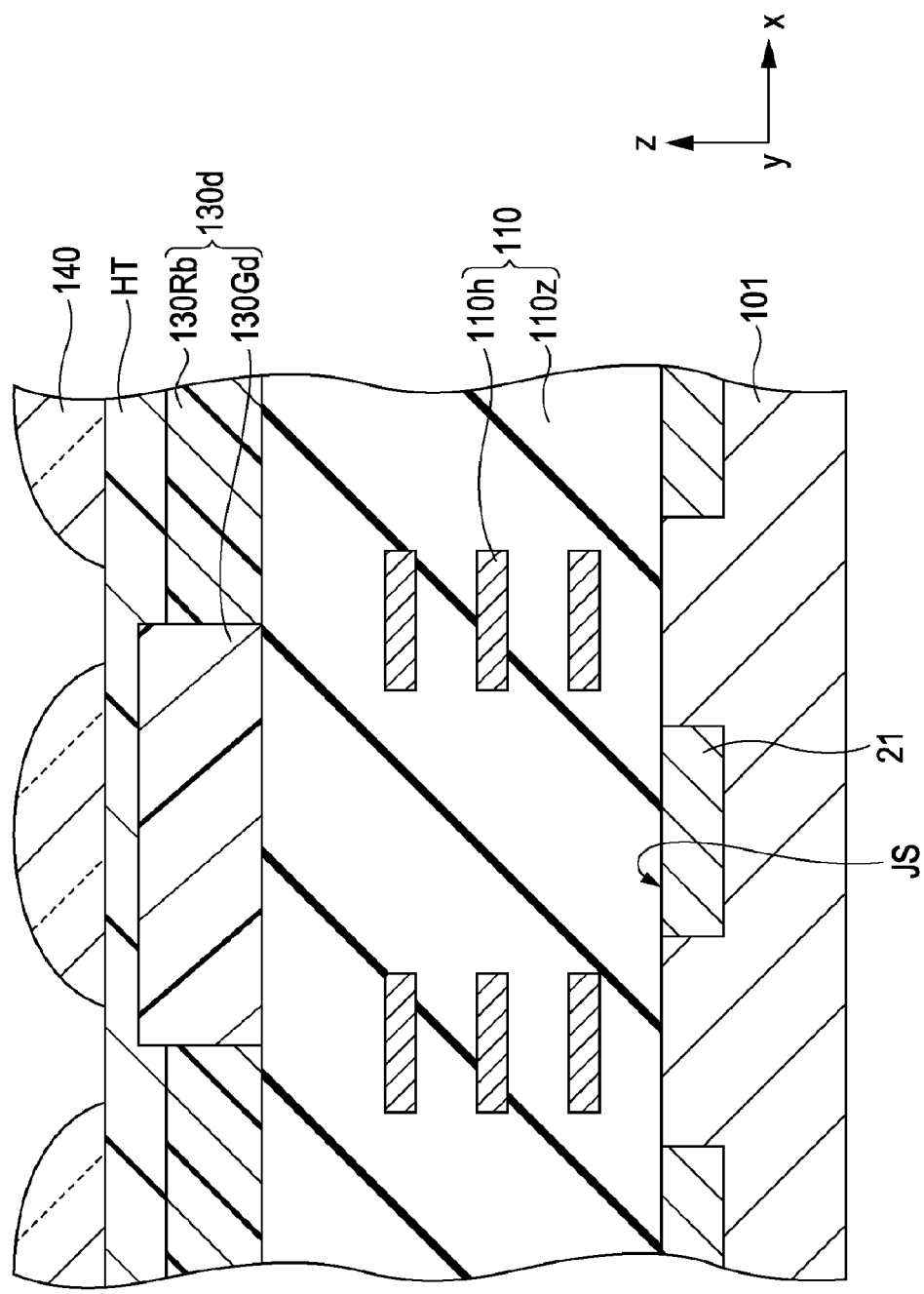
FIG. 19 is a diagram illustrating the main part of the solid-state image pickup device 1d according to the fourth embodiment of the present invention.

Each of FIG. 18 and FIG. 19 is a diagram illustrating the main part of a solid-state image pickup device 1d according to a fourth embodiment of the present invention;

Here, FIG. 18 illustrates the upper surface of the image-pickup region PA just as FIG. 5. Just as FIG. 6, FIG. 19 illustrates a cross-sectional view of the image-pickup region PA along the line XIX-XIX in FIG. 18.

As shown in FIG. 18 and FIG. 19, the main part of a solid-state image pickup device 1d according to the fourth embodiment of the present invention is similar to that of the second embodiment except for a color filter 130d. Thus, the same structural elements as those of the second embodiment are designated by the same reference numerals and their detail description will be omitted.

As shown in FIG. 18, just as in the case with the second embodiment, the color filter 130d includes a red filter layer 130Rb, a green filter layer 130Gd, and a blue filter layer 130Bb. In addition, it is arranged so that blue filter layer 130Bb may be located in a line with red filter layer 130Rb and green filter layer 130Gd by Bayer arrangement.

Just as the second embodiment, as shown in FIG. 18, the color filter 130d is formed above the surface of the substrate 101 so that it can be located above the wiring layer 110.

The color filter 130d includes the red filter layer 130Rb and the blue filter layer 130Bb, which are the same as those in the second embodiment. In the present embodiment, each of the red filter layer 130Rb and the blue filter layer 130Bb is formed in a square shape.

However, the green filter layer 130Gd differs from one in the second embodiment.

In the color filter 130d, as shown in FIG. 18, the green filter layer 130Gd is arranged above the light reception surface JS just as in the case with the second embodiment. In the present embodiment, however, the green filter layer 130Gc is of a square shape just as the red filter layer 130Rb and the blue filter layer 130Bb. Here, the green filter layer 130Gc is formed so that it can include a portion where the width HRx in the horizontal direction x and the width HRy in the vertical direction y are equal to each other (HGx=HGy).

In addition, the green filter layer 130Gd is formed so that it can overlap part of the red filter layer 130Rb and part of the blue filter layer 130Bb at the corners of the green filter layer 130Gd aligned in the diagonal direction as shown in FIG. 18. Therefore, in the color filter 130d, overlapped regions OLrg and OLgb are formed.

Specifically, as shown in FIG. 18, the green filter layer 130Gd is formed so that the green filter layer 130Gd of an isosceles triangle shape can be added to each of four corners of the square-shaped red filter layer 130Rb.

In addition, as shown in FIG. 18, the green filter layer 130Gd is formed so that the green filter layer 130Gd of an isosceles triangle shape can be added to each of four corners of the square-shaped blue filter layer 130Bb.

In this case, each filter layer is formed so that a region where a region shifted from the center of the side to the corner of each of quadrilateral filter layers can overlap another color filter layer extensively, compared with other regions of the filter layer.

(B) Manufacturing Method

Hereinafter, a method of manufacturing the main part of the above solid-state image pickup device 1d will be described. Here, the process of forming the color filter 130d in the solid-state image pickup device 1d will be described in detail.

First, as indicated in the second embodiment, red filter layers 130Rb are formed (see FIG. 12). In other words, red filter layers 130Rb are formed so that it can be of a square shape (HRx=HRy).

Next, as described in the second embodiment, blue filter layers 130Bb are formed (see FIG. 13). In other words, just as the red filter layer 130Rb, the blue filter layer 130Bb is formed so that it can have a square-shaped surface (HBx=HBy).

Next, as shown in FIG. 18, green filter layers 130Gd are formed.

Here, the green filter layer 130Gd is formed so that it can overlap part of the red filter layer 130Rb and part of the blue filter layer 130Bb at the corners of the green filter layer 130Gd aligned in the diagonal direction. Therefore, in the color filter 130d, overlapped regions OLrg and OLgb are formed.

(C) Conclusion

In the present embodiment, as described above, each of the red filter layer 130Rb, the green filter layer 130Gd, and the blue filter 130Bb is formed so that it can be of a square shape. Furthermore, a plurality of the green filter layers 130Gd is arranged in a diagonal direction at a certain angle of inclination with respect to the horizontal direction x and the vertical direction y. In addition, a plurality of green filter layers 130Gd aligned in the diagonal direction is arranged so that each of them can be adjacent to the blue filter layer 130Bb or the red filter layer 130Rb in the horizontal direction x or the vertical direction y. Here, the green filter layer 130Gd is formed so that it can overlap part of the blue filter layer 130Bb or part of the red filter layer 130Rb at the corners of the green filter layer 130Gd aligned in the diagonal direction.

Therefore, the present embodiment can prevent the generation of "color mixing" anisotropy and attain an improvement in image quality, where the "color mixing" is attributable to incident light being entered in the diagonal direction.

Furthermore, in the present embodiment, a plurality of the green filter layers 130Gd is arranged and connected to one another at their respective corners in the diagonal direction. Thus, the green filter layers 130Gd can be prevented from being peeled off.

Therefore, the present embodiment can easily realize an improvement in yield of a product and an increase in reliability of the product.

5. Embodiment 5

(A) Configuration of Device and so on

Figure 20:
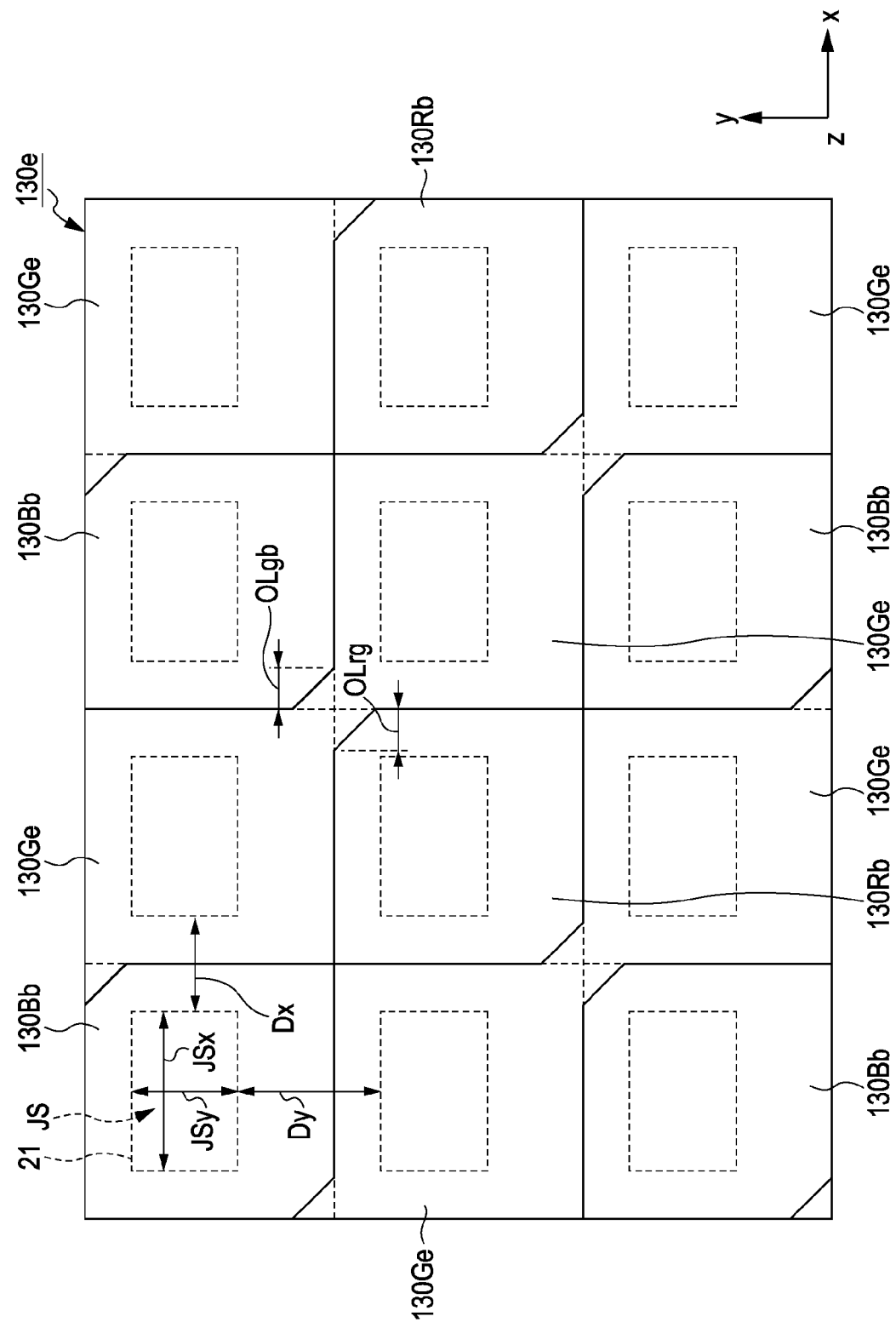
FIG. 20 is a diagram illustrating the main part of a solid-state image pickup device 1e according to a fifth embodiment of the present invention.

FIG. 20 is a diagram illustrating the main part of a solid-state image pickup device 1e according to a fifth embodiment of the present invention. FIG. 20 illustrates the upper surface of the image-pickup region PA just as FIG. 5.

As shown in FIG. 20, the configuration of the solid-state image pickup device 1e of the present invention is similar to that of the fourth embodiment except for a color filter 130e. Thus, the same structural elements as those of the fourth embodiment are designated by the same reference numerals and their detail description will be omitted.

As shown in FIG. 20, just as in the case with the fourth embodiment, the color filter 130e includes a red filter layer 130Rb, a green filter layer 130Ge, and a blue filter layer 130Bb. In addition, the red filter layer 130Rb, the green filter layer 130Ge, and the blue filter layer 130Bb are arranged in a Bayer arrangement.

The color filter 130e includes the red filter layer 130Rb and the blue filter layer 130Bb and each of them is of a square shape just as in the case with the fourth embodiment.

However, the green filter layer 130Ge differs from one in the fourth embodiment.

Here, the green filter layer 130Ge is formed so that it can overlap part of the red filter layer 130Rb and part of the blue filter layer 130Bb at the corners of the green filter layer 130Gd aligned in the diagonal direction as shown in FIG. 20. Therefore, in the color filter 130e, overlapped regions OLrg and OLgb are formed.

Specifically, as shown in FIG. 20, which is different from the fourth embodiment, the green filter layer 130Gd is formed so that the green filter layer 130Gd of an isosceles triangle shape can be added to two corners of the square-shaped red filter layer 130Rb.

In addition, as shown in FIG. 20, which is different from the fourth embodiment, the green filter layer 130Gd is formed so that the green filter layer 130Gd of an isosceles triangle shape can be added to two corners of the square-shaped blue filter layer 130Bb.

(B) Conclusion

In this embodiment just as the fourth embodiment, as described above, a plurality of the green filter layers 130Ge is arranged in a diagonal direction at a certain angle of inclination with respect to the horizontal direction x and the vertical direction y. Here, the green filter layer 130Ge is formed so that it can overlap part of the blue filter layer 130Bb or part of the red filter layer 130Rb at the corners of the green filter layer 130Gd aligned in the diagonal direction.

Therefore, just as the fourth embodiment, the present embodiment can prevent the generation of "color mixing" anisotropy and attain an improvement in image quality, where the "color mixing" is attributable to incident light being entered in the diagonal direction.

Furthermore, in the present embodiment, a plurality of the green filter layers 130Ge is arranged and connected to one another at their respective corners in the diagonal direction. Thus, the green filter layers 130Ge can be prevented from being peeled off just as in the case with the fourth embodiment.

Therefore, the present embodiment can easily realize an improvement in yield of a product and an increase in reliability of the product.

6. Embodiment 6

(A) Configuration of Device and so on

Figure 21:
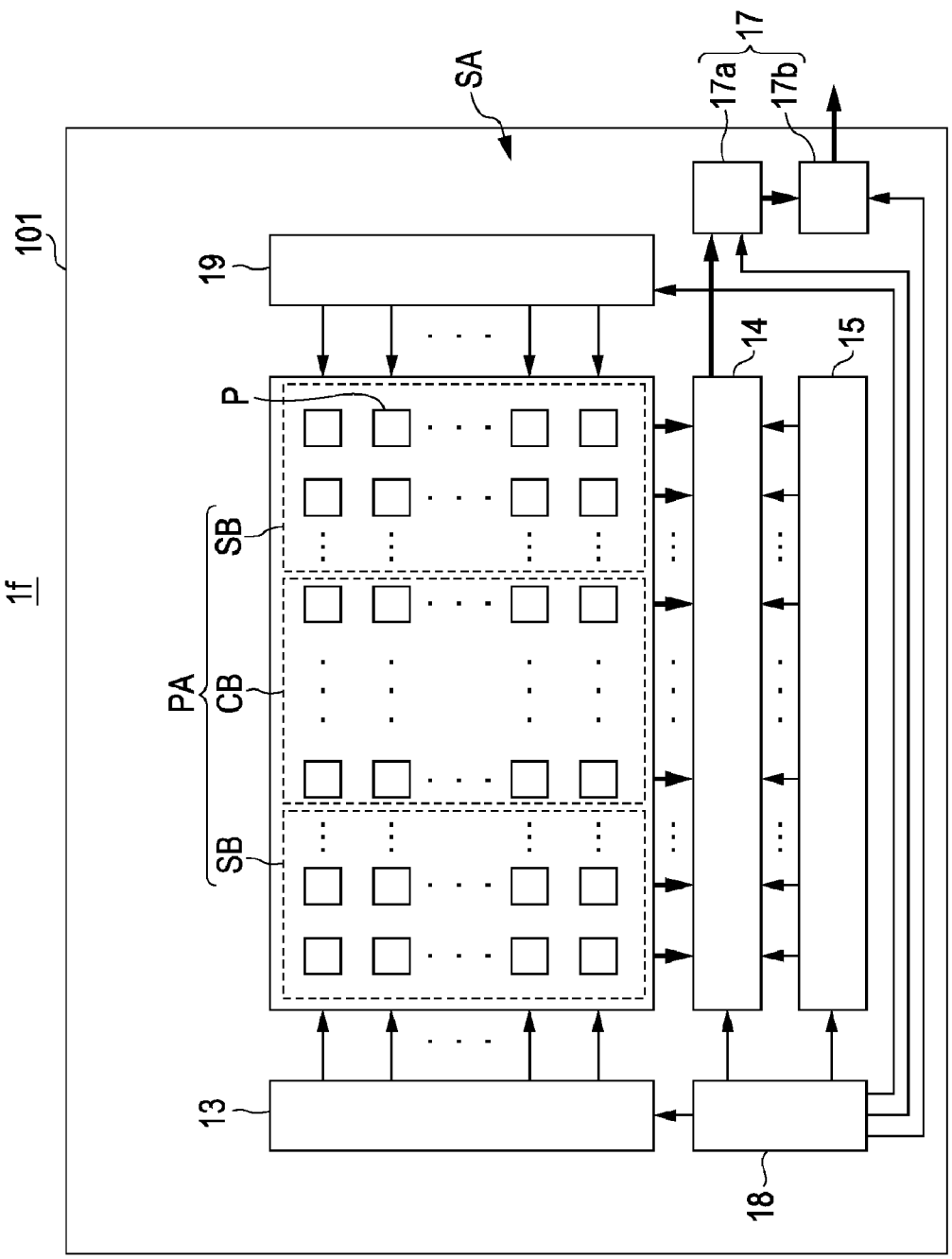
FIG. 21 is a diagram illustrating the main part of a solid-state image pickup device if according to a fifth embodiment of the present invention.
Figure 22:
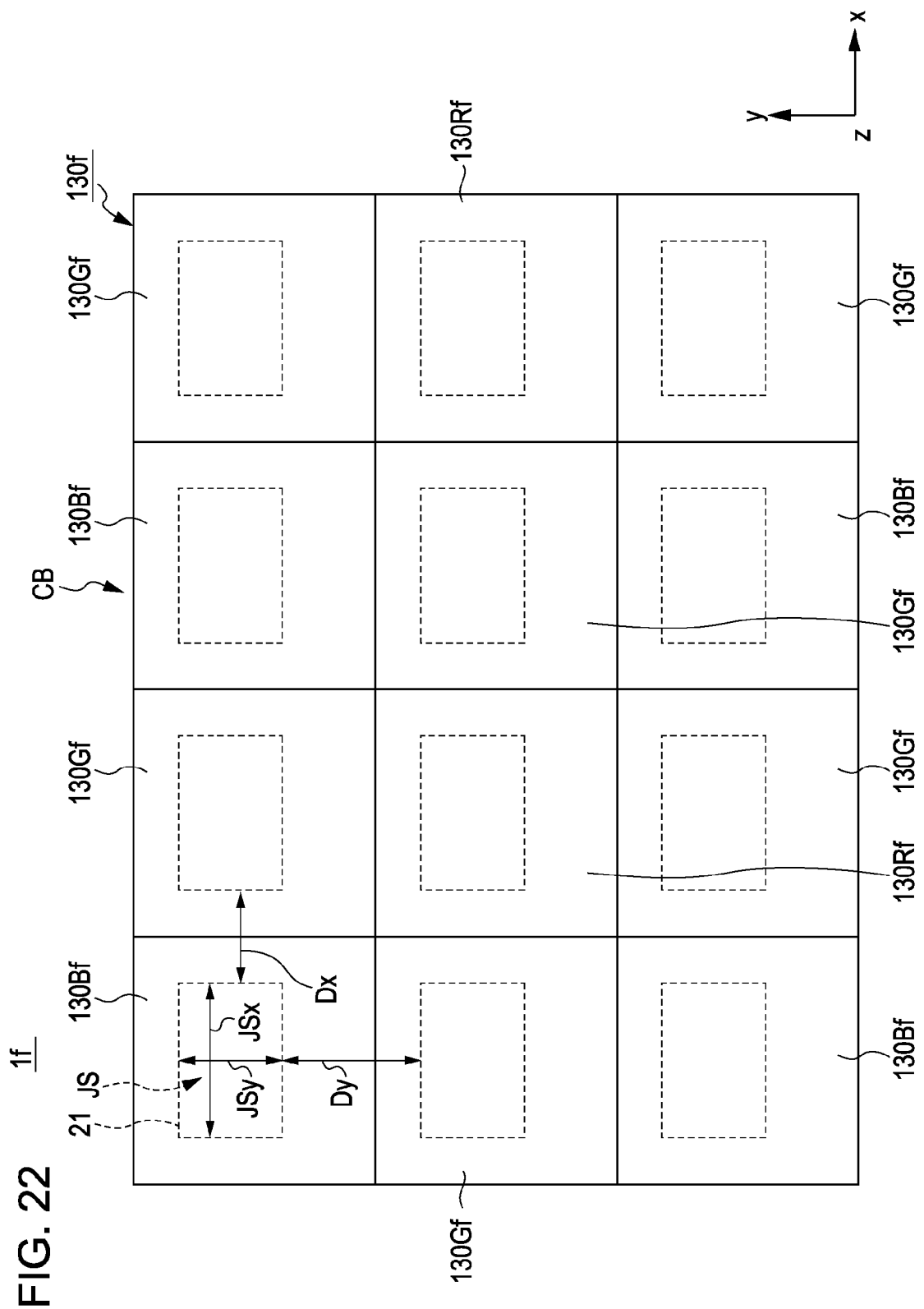
FIG. 22 is a diagram illustrating the main part of the solid-state image pickup device if according to the sixth embodiment of the present invention.
Figure 23:
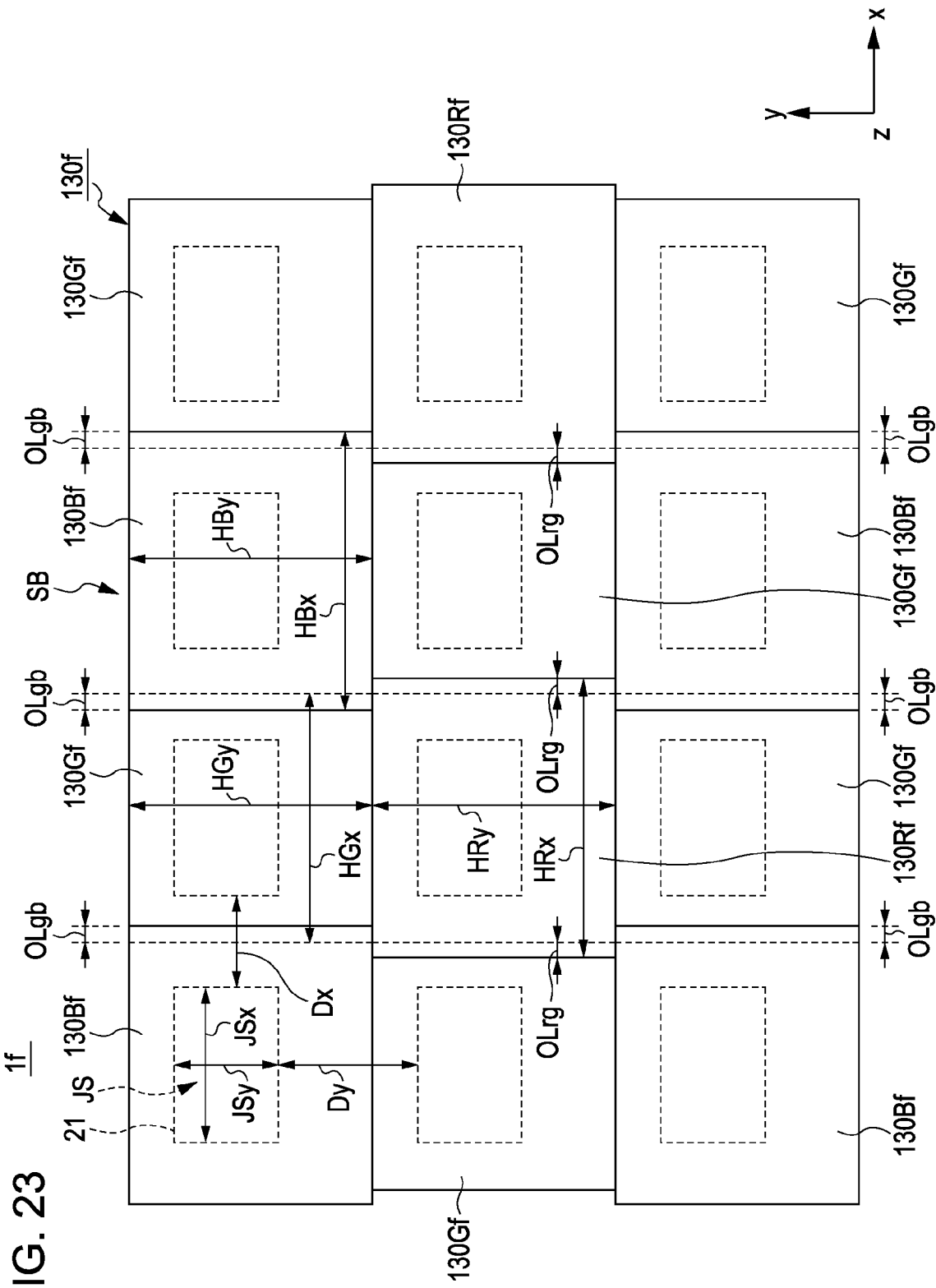
FIG. 23 is a diagram illustrating the main part of the solid-state image pickup device if according to the sixth embodiment of the present invention.

Each of FIGS. 21, 22, and 23 illustrates the main part of a solid-state image pickup device if according to the sixth embodiment of the present invention.

Here, just as FIG. 2, FIG. 21 is a block diagram illustrating the entire configuration of the solid-state image pickup device 1f. Just as FIG. 5, each of FIG. 22 and FIG. 23 illustrates the upper surface of the image-pickup region PA. In addition, FIG. 22 illustrates the center portion CB of the image-pickup region PA shown in FIG. 21. FIG. 23 illustrates the side portion SB of the image-pickup region PA shown in FIG. 21.

As shown in FIG. 21, the image-pickup region PA of the present invention is different from one of the first embodiment. As shown in FIG. 22 and FIG. 23, the main part of a solid-state image pickup device if according to the sixth embodiment of the present invention is similar to that of the first embodiment except for a color filter 130f. Thus, the same structural elements as those of the first embodiment are designated by the same reference numerals and their detail description will be omitted.

Just as the first embodiment, the solid-state image pickup device if of the present embodiment is a CMOS image sensor having a substrate 101 as shown in FIG. 21. An image-pickup region PA and a peripheral region SA are formed on the surface of the substrate 101.

However, unlike the first embodiment, the image-pickup region PA is divided into a center portion CB and a side portion SB as shown in FIG. 21.

As shown FIG. 21, the center portion CB is located at the center of the image-pickup region PA in the horizontal direction x. Thus, the pixels P arranged on the center portion CB of the image-pickup region PA receives the principal ray (H1 in FIG. 1) which is incident thereon at right angle to the surface of the image-pickup region PA.

On the other hand, the side portions SB are located so that they can sandwich the center portion CB of the image-pickup region PA in the horizontal direction x. Thus, the pixels P arranged on the side portions SB of the image-pickup region PA receive the principal ray (H2 in FIG. 1) which is incident thereon at a certain angle of inclination in the direction perpendicular to the surface of the image-pickup region PA.

As shown in FIG. 22 and FIG. 23, just as the first embodiment, the color filter 130f includes a red filter layer 130Rf, a green filter layer 130Gf, and a blue filter layer 130Bf. In other words, any of the red filter layer 130Rf, the green filter layer 130Gf, and the blue filter layer 130Bf is provided for each of the pixels P serves as a color filer 130f. Here, the red filter layer 130Rf, the green filter layer 130Gf, and the blue filter layer 130Bf are arranged in a Bayer arrangement.

However, as is evident from the comparison between FIG. 22 and FIG. 23, the configuration of the color filter 130f on the center portion CB is different from one on the side portion SB.

Specifically, unlike the first embodiment, each of the red filter layer 130Rf, the green filter layer 130Gf, and the blue filter 130Bf is formed so that it can be of a square shape on the center portion CB as shown in FIG. 22. In other words, the red filter layer 130Rf, the green filter layer 130Gf, and the blue filter layer 130Bf are formed so that the widths HRx, HGx, and HBx in the horizontal direction x can be equal to the corresponding widths HRy, HGy, and HBy in the vertical direction y.

Furthermore, on the center portion CB as shown in FIG. 22, the red filter layer 130Rf, the green filter layer 130Gf, and the blue filter layer 130Bf are formed so that they can be prevented from overlapping one another in the least.

On the other hand, on the side portion SB as shown in FIG. 23, the green filter layer 130Gf is formed in a square shape just as the first embodiment. However, both the red filter layer 130Rf and the blue filter layer 130Rf are formed in a rectangular shape.

Specifically, on the side portion SB, the red filter layer 130Rf is formed so that the width HRx in the horizontal direction x is longer than the width HRy in the vertical direction y as shown in FIG. 23 (HRx>HRy). Then, the red filter layer 130Rf is formed so that it partially overlaps the green filter layer 130Gf in the horizontal direction X, thereby forming an overlapped region OLrg.

In side edge part SB, as shown in FIG. 23, green filter layer 130Gf is formed so that width HGx in horizontal direction x and width HGy in vertical direction y may become the same. Then, the green filter layer 130Gf is formed so that it partially overlaps the red filter layer 130Rf or the blue filter layer 130Bf in the horizontal direction X, thereby forming overlapped regions OLrg and OLgb.

Furthermore, on the side portion SB, the blue filter layer 130Bf is formed so that the width HBx thereof in the horizontal direction x is longer than the width HBy thereof in the vertical direction y as shown in FIG. 23. Then, the blue filter layer 130Bf is formed so that it partially overlaps the green filter layer 130Gf in the horizontal direction X, thereby forming an overlapped region OLgb.

(B) Conclusion

In the present embodiment, as described above, any overlapped region OLrg or OLgb is not formed on the center portion CB of the image-pickup region PA in the horizontal direction x. On the side portion SB, however, the overlapped regions OLrg and OLgb are formed. In the present embodiment, each of the filter layers 130Rf, 130Gf, and 103Bf is formed so that the surface areas of the overlapped regions OLrg and OLgb can be increased with an increase in distance of its position from the center portion to the end portion on the image-pickup region PA.

As described above, the side portion SB receives the principal ray (H2 in FIG. 1) which is incident thereon at a certain angle of inclination. Thus, "color mixing" occurs more frequently than center portion CB. It means that the side portion SB may cause disadvantages due to the anisotropy of "color mixing" more frequently on than the center portion CB.

However, in this embodiment as described above, the present embodiment makes the generation of "color mixing" equal between the center portion CB and the side portion SB of the image pickup region PA by increasing the surface areas of the overlapped regions OLrg and OLgb on the side portion SB rather than the center portion CB. In other words, the anisotropy of "color mixing" at the position of the image-pickup region PA is being cancelled.

According to the present invention, therefore, the anisotropy of "color mixing" can be effectively prevented from being generated and the image quality can be improved.

7. Others

Furthermore, the embodiments of the present invention are not limited to those described above. Any of various kinds of modifications will be applied.

In any of the above embodiments, the CMOS image sensor has been employed, but not limited thereto. Alternatively, a CCD image sensor may be used. In addition, any of other embodiments of the present invention may include a backside-illumination type in which incident light is received on the backside of a substrate where pixel transistors are arranged on the top side thereof.

Any of the above embodiments has been applied to a camera, but not limited thereto. Any of other embodiments may be applied to any electronic apparatus with a solid-state image pickup device, such as a scanner or a copying machine.

Furthermore, in any of the above embodiments, descriptions have been mainly made on the overlapping of different color filters in the horizontal direction, but not limited thereto.

Alternatively, different color filters may be overlapped to one another in the vertical direction. For instance, different color filters may be overlapped in both the horizontal and vertical directions. Alternatively, different color filters may be overlapped in at least one of horizontal and vertical directions, while the corner portion may be overlapped more than the center portion of the side as described in the fourth and fifth embodiments.

In any of the above embodiments, descriptions have been made on a case in which one quadrilateral color filter overlaps adjacent different color filters at the adjacent two side portions (vertically extended sides) in parallel in the horizontal direction, but not limited thereto. Alternatively, one of two side portions of the quadrilateral filter in parallel in the horizontal direction may be overlapped on the adjacent other color filter.

In any of the above embodiments, descriptions have been made on the Bayer arrangement in which filter layers of three-primary colors, red, blue, and green, but not limited thereto.

Figure 24:
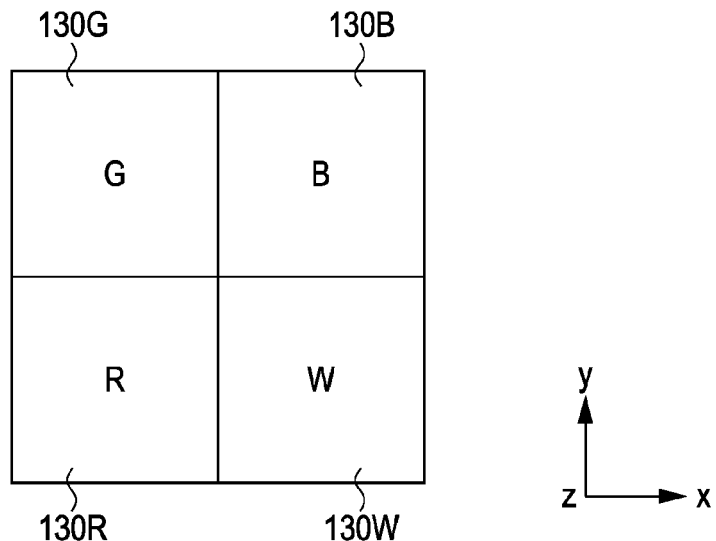
FIG. 24 is a diagram illustrating a coloring arrangement of color filter according to each embodiment of the present invention.
Figure 25:
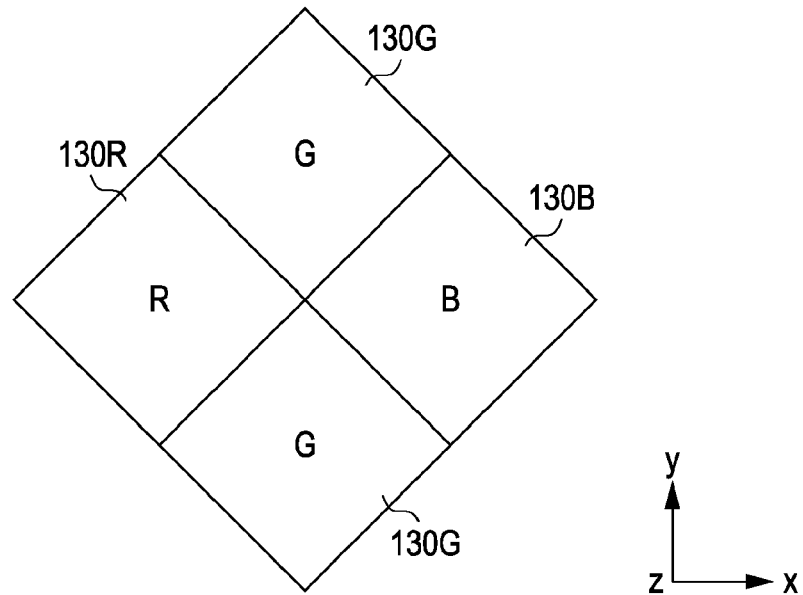
FIG. 25 is a diagram illustrating a coloring arrangement of color filter according to each embodiment of the present invention.
Figure 26:
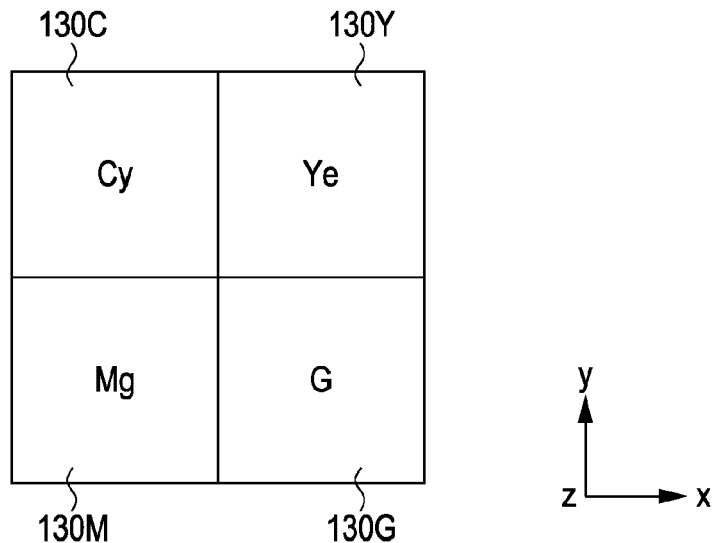
FIG. 26 is a diagram illustrating a coloring arrangement of color filter according to each embodiment of the present invention.

FIGS. 24, 25, and 26 are diagrams illustrating a coloring arrangement of the color filter in the embodiments of the present invention.

As shown in FIG. 24, it is applicable that one of green filter layers 130G being arranged in a Bayer arrangement may serve as a white filter 130W that does not color incident light and then transmits the incident light as white light.

As shown in FIG. 25, it is also applicable that each of the filter layers 130R, 130G, and 130B is not arranged in each of the horizontal direction x and the vertical direction y but arranged at 45 degrees of inclination with respect to each of the horizontal direction x and the vertical direction y. In other words, it is also applicable that two diagonal lines of the green filter layer 130G are arranged along the vertical direction y and both the diagonal line of the red filter layer 130R and the diagonal line of the blue filter layer 130B are arranged along the horizontal direction x.

As shown in FIG. 26, it is also applicable to the formation of a color filter using a combination of a coloring arrangement in which a cyan filter layer 130C, a magenta filter layer 130M, and an yellow filter layer 130Y. In other words it is applicable to filters for complementary color system.

In the above coloring arrangement, just as in the case with the above first embodiment, the advantageous effects of any of the above embodiments of the present invention can be exerted by application of the planar configuration of each filter layer as described in the first embodiment. In the above case, from a view point of an improvement in "sensitivity" and from a view point of preventing the generation of anisotropy of "color mixing", it is preferable to suitably determine the size of the surface on which a different color filter layer is suitably overlapped.

In any of the above embodiments, descriptions have been made on a case in which a set of pixel transistors is installed in each of the photodiodes, but not limited thereto. Here, any embodiment of the present invention is applicable to a case in which pixel transistors or the like are shaped between two or more photodiodes. In addition, an improvement in resolution can be attained by sharing pixel transistors among pixels.

Figure 27:
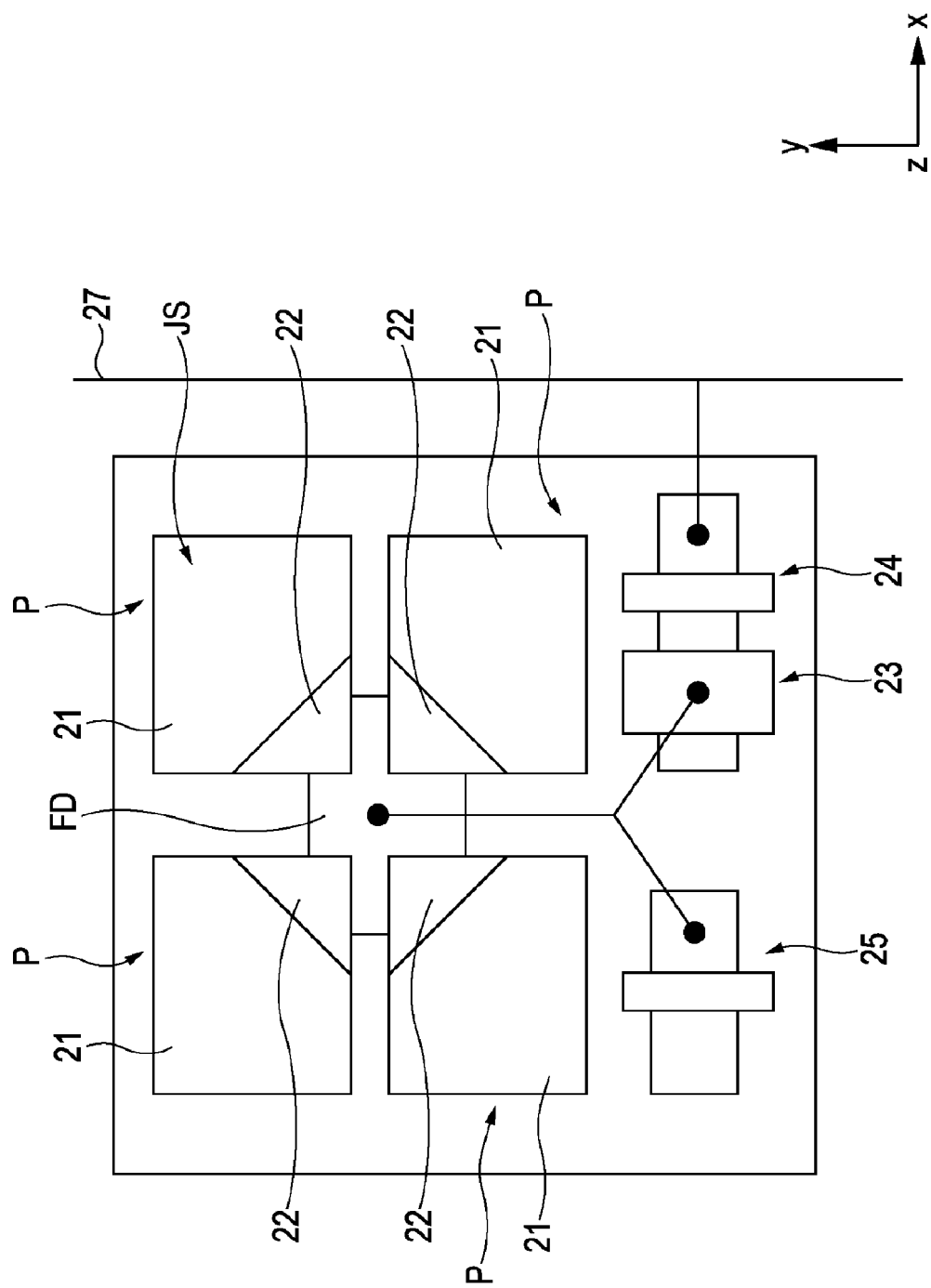
FIG. 27 is a diagram illustrating the main part of the solid-state image pickup device according to the embodiment of the present invention.
Figure 28:
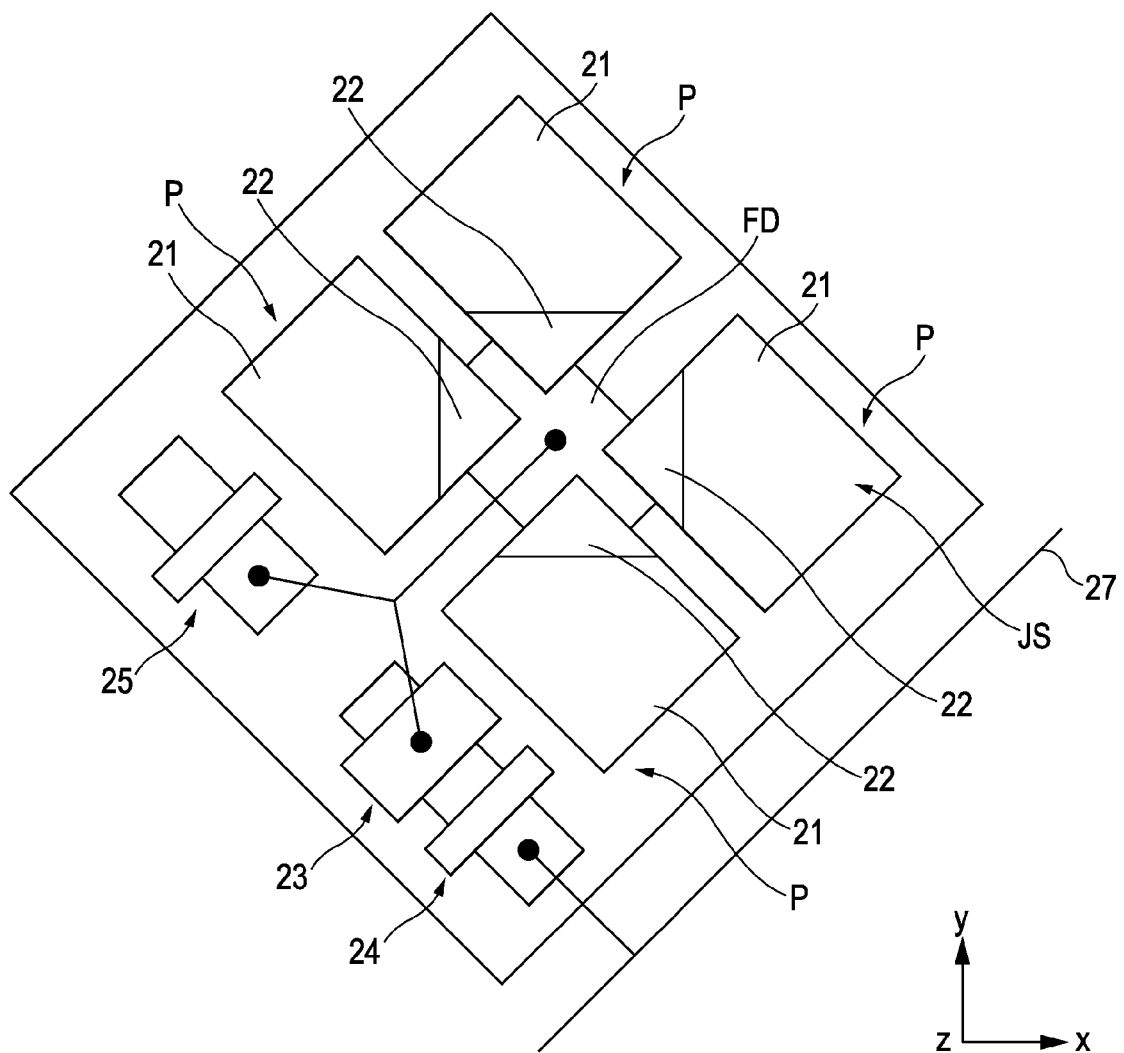
FIG. 28 is a diagram illustrating the main part of the solid-state image pickup device according to the embodiment of the present invention.

Each of FIG. 27 and FIG. 28 is a diagram illustrating the main part of the solid-state image pickup device according to the embodiment of the present invention. Each of FIG. 27 and FIG. 28 illustrates the upper side of the pixel P.

As shown in each of FIG. 27 and FIG. 28, in a set of four pixels P, two light reception surfaces JS of the respective photodiodes 21 are arranged in the direction x and two light reception surfaces JS of the respective photodiodes 21 are arranged in the direction y. One floating diffusion FD is mounted on the center of the entire area of the four pixels P. Then, a transfer transistor 22 is installed between the light reception surface JS of each of four pixels P and the floating diffusion FD. Furthermore, pixel transistors other than the transfer transistor 22 are installed so that they can be shared by four pixels P.

Specifically, the source of each transfer transistor 22 is electrically connected to each photodiode 21 and the drain thereof is electrically connected to the source of one reset transistor 25. Then, one amplification transistor 23 is electrically connected to the floating diffusion FG. Furthermore, the source of the amplification transistor 24 is electrically connected to the drain of one selection transistor. A power supply voltage can be applied to the drain of each of the reset transistor 25 and the amplification transistor 24. In addition, the source of the selection transistor is electrically connected to a vertical signal line.

The above descriptions have been made on a case in which pixels P are arranged in both the directions x and y, but not limited thereto. Alternatively, each of the pixels P may be arranged in the oblique direction with respect to each of the directions x and y. For example, as shown in FIG. 28, the pixels P may be arranged at an angle of 45 degrees of inclination with respect to each of the directions x and y.

Figure 29:
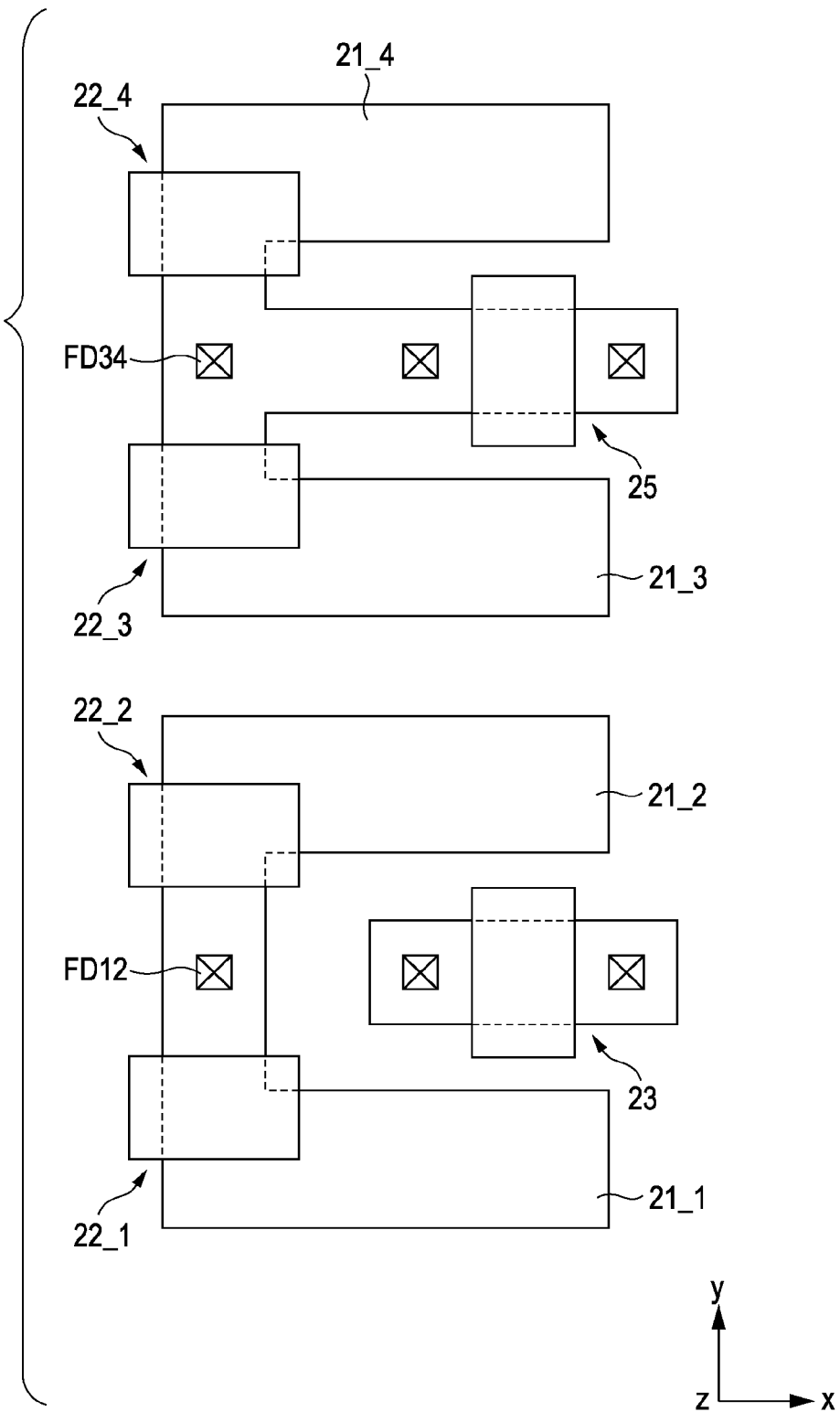
FIG. 29 is a diagram illustrating the main part of the solid-state image pickup device according to the embodiment of the present invention.
Figure 30:
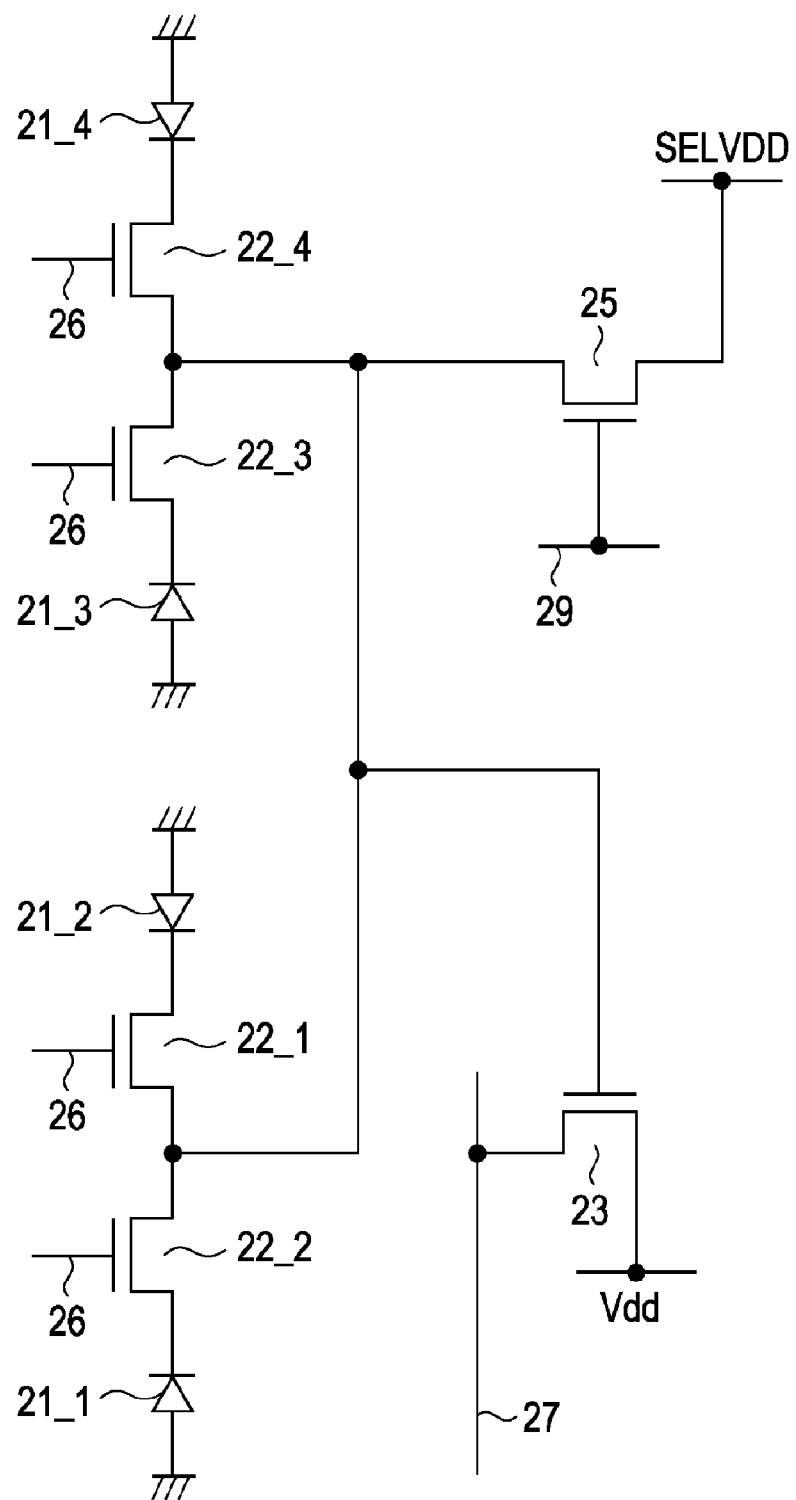
FIG. 30 is a diagram illustrating the main part of the solid-state image pickup device according to the embodiment of the present invention.

Each of FIG. 29 and FIG. 30 is a diagram illustrating the main part of a solid-state image pickup device according to an embodiment of the present invention. Here, FIG. 29 illustrates the upper surface of pixel P. FIG. 30 is a diagram illustrating a circuit configuration of the solid-state image pickup device.

As shown in FIG. 29 and FIG. 30, four pixels P in the vertical direction y may be provided as a combined set.

Here, as shown in FIG. 29 and FIG. 30, four photodiodes 21_1, 21_2, 21_3, and 21_4 are provided with four transfer transistors 22_1, 22_2, 22_3, and 22_4, respectively. Furthermore, one amplification transistor 23 and one reset transistor 25 are provided for an assembly of these components.

Specifically, four photodiodes 21_1, 21_2, 21_3, and 21_4 are arranged at intervals corresponding to the rectangular-shaped light reception surface JS in the horizontal direction x.

Among them, the first floating diffusion FD 12 is arranged on the left side portion between the first photodiode 21_1 and the second photodiode 21_2, which are located below. In addition, the first transfer transistor 22_1 is placed between the first photodiode 21_1 and the first floating diffusion FD 12. Also, the second transfer transistor 22_2 is placed between the second photodiode 21_2 and the first floating fusion FD 12. In addition, the amplification transistor 23 is placed on the right side portion between the first photodiode 21_1 and the second photodiode 21_2.

On the other hand, the second floating diffusion FD34 is formed on the left side portion between the third photodiode 21_3 and the fourth photodiode 21_4 as shown in FIG. 29. Furthermore, the third and fourth transfer transistors 22_3 and 22_4 are formed between the third and fourth photodiodes 21_3 and 21_4 and the second floating diffusion FD34, respectively. Furthermore, the reset transistor 25 is formed on the right side portion between the third photodiode 21_3 and the fourth photodiode 21_4.

The gates of the respective four transfer transistors 22_1, 22_2, 22_3, and 22_4 are electrically connected to transfer lines 26 to which transfer signals are supplied, respectively. Thus, each of transfer transistors 221, 22_2, 22_3, and 22_4 can be turned on with a transfer signal. Therefore, signal charges are transferred from the photodiodes photodiode 21_1, 21_2, 21_3, and 21_4 to the floating diffusions FD12 and FD34, respectively.

The gate of the amplification transistors 23, as shown in FIG. 30, is electrically connected to the floating diffusions FD12 and FD34. The source of the amplification transistor 23 is electrically connected to a vertical signal line 27. The drain of the amplification transistor 23 is electrically connected to a fixed power source Vdd.

As shown in FIG. 30, the reset transistor 25 is electrically connected to a reset line 29 to which a reset signal RST is supplied. The source of the reset transistor 25 is electrically connected to the floating diffusion FD34. The drain of the reset transistor 25 is electrically connected to a selection power supply SELVDD.

Furthermore, as shown in FIG. 30, the lower floating diffusion FD12 and the upper floating diffusion FD34 are electrically connected to each other. In addition, the selection power supply SELVDD can be driven to select any of pixels P by switching a voltage level just as in the case of a selection pulse.

Figure 31:
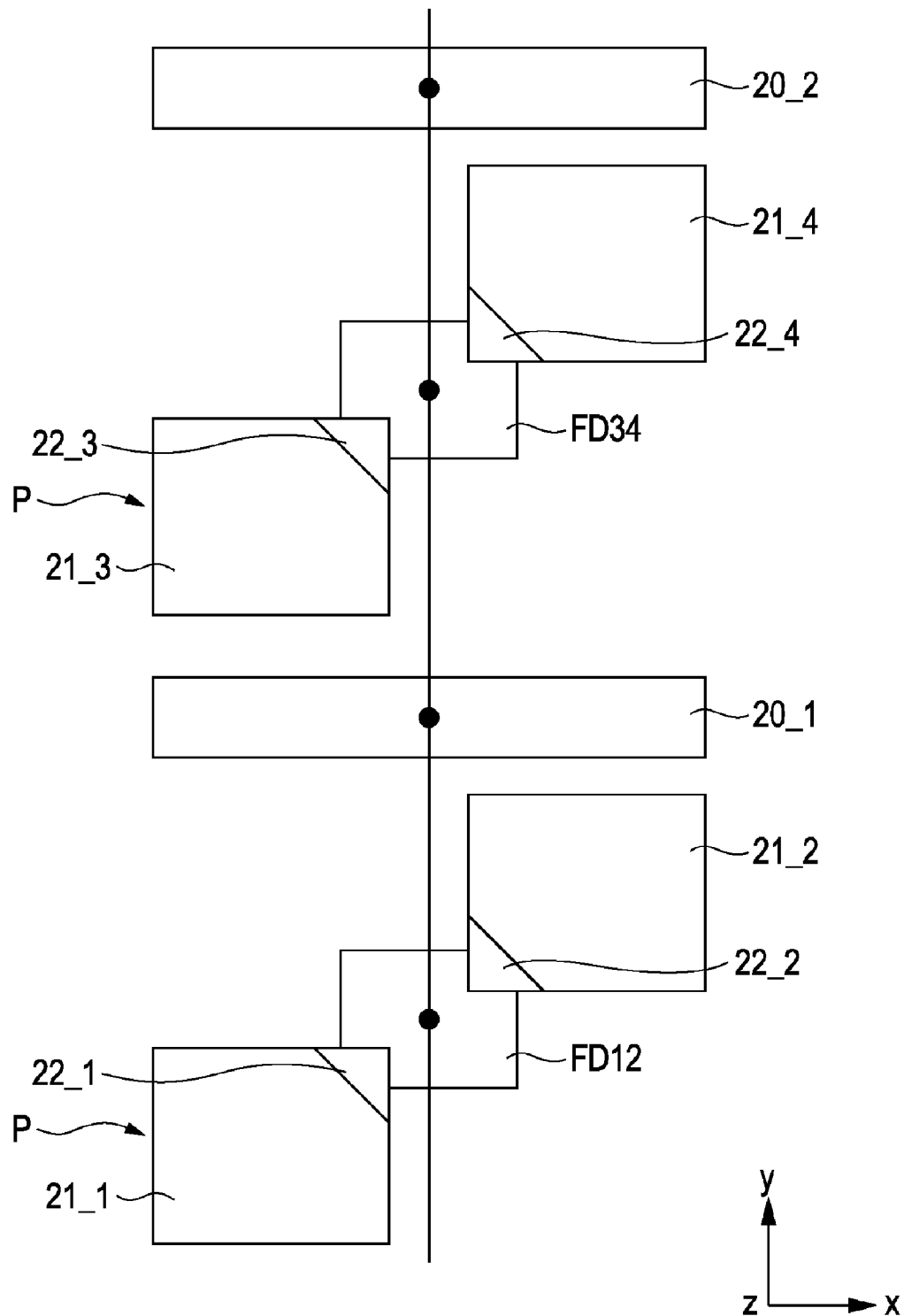
FIG. 31 is a diagram illustrating the main part of the solid-state image pickup device according to the embodiment of the present invention.
Figure 32:
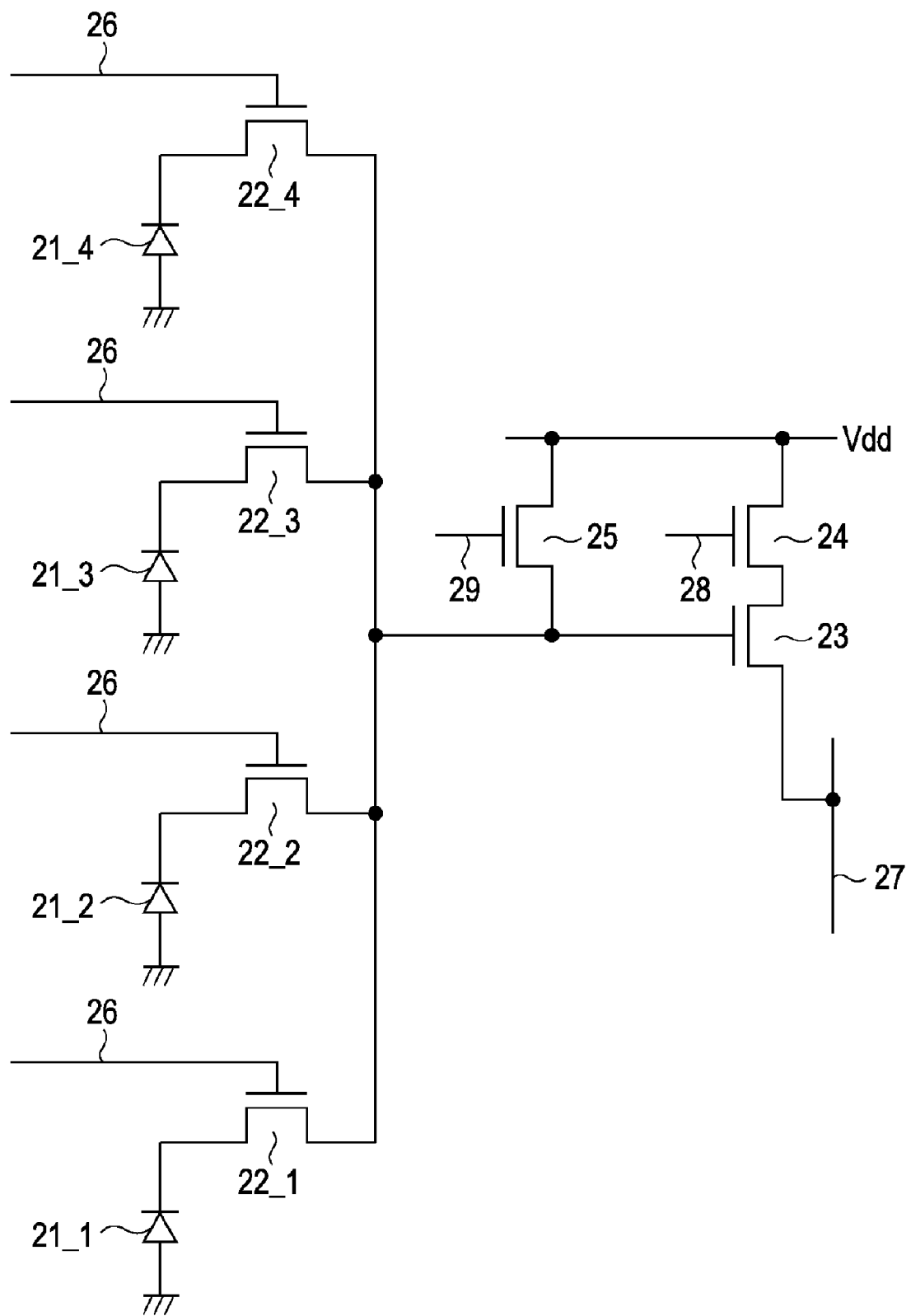
FIG. 32 is a diagram illustrating the main part of the solid-state image pickup device according to the embodiment of the present invention.

Each of FIG. 31 and FIG. 32 is a diagram illustrating the main part of a solid-state image pickup device according to an embodiment of the present invention. Here, FIG. 31 illustrates the upper surface of pixel P. FIG. 32 is a diagram illustrating a circuit configuration of the solid-state image pickup device.

As shown in FIG. 31 and FIG. 32, four pixels P in total may be provided as a combined set including two combinations of two pixels P aligned in a diagonal direction inclined with respect to the horizontal direction x and vertical direction y.

Here, as shown in FIG. 31 and FIG. 32, four transfer transistors 22_1, 22_2, 22_3, and 22_4 are provided for four photodiodes 21_1, 21_2, 21_3, and 21_4, respectively.

Furthermore, two transistor regions 20_1 and 20_2 are provided for these components. As shown in FIG. 32, one amplification transistor 23, one selection transistor 24, and one reset transistor 25 are provided for these two transistor regions 20_1 and 20_2.

Specifically, as shown in FIG. 31, the first photodiode 21_1 and the second photodiode 21_2 are aligned in a diagonal direction with respect to the horizontal direction x and the vertical direction y. In addition, the first floating diffusion FD12 is placed between the first photodiode 21_1 and the second photodiode 21_2. In addition, the first transfer transistor 22_1 is placed between the first photodiode 21_1 and the first floating diffusion FD 12. Also, the second transfer transistor 22_2 is placed between the second photodiode 212 and the first floating fusion FD 12. In addition, the first transistor region 20_1 is placed on the upper side of the first and second photodiodes 21_1 and 21_2.

Similarly, as shown in FIG. 31, the third photodiode 21_3 and the fourth photodiode 21_3 are aligned in a diagonal direction in a manner as described above. In addition, the second floating diffusion FD34 is placed between the third photodiode 213 and the fourth photodiode 214. Furthermore, the third and fourth transfer transistors 22_3 and 22_4 are formed between the third and fourth photodiodes 21_3 and 21_4 and the second floating diffusion FD34, respectively. In addition, the second transistor 20_2 is placed on the upper side of the third and fourth photodiodes 21_3 and 21_4.

The amplification transistor 23, the selection transistor 24, and the reset transistor 25 are electrically connected to any of other components, respectively, as shown in FIG. 32. The configuration of such a circuit is described in Japanese Published Patent Application No. 2006-54276.

In this case, any of planer shapes for each filter layer will be applied in a manner similar to one described in the above first embodiment or the like and exert advantageous effects of any embodiment of the present invention. In the above embodiment, the pixel transistors or the like are shared by four photodiodes, but not limited thereto. Alternatively, according to any embodiment of the present invention, the pixel transistors or the like may be shared by two or three photodiodes or shared by more than four photodiodes. In other words, any pixel arrangement is applicable to any embodiment of the present invention.

Furthermore, the solid-state image pickup devices 1, 1b, 1c, 1d, 1e, and 1f have been described as embodiments of the present invention. In addition, the photodiode 21 has been described as a photoelectric conversion part of any embodiment of the present invention. In addition, the transfer transistor 22, the amplification transistor 23, the selection transistor 24, and the reset transistor 25 have been also described as those which are equivalent to semiconductor elements of any embodiment of the present invention. The camera 40 has been described as an electronic apparatus of any embodiment of the present invention. The substrate 101 has been described as one equivalent to a substrate of any embodiment of the present invention. The wiring line 110h has been described as one equivalent to a wiring line of any embodiment of the present invention. The color filter 130 has been described as one equivalent to a color filter of any embodiment of the present invention. The blue filter layer 130B, 130Bb, and 130Bf have been described as those which are equivalent to a second color filter or a third color filter of any embodiment of the present invention. The green filter layer 130G, 130Gb, 130Gc, 130Gd, 130Ge, and 130Gf have been described as those which are equivalent to a first color filter of any embodiment of the present invention. The red filter layer 130R, 130Rb, and 130Rf have been described as those which are equivalent to a second color filter or a third color filter of any embodiment of the present invention. The color filters 130, 130b, 130c, 130d, 130e, and 130f have been described as those which are equivalent to a color filter of any embodiment of the present invention. The light reception surface JS has been described as one equivalent to a light reception surface of any embodiment of the present invention. The image-pickup surface PS has been described as one equivalent to an image-pickup surface of any embodiment of the present invention. The horizontal direction x has been described as one corresponding to a first direction of any embodiment of the present invention. The vertical direction y has been described as one corresponding to a second direction of any embodiment of the present invention.

The present application contains subject matter related to that disclosed in Japanese Priority Patent Application JP 2009-132743 filed in the Japan Patent Office on Jun. 2, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state image pickup device, comprising:
photoelectric conversion parts on an image pickup surface of a substrate, where each photoelectric conversion part is configured to generate a signal charge by receiving incident light on a light reception surface thereof; and color filters on an image-pickup surface of the substrate, where each color filter allows said incident light to be colored by passing through, wherein, said photoelectric conversion parts include a plurality of photoelectric conversion parts being arranged in a first direction on said image pickup surface and a plurality of photoelectric conversion parts being arranged in second direction opposite to said first direction on the image pickup surface, a distance between said light reception surfaces of said plurality of photoelectric conversion parts in said second direction is higher than that of said plurality of photoelectric conversion parts in said first direction, said color filter includes at least a first color filter, a second color filter, and a third color filter, said first color filter is located above said light reception surface, and said optical transmittance thereof is high at a first wavelength range, said second color layer is located above said light reception surface and next to said first color filter in said first direction, and said optical transmittance thereof is high at a second wavelength range which is different from that of said first wavelength range, and said third color filter is located above said light reception surface and next to said first color filter in said second direction, and optical transmittance of said third color filter is high at a third wavelength range which is different from that of each of said first and second wavelength ranges, where a surface on which said first color filter and said second color filter are laminated in said first direction is larger than a surface on which said first color filter and said third color filter are laminated in said second direction.

2. The solid-state image pickup device according to claim 1, wherein said first color filter and said second color filter partially overlap each other between the light reception surfaces aligned in said first direction.

3. The solid-state image pickup device according to claim 2, wherein:

said first direction and said second direction are perpendicular to each other on said image-pickup surface, and said light reception surface of said photoelectric conversion part is smaller than the surface of the first to the third color filters formed as said color filter located above the light reception surface.

4. The solid-state image pickup device according to claim 3, wherein the surface on which said first color filter and said second color filter are overlapped increases with the distance from the center of said image-pickup surface with respect of the position where each of said first color filter and said second color filter is arranged on said image pickup surface.

5. The solid-state image pickup device according to claim 3, wherein said light reception surface in said photoelectric conversion part is a quadrilateral shape, and the surface of each of said first to third color filter in said color filter facing to said light reception surface is a quadrilateral shape.

6. The solid-state image pickup device according to claim 5, wherein said color filter includes a portion where said first color filter and said second color filter are partially overlapped in said first direction, and a portion where said first color filter and said third color filter are not overlapped but the side of said first color filter and the side of said third color filter are contact with each other in said first direction.

7. The solid-state image pickup device according to claim 6, wherein a plurality of the first color filters is arranged in a checkered pattern in a diagonal direction inclined with respect said first direction and said second direction on the image pickup surface, and said plurality of first color filters is adjacent to said second or third color filters in said first direction and in said second direction.

8. The solid-state image pickup device according to claim 7, wherein each of said second color filter and said third color filter has a surface facing said light reception surface and has a rectangular shape, a width of the rectangular shape in said first direction is larger than a width of the rectangular shape in said second direction, and a portion said second color filter or said third color filter overlaps a part of said first color filter in said first direction.

9. The solid-state image pickup device according to claim 7, wherein said first color filter has a surface facing to said light reception surface and has a rectangular shape, a width of the rectangular shape in said first direction larger than a width of the rectangular shape in said second direction, and a portion of said first color filter overlaps part of said second color filter or said third color filter in said first direction.

10. The solid-state image pickup device according to claim 7, wherein each of said first color filter, said second color filter, and said third color filter has a surface facing to said light reception surface and has in a rectangular shape, and a width in said first direction of the rectangular shape larger than a width in said second direction of the rectangular shape, and part of said first color filter overlaps part of said second color filter or said third color filter.

11. The solid-state image pickup device according to claim 7, wherein each of said first color filter, said second color filter, and said third color filter has a surface facing to said light reception surface and has a quadrilateral shape, where at least a corner of each of said first color filters partially overlaps at least one of said second color filter and said third color filter in said diagonal direction to form a connection therebetween.

12. The solid-state image pickup device according to any one of claims 8 to 11, wherein a surface on which said first color filter and said second color filter are laminated or a surface on which said first color filter and said third color filter are laminated is formed so that it increases with the distance from the center of said image-pickup surface with respect of the position where said surface is arranged on said image pickup surface.

13. The solid-state image pickup device according to claim 1, further comprising:

a semiconductor device configured to read out a signal charge generated from said photoelectric conversion part; and
a wiring line electrically connected to said semiconductor element,
wherein,
a plurality of said semiconductor elements is arranged on said image-pickup surface of said substrate so as to correspond to the plurality of said photoelectric conversion part, and
said wiring line is arranged between the plurality of said light reception surfaces on said image-pickup surface.

14. A solid-state image pickup device, comprising:
photoelectric conversion parts on an image pickup surface of a substrate, where each photoelectric conversion part generates a signal charge by receiving incident light on a light reception surface thereof;
color filters are located above the respective light reception surfaces on the image-pickup surface of the substrate, where each color filter allows the incident light to be colored by passing through,
wherein,
said photoelectric conversion parts include a plurality of photoelectric conversion parts being arranged in a first direction on said image pickup surface and a plurality of photoelectric conversion parts being arranged in second direction opposite to said first direction on the image pickup surface, where said first direction is perpendicular to said second direction, and
said color filter includes at least a first color filter, a second color filter, and a third color filter, where
said first color filter is located above said light reception surface, and said optical transmittance thereof is high at a first wavelength range,
the second color layer is located above the light reception surface and next to the first color filter in the first direction, and the optical transmittance thereof is high at a second wavelength range which is different from that of the first wavelength range, and
said third color filter is located above said light reception surface and next to said first color filter in said second direction, and optical transmittance of said third color filter is high at a third wavelength range which is different from that of each of said first and second wavelength ranges, where
each of said first color filter, said second color filter, and said third color filter has a surface facing to said light reception surface and formed in a quadrilateral shape,
a plurality of the first color filters is arranged in a checkered pattern in a diagonal direction inclined with respect said first direction and said second direction on the image pickup surface,
said plurality of first color filters aligned in said diagonal direction is placed adjacent to said second or third color filters in said first direction and in said second direction,
at the corners of the plurality of the first color filters, the plurality of said first color filters include at least portions which can be overlapped and connected to at least one of said second color filter and said third color filter, and
a surface on which said first color filter and said second color filter are laminated in said first direction is larger than a surface on which said first color filter and said third color filter are laminated in said second direction.

15. An electronic apparatus, comprising:
photoelectric conversion parts arranged on an image pickup surface of a substrate, where each photoelectric conversion part is configured to generate a signal charge by receiving incident light on a light reception surface thereof; and
color filters on an image-pickup surface of the substrate, where each color filter allows said incident light to be colored by passing through,
wherein,
said photoelectric conversion parts include a plurality of photoelectric conversion parts being arranged in a first direction on said image pickup surface and a plurality of photoelectric conversion parts being arranged in a second direction opposite to said first direction on the image pickup surface,
a distance between said light reception surfaces of said plurality of photoelectric conversion parts in said second direction is higher than that of said plurality of photoelectric conversion parts in said first direction,
said color filter includes at least a first color filter, a second color filter, and a third color filter, where
said first color filter is located above said light reception surface, and said optical transmittance thereof is high at a first wavelength range,
the second color layer is located above the light reception surface and next to the first color filter in the first direction, and the optical transmittance thereof is high at a second wavelength range which is different from that of the first wavelength range, and
said third color filter is located above said light reception surface and next to said first color filter in said second direction, and optical transmittance of said third color filter is high at a third wavelength range which is different from that of each of said first and second wavelength ranges, and
a surface on which said first color filter and said second color filter are laminated in said first direction is larger than a surface on which said first color filter and said third color filter are laminated in said second direction.

16. A method of manufacturing a solid-state imaging device, comprising the steps of:
forming a photoelectric conversion part, which is configured to generate a signal charge by receiving incident light on a light reception surface, on an image-pickup surface of said substrate; and
forming a color filter, which colors said incident light and passes said colored light to said light reception surface, on said image-pickup surface of said substrate,
wherein,
in the step of forming said photoelectric conversion part, said photoelectric conversion part is formed such that a plurality of photoelectric conversion parts is arranged in a first direction on said image pickup surface and a plurality of photoelectric conversion parts is arranged in second direction opposite to said first direction on said image pickup surface,
a distance between said light reception surfaces of the plurality of said photoelectric conversion parts in said second direction is higher than that of the plurality of said photoelectric conversion parts in said first direction, and
said step of forming said color filter further includes at least the steps of (a) forming a first color filter having a high optical transmittance at a first wavelength range above said light reception surface, (b) forming a second color filter having a high optical transmittance at a second wavelength range which is different from said first wavelength range above said light reception surface so that said first color filter is arranged adjacent to said first color filter in said first direction, and (c) forming a third color filter having a high optical transmittance at a third wavelength range which is different from said first and second wavelength ranges so that said third color filter is arranged adjacent to said first color filter in said second direction, where said first, second, and third color filters are formed so that a surface on which said first color filter and said second color filter are laminated is larger than a surface on which said first color filter and said third color filter are laminated.

* * * * *